US008518812B2

(12) United States Patent
Mariani et al.

(10) Patent No.: US 8,518,812 B2
(45) Date of Patent: Aug. 27, 2013

(54) METHODS OF FORMING ELECTRICAL CONTACTS

(75) Inventors: Marcello Mariani, Milan (IT); Micaela Gabriella Tomasini, Milan (IT)

(73) Assignee: Micron Technology, Inc., Boise, ID (US)

(*) Notice: Subject to any disclaimer, the term of this patent is extended or adjusted under 35 U.S.C. 154(b) by 280 days.

(21) Appl. No.: 13/113,281

(22) Filed: May 23, 2011

(65) Prior Publication Data
US 2012/0302052 A1    Nov. 29, 2012

(51) Int. Cl.
*H01L 21/44* (2006.01)

(52) U.S. Cl.
USPC ..... 438/587; 438/270; 438/381; 257/E21.655

(58) Field of Classification Search
USPC .................. 438/129, 156, 206, 209, 212, 242, 438/268, 270, 381, 587, 597, 599; 257/E21.655
See application file for complete search history.

(56) References Cited

U.S. PATENT DOCUMENTS

| | | | |
|---|---|---|---|
| 5,930,640 A | 7/1999 | Kenney | |
| 6,576,944 B2 | 6/2003 | Weis | |
| 6,914,286 B2 | 7/2005 | Park | |
| 6,958,513 B2 | 10/2005 | Wang | |
| 7,015,092 B2 | 3/2006 | Jaiprakash et al. | |
| 7,816,728 B2 | 10/2010 | Ho et al. | |
| 2010/0197141 A1 | 8/2010 | Tu et al. | |
| 2012/0205736 A1* | 8/2012 | Housley | 257/329 |

OTHER PUBLICATIONS

U.S. Appl. No. 13/029,042, filed Feb. 16, 2011, Housley.

* cited by examiner

*Primary Examiner* — Thanhha Pham
(74) *Attorney, Agent, or Firm* — Wells St. John P.S.

(57) ABSTRACT

Some embodiments include methods of forming contacts. A row of projections may be formed over a semiconductor substrate. The projections may include a plurality of repeating components of an array, and a terminal projection. The terminal projection may have a sacrificial material spaced from semiconductor material of the substrate by a dielectric structure. An electrically conductive line may be formed along the row. The line may wrap around an end of the terminal projection and bifurcate into two branches that are along opposing sides of the repeating components. The individual branches may have regions spaced from the sacrificial material by segments of gate dielectric. The sacrificial material may be removed, together with the segments of gate dielectric, to form a contact opening. An electrically conductive contact may be formed within the contact opening and directly against the regions of the branches.

28 Claims, 53 Drawing Sheets

METHODS OF FORMING ELECTRICAL CONTACTS

TECHNICAL FIELD

Methods of forming electrical contacts.

BACKGROUND

Memory is one type of integrated circuitry, and is used in computer systems for storing data. Integrated memory is usually fabricated in one or more arrays of individual memory cells.

The arrays may comprise gated devices which are utilized as the memory cells, and/or may comprise gated devices which are utilized as select devices for accessing individual memory cells. Example gated devices are transistors and thyristors.

A memory array may comprise rows of gated devices, and may comprise gatelines along each of the rows. The individual gatelines may extend the entire lengths of the individual rows, and comprise electrical gates for gating the gated devices. The gatelines are connected to other circuitry external of the memory array, and such other circuitry may be utilized to control current flow through the gatelines during operation of the memory array.

Difficulties may be encountered in forming electrical contacts to the gatelines for interconnecting the gatelines to the circuitry external of the memory array. It would be desirable to develop new methods for forming electrical contacts to gatelines.

BRIEF DESCRIPTION OF THE DRAWINGS

FIG. 1 is a view from above the construction, FIG. 2 is a cross-sectional view along a horizontal cross-section of the construction, and FIGS. 3 and 4 are cross-sectional views along vertical cross-sections of the construction. The cross-section of FIG. 2 is along the lines 2-2 of FIGS. 1, 3 and 4; the cross-section of FIG. 3 is along the lines 3-3 of FIGS. 1 and 2; and the cross-section of FIG. 4 is along the lines 4-4 of FIGS. 1 and 2.

FIG. 5 is a view from above analogous to FIG. 1, FIG. 6 is along the same horizontal cross-section as FIG. 2, FIG. 7 is along the same vertical cross-section as FIG. 3, and FIG. 8 is along the same vertical cross-section as FIG. 4. FIG. 6 is along the lines 6-6 of FIGS. 5, 7 and 8; FIG. 7 is along the lines 7-7 of FIGS. 5 and 6; and FIG. 8 is along the lines 8-8 of FIGS. 5 and 6.

FIG. 9 is a view from above analogous to FIG. 1, FIG. 10 is along the same horizontal cross-section as FIG. 2, FIG. 11 is along the same vertical cross-section as FIG. 3, and FIG. 12 is along the same vertical cross-section as FIG. 4. FIG. 10 is along the lines 10-10 of FIGS. 9, 11 and 12; FIG. 11 is along the lines 11-11 of FIGS. 9 and 10; and FIG. 12 is along the lines 12-12 of FIGS. 9 and 10.

FIG. 13 is a view from above analogous to FIG. 1, FIG. 14 is along the same horizontal cross-section as FIG. 2, FIG. 15 is along the same vertical cross-section as FIG. 3, and FIG. 16 is along the same vertical cross-section as FIG. 4. FIG. 14 is along the lines 14-14 of FIGS. 13, 15 and 16; FIG. 15 is along the lines 15-15 of FIGS. 13 and 14; and FIG. 16 is along the lines 16-16 of FIGS. 13 and 14.

FIG. 17 is a view from above analogous to FIG. 1, FIG. 18 is along the same horizontal cross-section as FIG. 2, FIG. 19 is along the same vertical cross-section as FIG. 3, and FIG. 20 is along the same vertical cross-section as FIG. 4. FIG. 18 is along the lines 18-18 of FIGS. 17, 19 and 20; FIG. 19 is along the lines 19-19 of FIGS. 17 and 18; and FIG. 20 is along the lines 20-20 of FIGS. 17 and 18.

FIG. 21 is a view from above analogous to FIG. 1, FIG. 22 is along the same horizontal cross-section as FIG. 2, FIG. 23 is along the same vertical cross-section as FIG. 3, and FIG. 24 is along the same vertical cross-section as FIG. 4. FIG. 22 is along the lines 22-22 of FIGS. 21, 23 and 24; FIG. 23 is along the lines 23-23 of FIGS. 21 and 22; and FIG. 24 is along the lines 24-24 of FIGS. 21 and 22.

FIG. 25 is a view from above analogous to FIG. 1, FIG. 26 is along the same horizontal cross-section as FIG. 2, FIG. 27 is along the same vertical cross-section as FIG. 3, and FIG. 28 is along the same vertical cross-section as FIG. 4. FIG. 26 is along the lines 26-26 of FIGS. 25, 27 and 28; FIG. 27 is along the lines 27-27 of FIGS. 25 and 26; and FIG. 28 is along the lines 28-28 of FIGS. 25 and 26.

FIG. 29 is a view from above analogous to FIG. 1, FIG. 30 is along the same horizontal cross-section as FIG. 2, FIG. 31 is along the same vertical cross-section as FIG. 3, and FIG. 32 is along the same vertical cross-section as FIG. 4. FIG. 30 is along the lines 30-30 of FIGS. 29, 31 and 32; FIG. 31 is along the lines 31-31 of FIGS. 29 and 30; and FIG. 32 is along the lines 32-32 of FIGS. 29 and 30.

FIG. 33 is a view from above analogous to FIG. 1, FIG. 34 is along the same horizontal cross-section as FIG. 2, FIG. 35 is along the same vertical cross-section as FIG. 3, FIG. 36 is along the same vertical cross-section as FIG. 4, and FIG. 37 is a cross-sectional view orthogonal to the views of FIGS. 34-36. FIG. 34 is along the lines 34-34 of FIGS. 33, 35, 36 and 37; FIG. 35 is along the lines 35-35 of FIGS. 33, 34 and 37; FIG. 36 is along the lines 36-36 of FIGS. 33, 34 and 37; and FIG. 37 is along the lines 37-37 of FIGS. 34-36.

FIG. 38 is a view from above analogous to FIG. 1, FIG. 39 is along the same horizontal cross-section as FIG. 2, FIG. 40 is along the same vertical cross-section as FIG. 3, and FIG. 41 is along the same vertical cross-section as FIG. 4. FIG. 39 is along the lines 39-39 of FIGS. 38, 40 and 41; FIG. 40 is along the lines 40-40 of FIGS. 38 and 39; and FIG. 41 is along the lines 41-41 of FIGS. 38 and 39.

FIG. 42 is a view from above analogous to FIG. 1, FIG. 43 is along the same horizontal cross-section as FIG. 2, FIG. 44 is along the same vertical cross-section as FIG. 3, and FIG. 45 is along the same vertical cross-section as FIG. 4. FIG. 43 is along the lines 43-43 of FIGS. 42, 44 and 45; FIG. 44 is along the lines 44-44 of FIGS. 42 and 43; and FIG. 45 is along the lines 45-45 of FIGS. 42 and 43.

FIG. 46 is a view from above analogous to FIG. 1, FIG. 47 is along the same horizontal cross-section as FIG. 2, FIG. 48 is along the same vertical cross-section as FIG. 3, and FIG. 49 is along the same vertical cross-section as FIG. 4. FIG. 47 is along the lines 47-47 of FIGS. 46, 48 and 49; FIG. 48 is along the lines 48-48 of FIGS. 46 and 47; and FIG. 49 is along the lines 49-49 of FIGS. 46 and 47.

FIG. 50 is a view from above analogous to FIG. 1, FIG. 51 is along the same horizontal cross-section as FIG. 2, FIG. 52 is along the same vertical cross-section as FIG. 3, and FIG. 53 is along the same vertical cross-section as FIG. 4. FIG. 51 is along the lines 51-51 of FIGS. 50, 52 and 53; FIG. 52 is along the lines 52-52 of FIGS. 50 and 51; and FIG. 53 is along the lines 53-53 of FIGS. 50 and 51.

DETAILED DESCRIPTION OF THE ILLUSTRATED EMBODIMENTS

Some embodiments include methods of forming electrical contacts to electrical components of a memory array. For instance, some embodiments include methods of forming electrical contacts to gatelines of a memory array.

Figure 53:
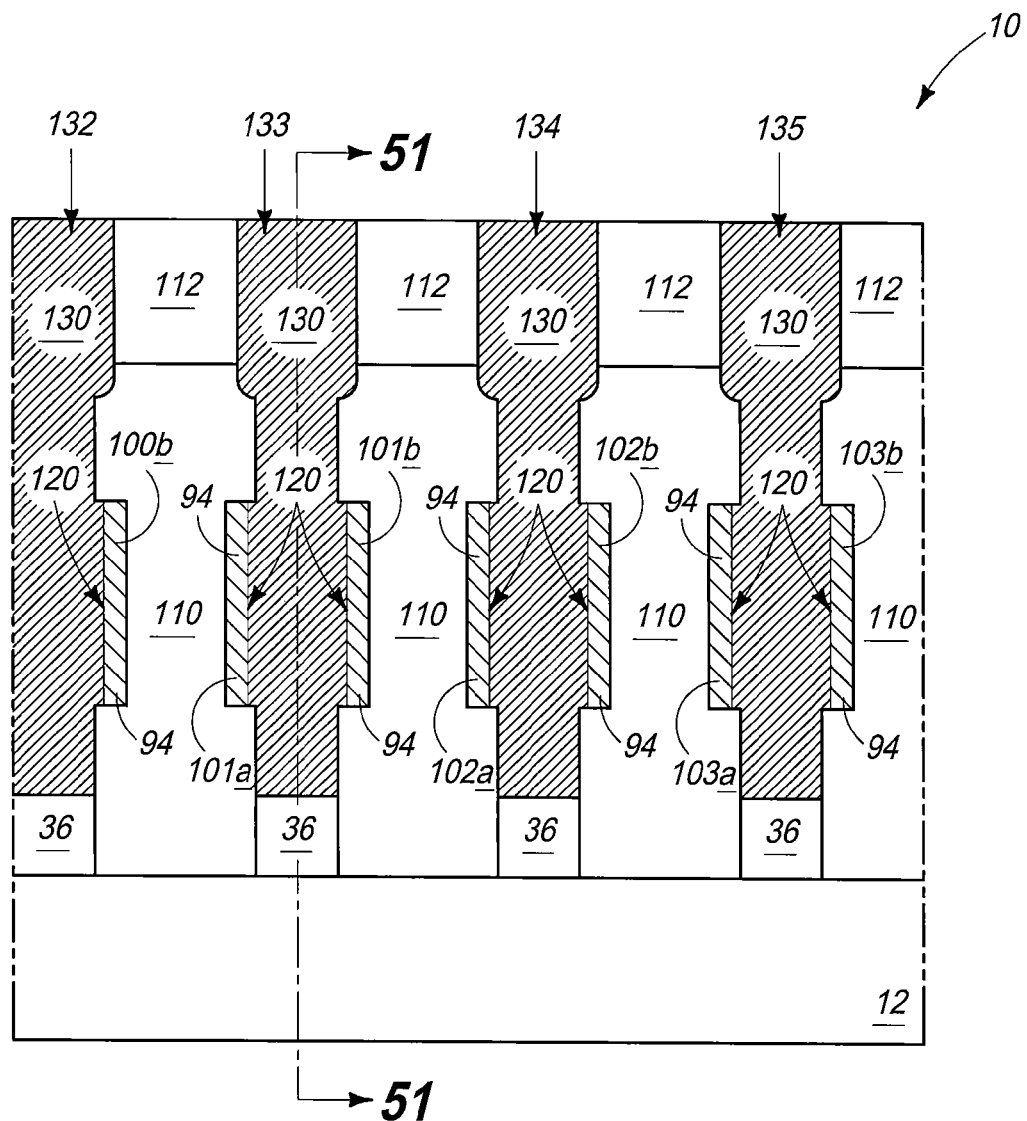

An example embodiment is described with reference to FIGS. 1-53.

Referring initially to FIGS. 1-4, a portion of a semiconductor construction 10 is illustrated. The construction includes semiconductor material 12, silicon dioxide 14, silicon nitride 16, and a patterned mask 20 over the silicon nitride.

The semiconductor material 12 may, for example, comprise, consist essentially of, or consist of monocrystalline silicon; and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. The semiconductor material 12 may be part of a semiconductor substrate containing one or more materials associated with integrated circuit fabrication. In such embodiments, such materials may correspond to one or more of refractory metal materials, barrier materials, diffusion materials, insulator materials, etc.

The silicon dioxide 14 may be referred to as a pad oxide, and may be provided to alleviate stress between the silicon nitride 16 and the underlying semiconductor material 12.

The patterned mask 20 comprises a masking material 22. Such masking material may comprise any suitable composition or combination of compositions. For instance, the masking material may correspond to photolithographically-patterned photoresist. As another example, the masking material may correspond to a material patterned utilizing pitch-multiplication methodologies so that the patterned mask has a pitch less than that which may be achieved with photolithographic processing alone.

Figure 1:
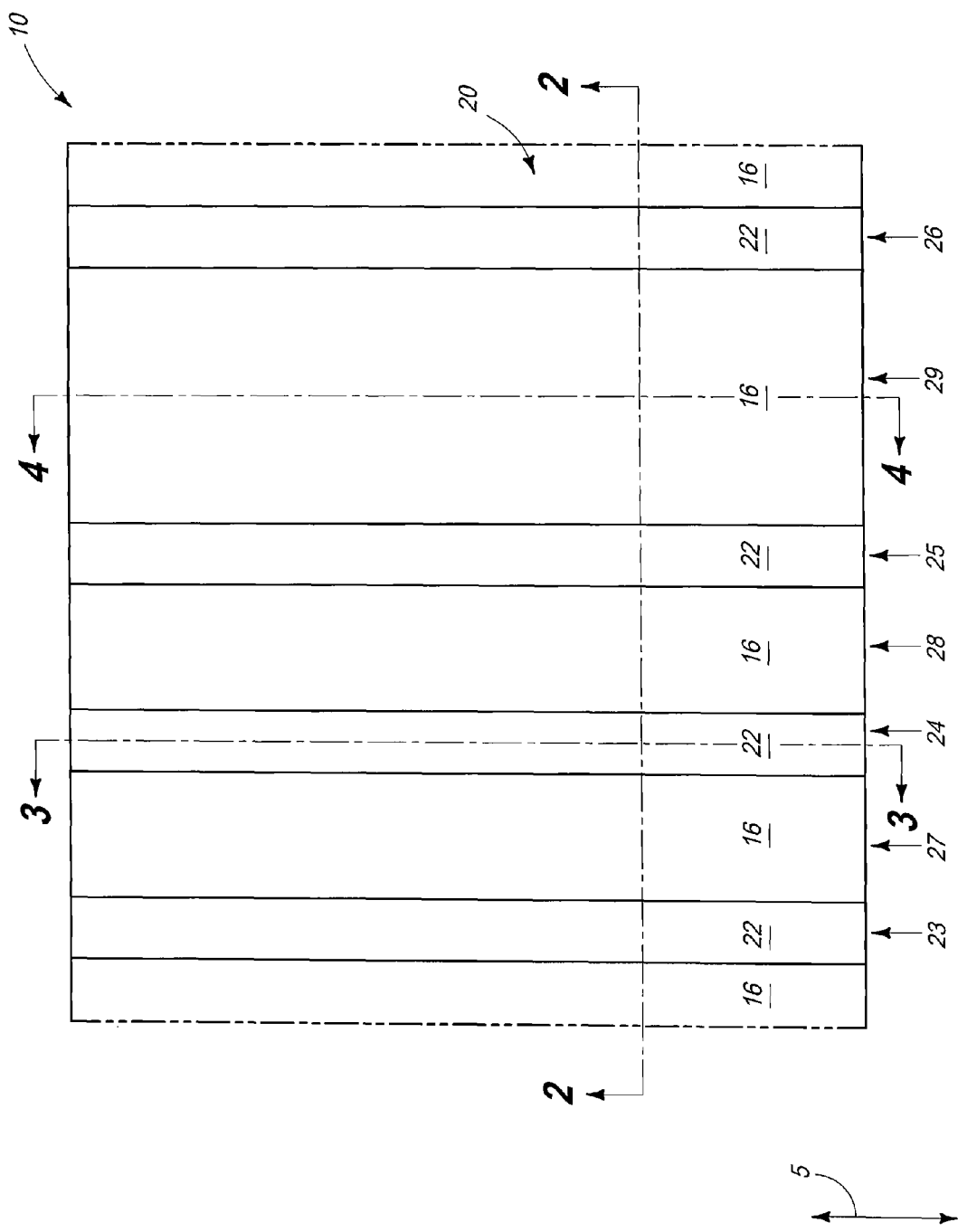
FIGS. 1-4 show multiple views of a portion of a semiconductor construction.

The patterned masking material 22 is formed into a plurality of masking features corresponding to lines 23-26, with such lines being elongated along a direction of an illustrated axis 5 (shown in FIG. 1). The lines are separated from one another by spaces 27-29. The illustrated portion of construction 10 is a terminal end of a patterned region of the construction. Specifically, the masking feature 26 is a terminal masking feature of a large number of repeating masking features, and the masking features 23-25 are representative of a large number of repeating masking features that would extend across the semiconductor construction, with additional masking features (not shown) being to the left of the portion of the construction shown in FIGS. 1 and 2.

Figure 2:
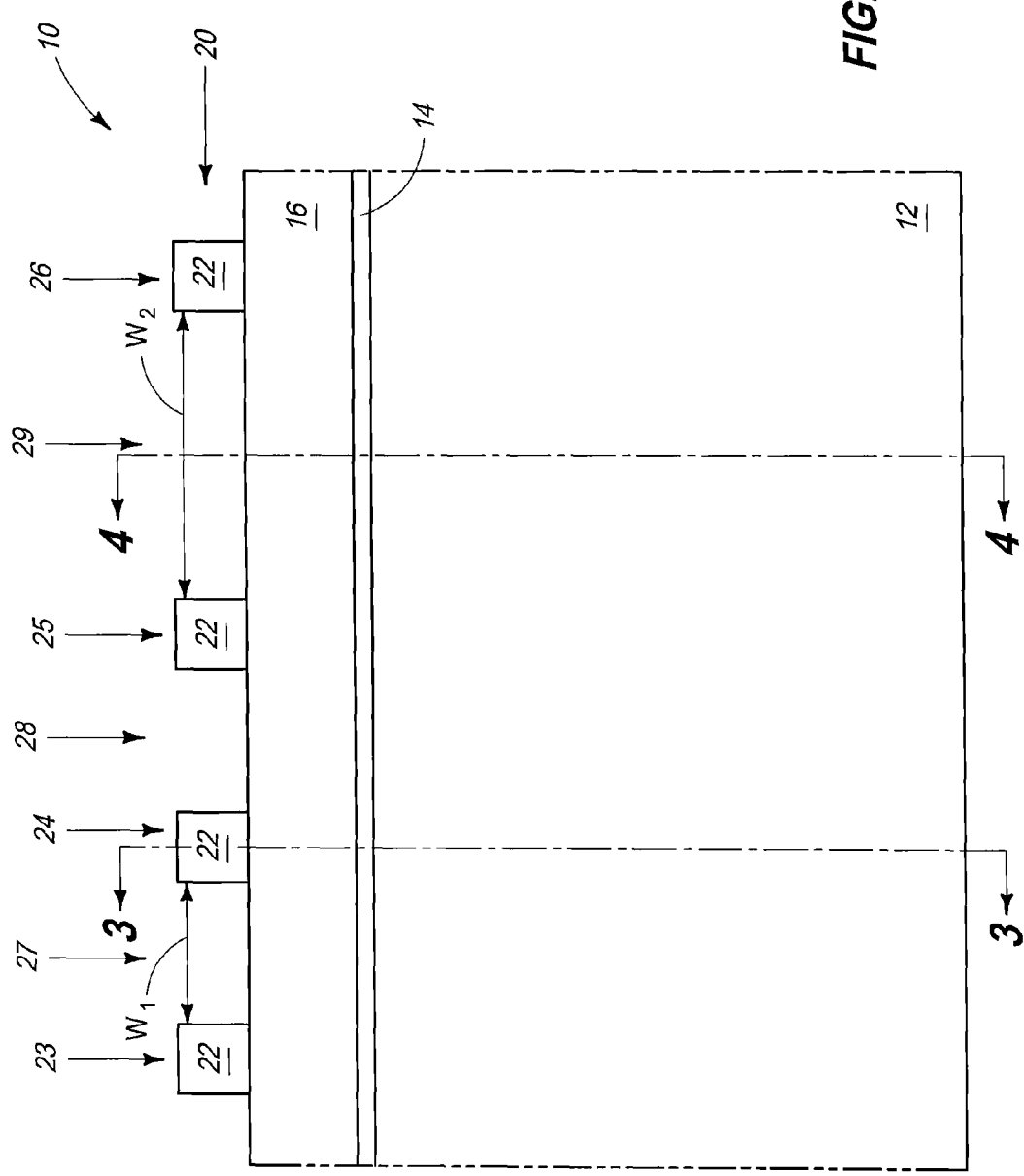
Figure 3:
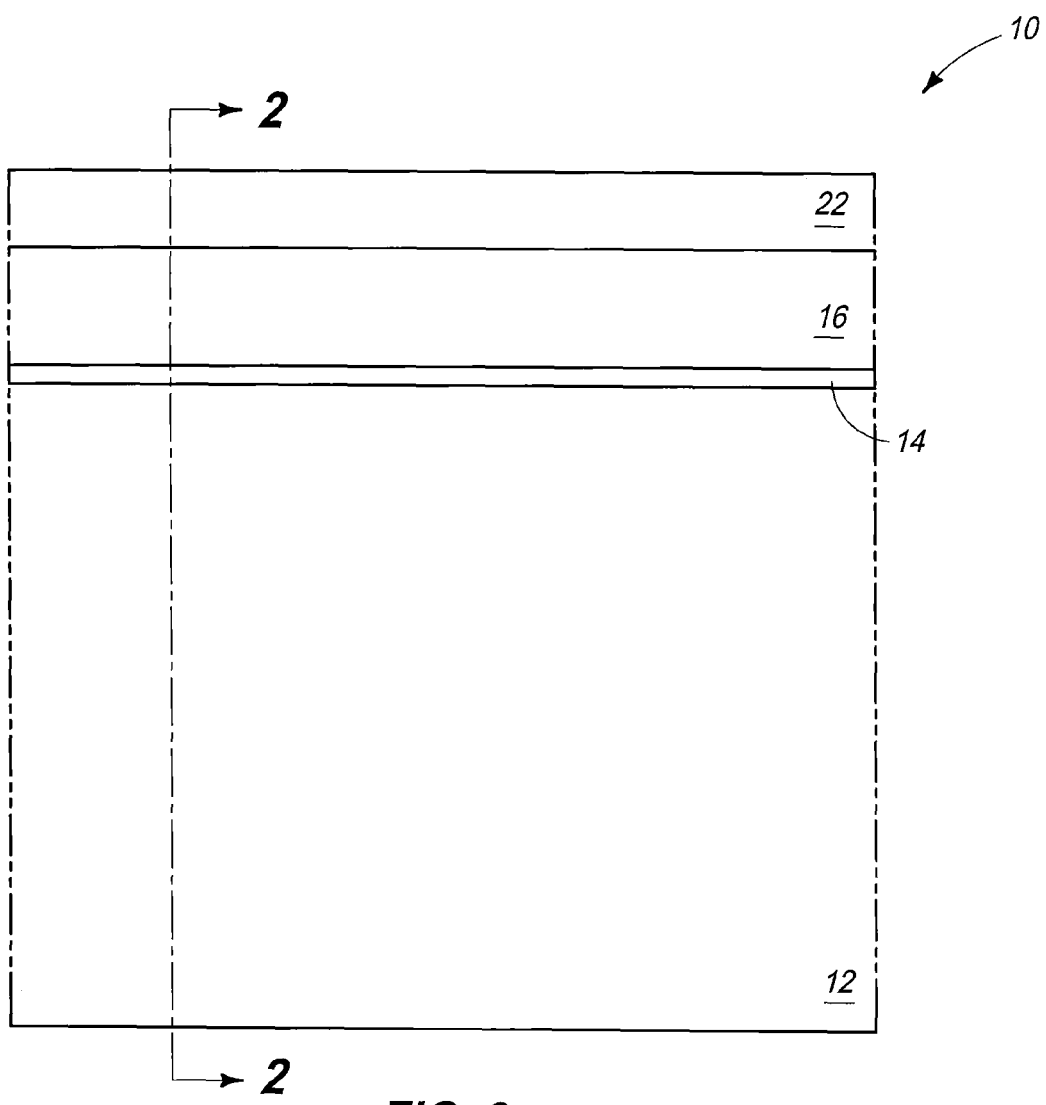
Figure 4:
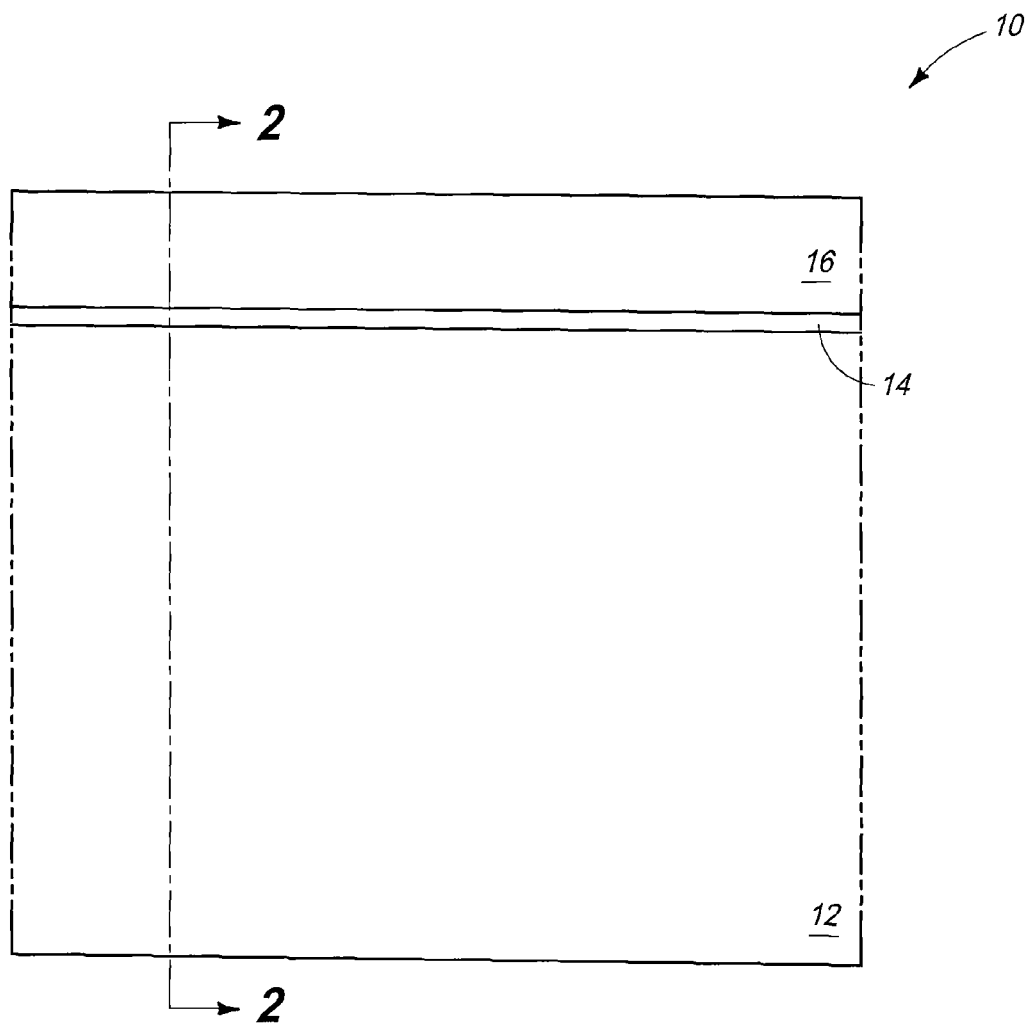
Figure 5:
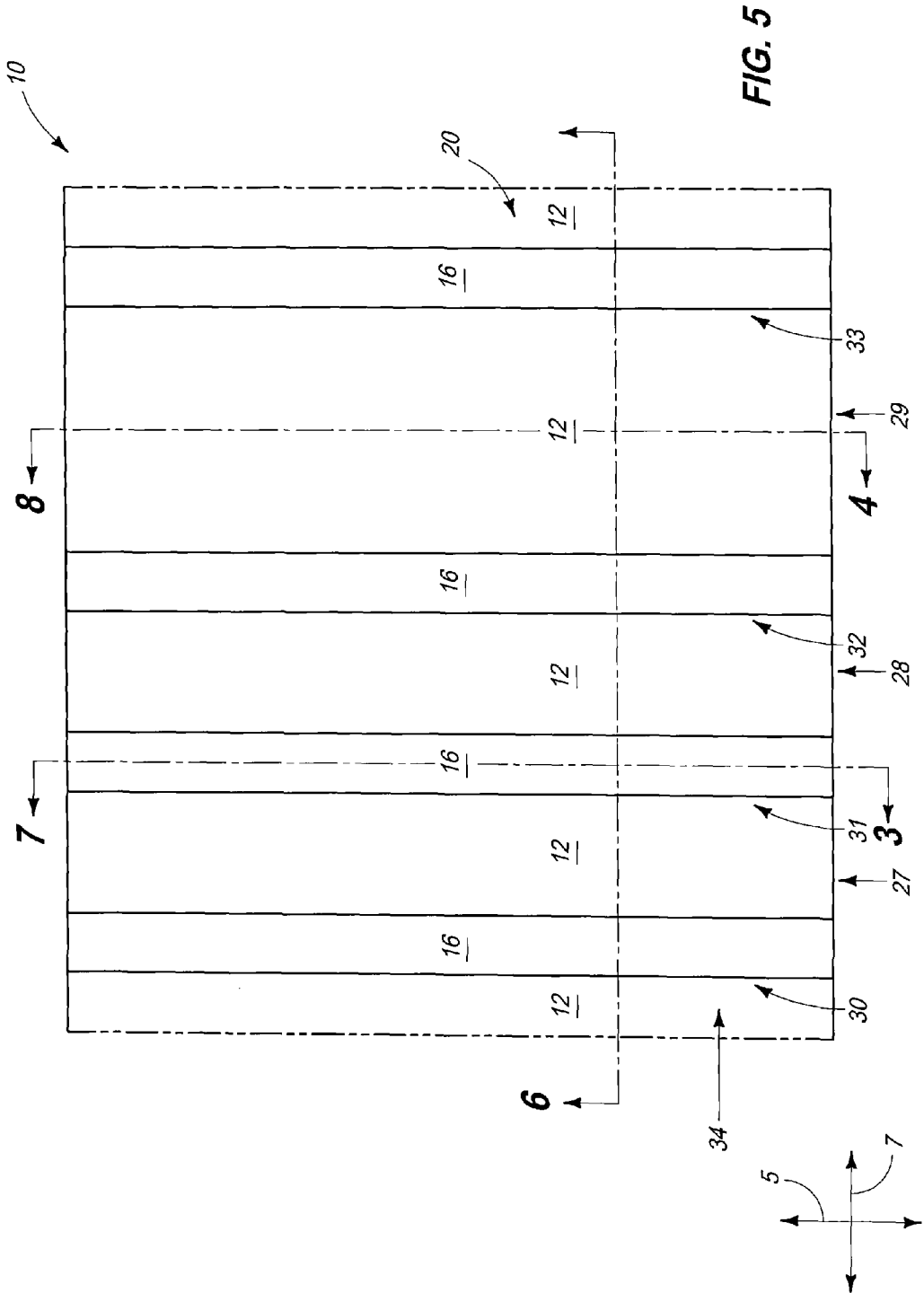
FIGS. 5-8 show the construction of FIGS. 1-4 at a processing stage subsequent to that of FIGS. 1-4.
Figure 6:
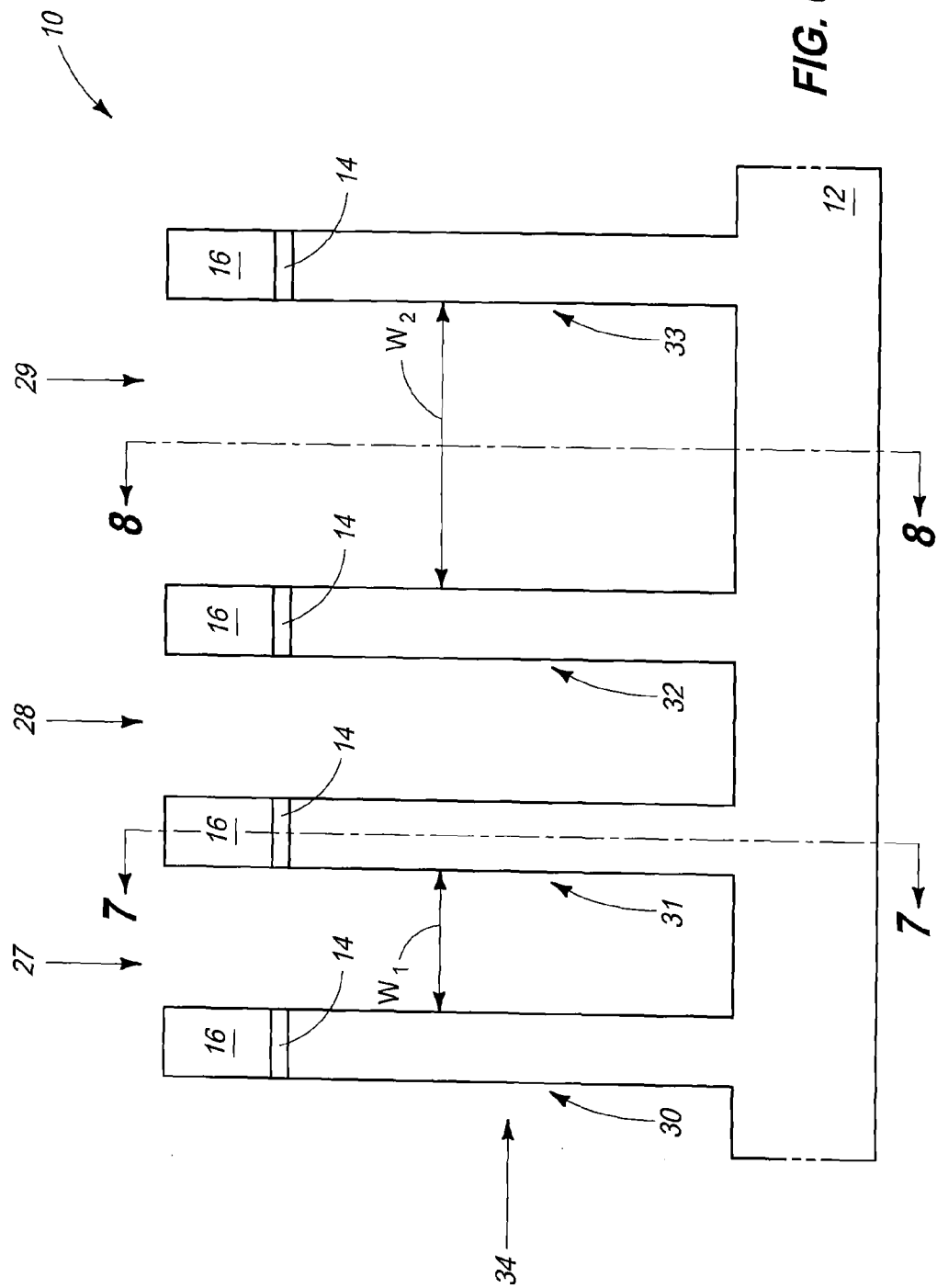
Figure 7:
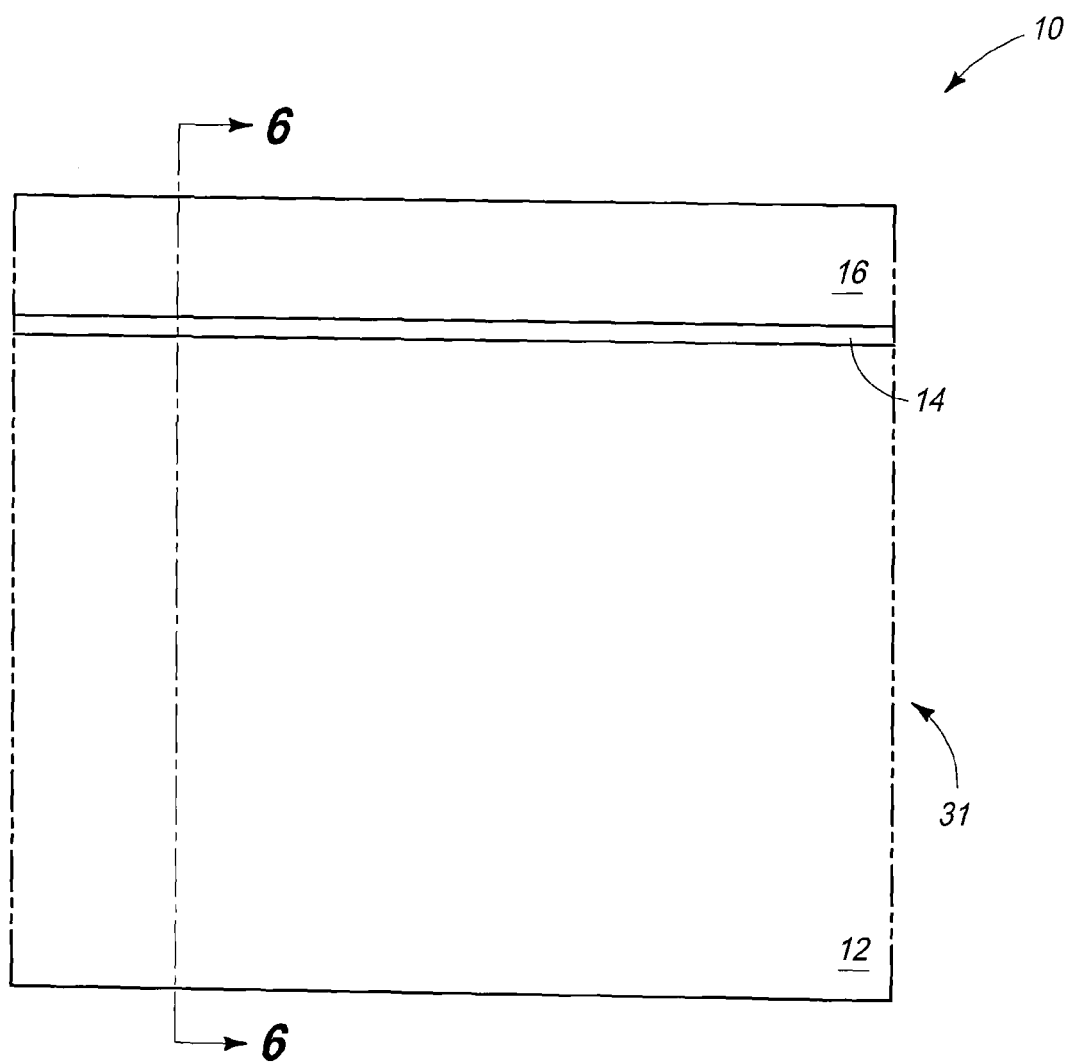
Figure 8:
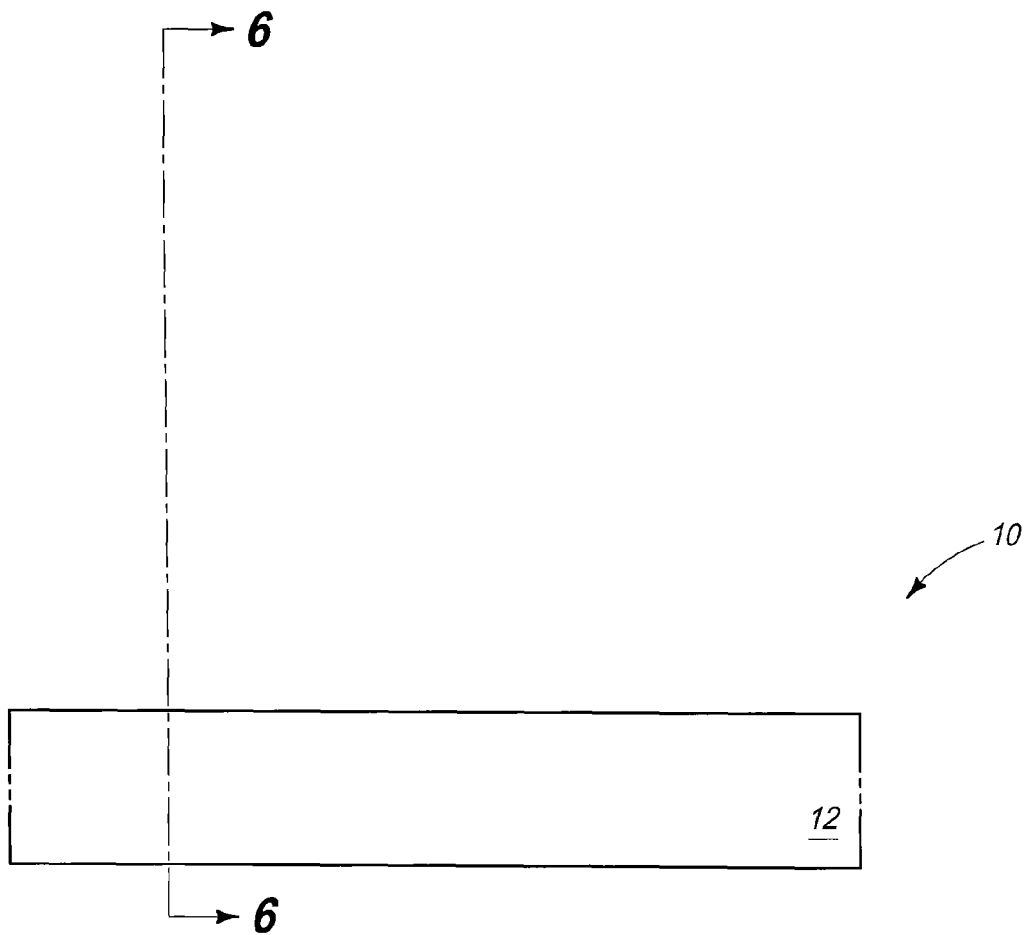
Figure 9:
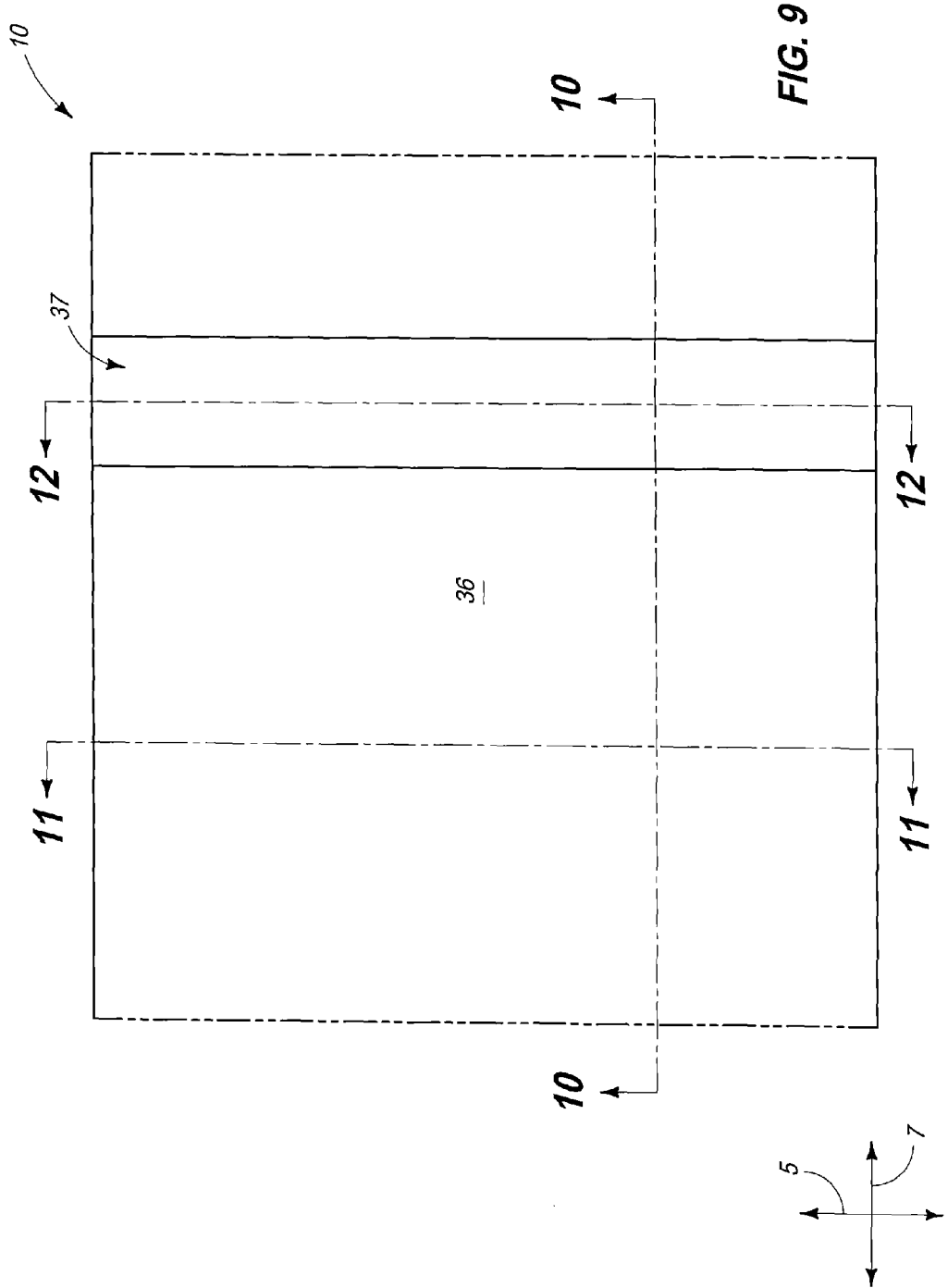
FIGS. 9-12 show the construction of FIGS. 1-4 at a processing stage subsequent to that of FIGS. 5-8.
Figure 10:
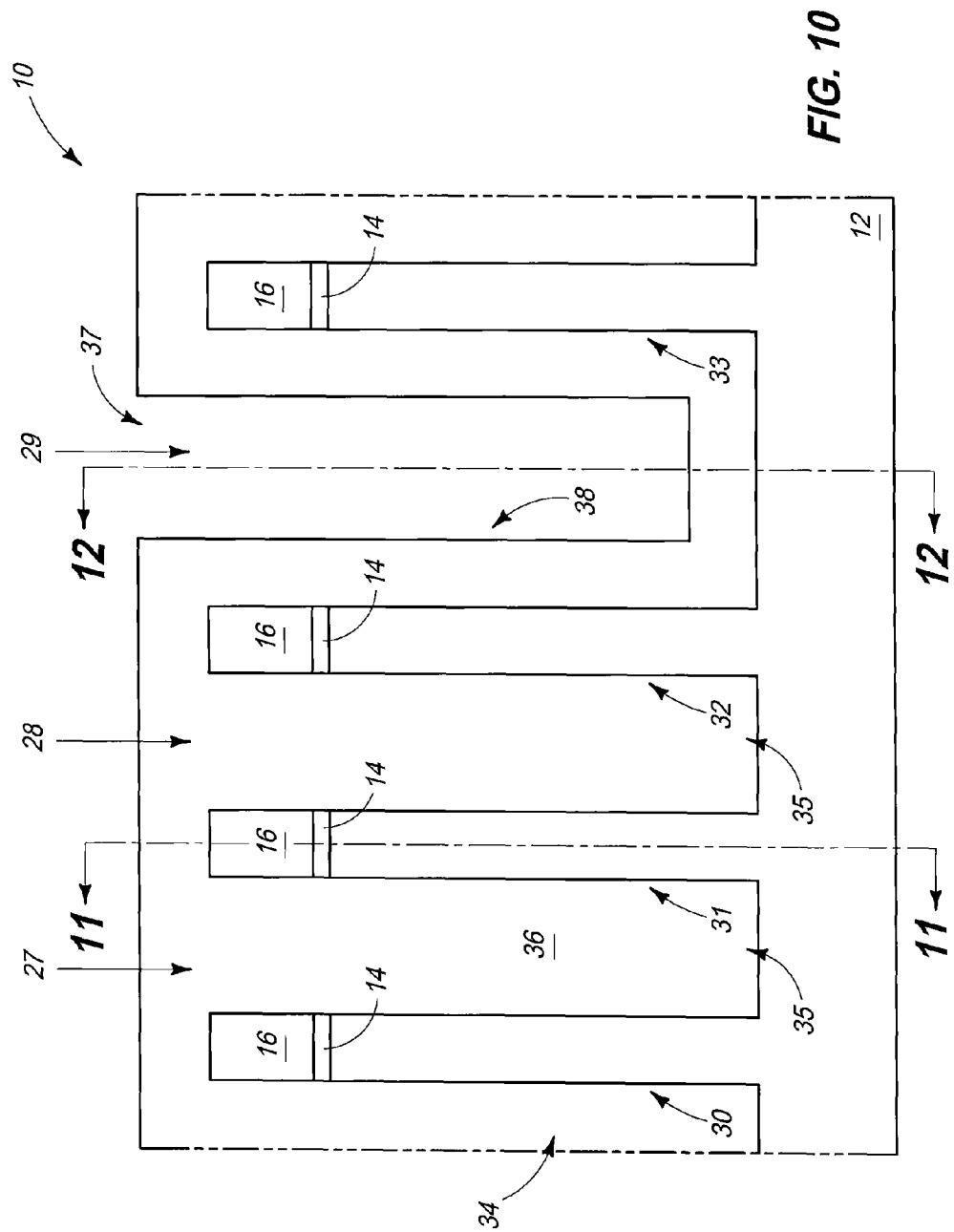
Figure 11:
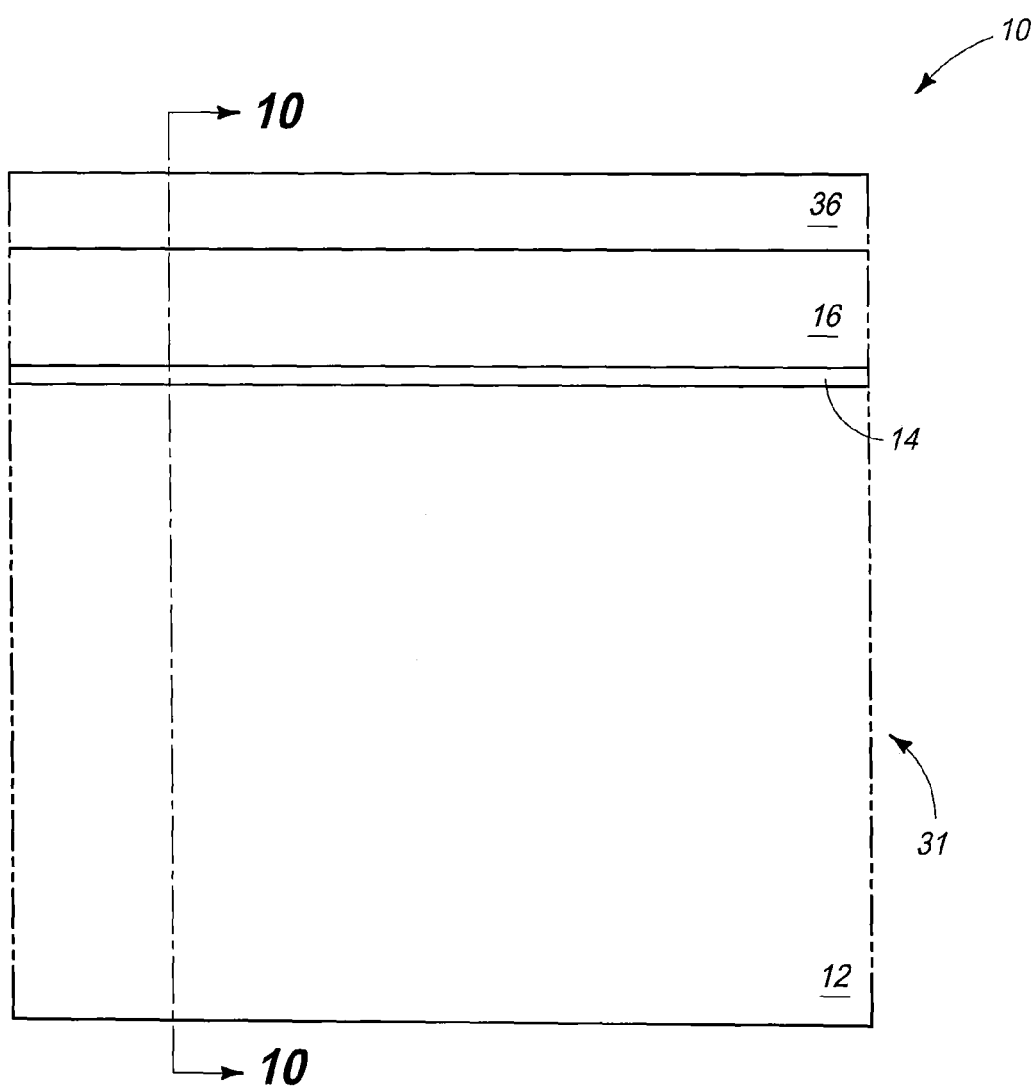
Figure 12:
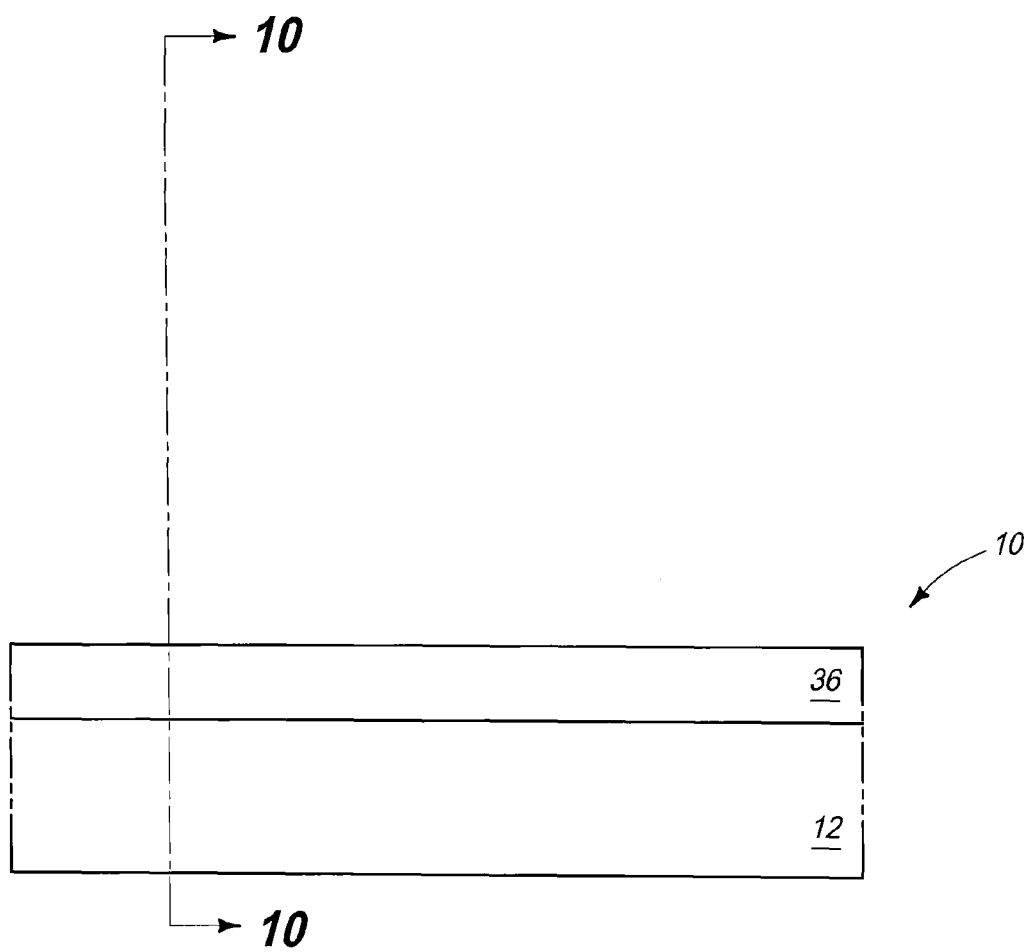
Figure 13:
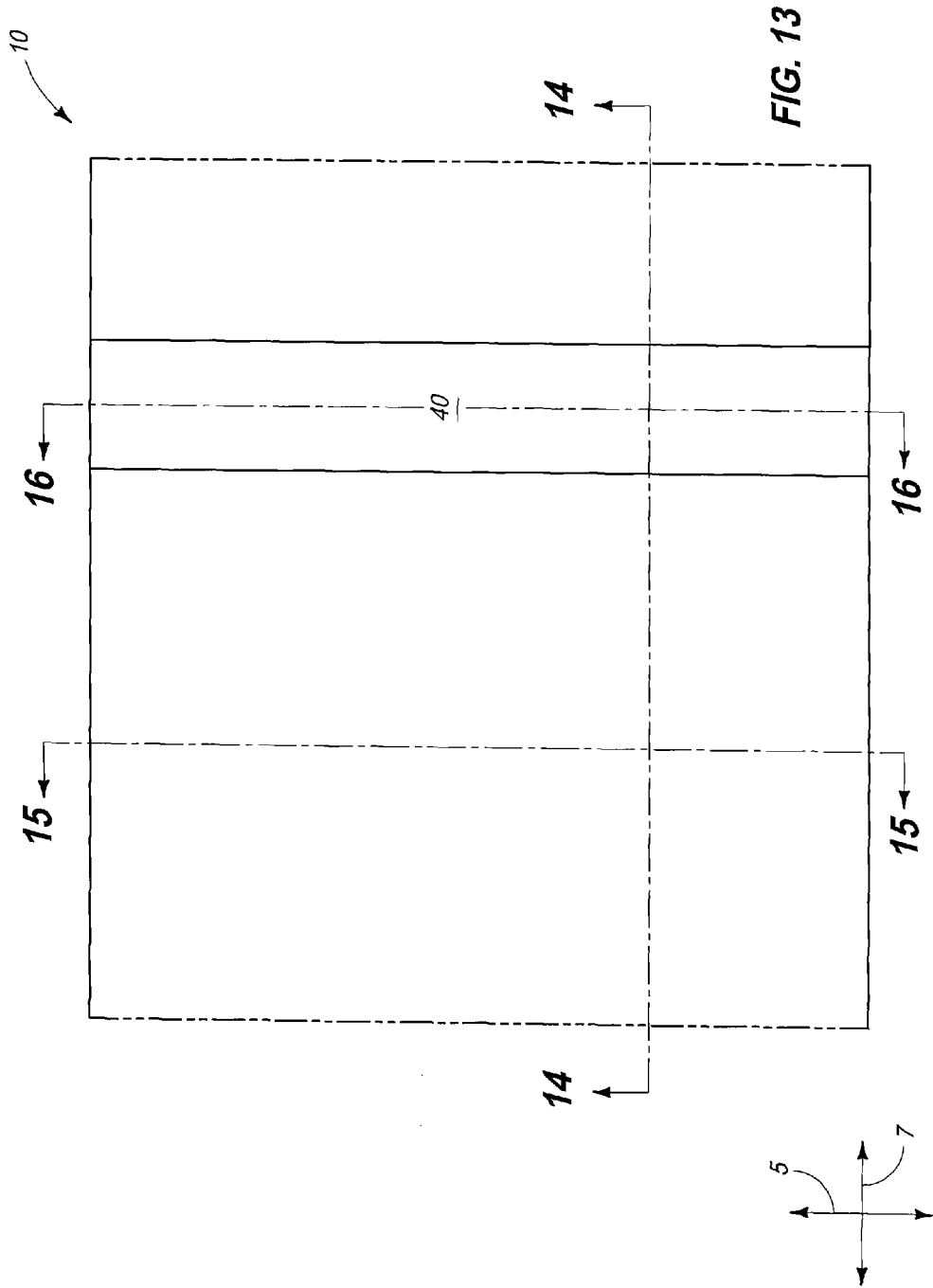
FIGS. 13-16 show the construction of FIGS. 1-4 at a processing stage subsequent to that of FIGS. 9-12.
Figure 14:
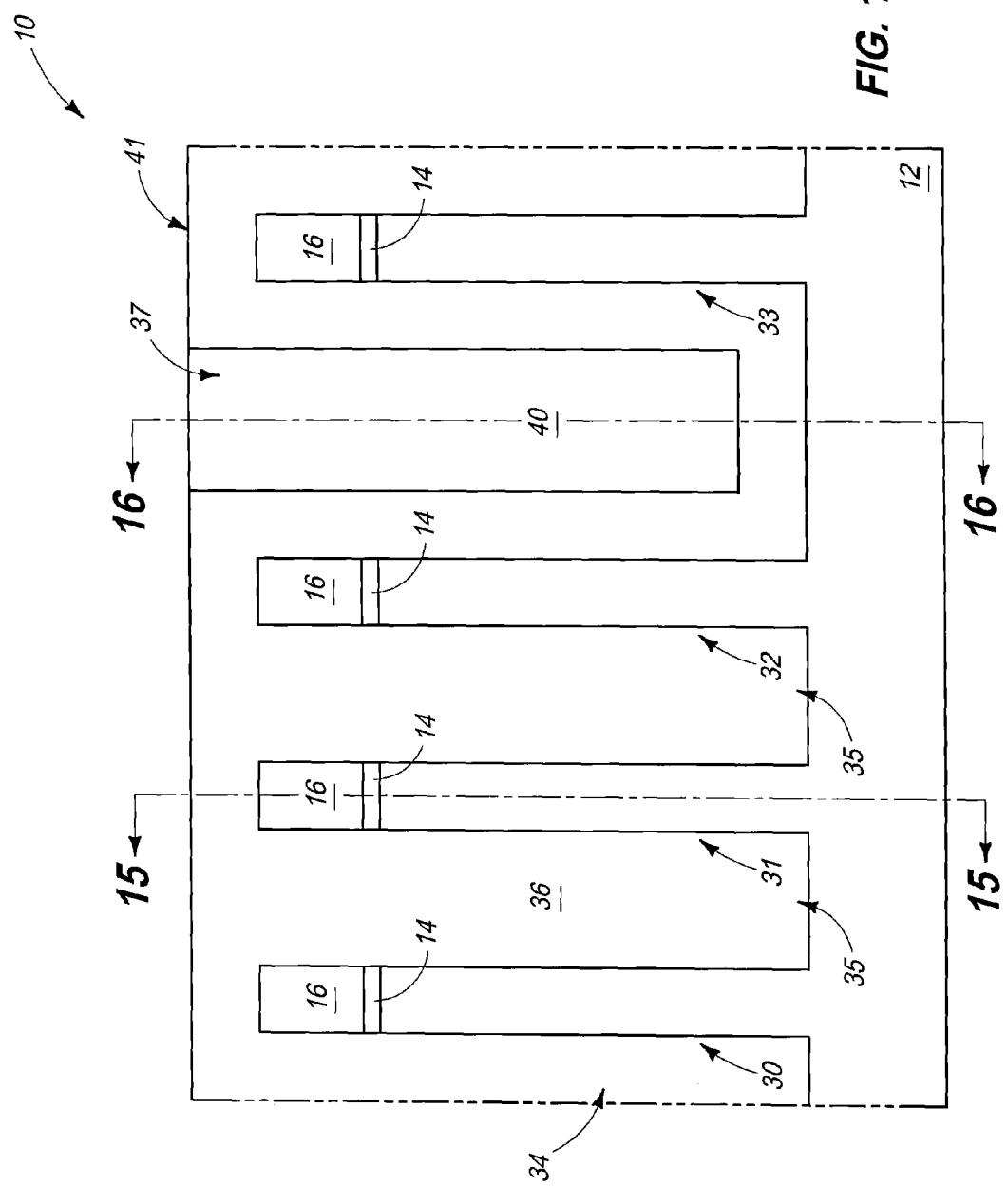
Figure 15:
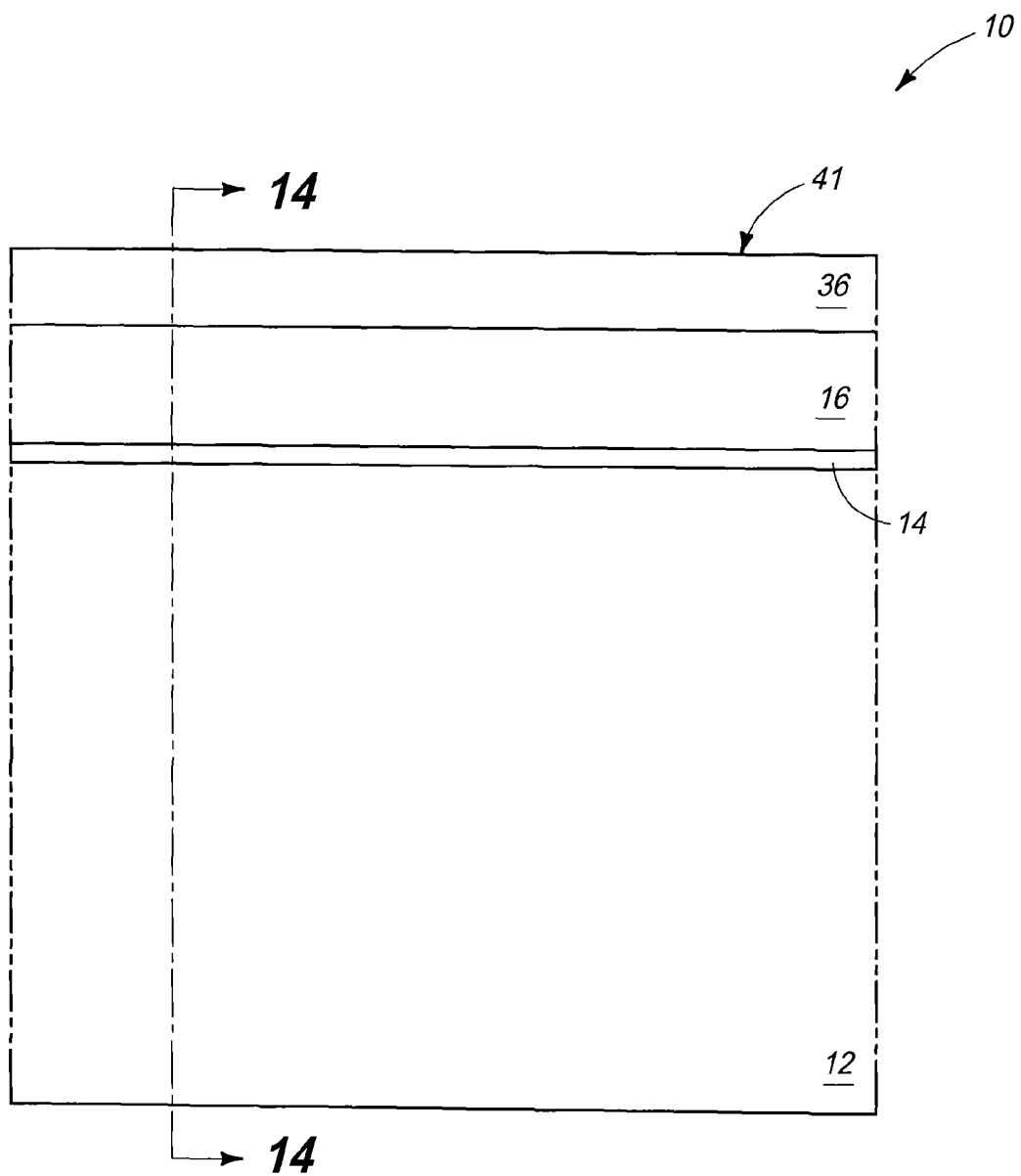
Figure 16:
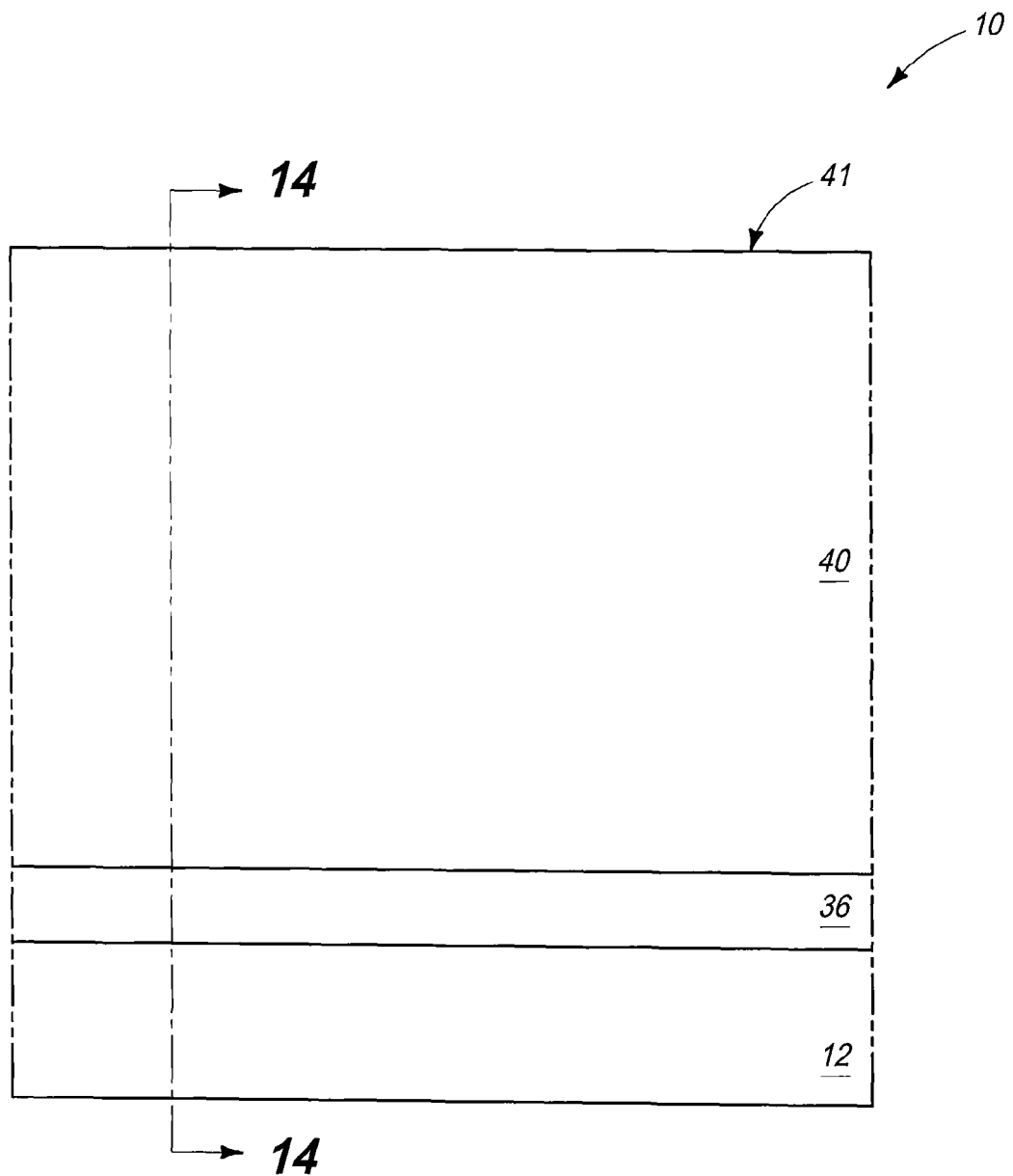
Figure 17:
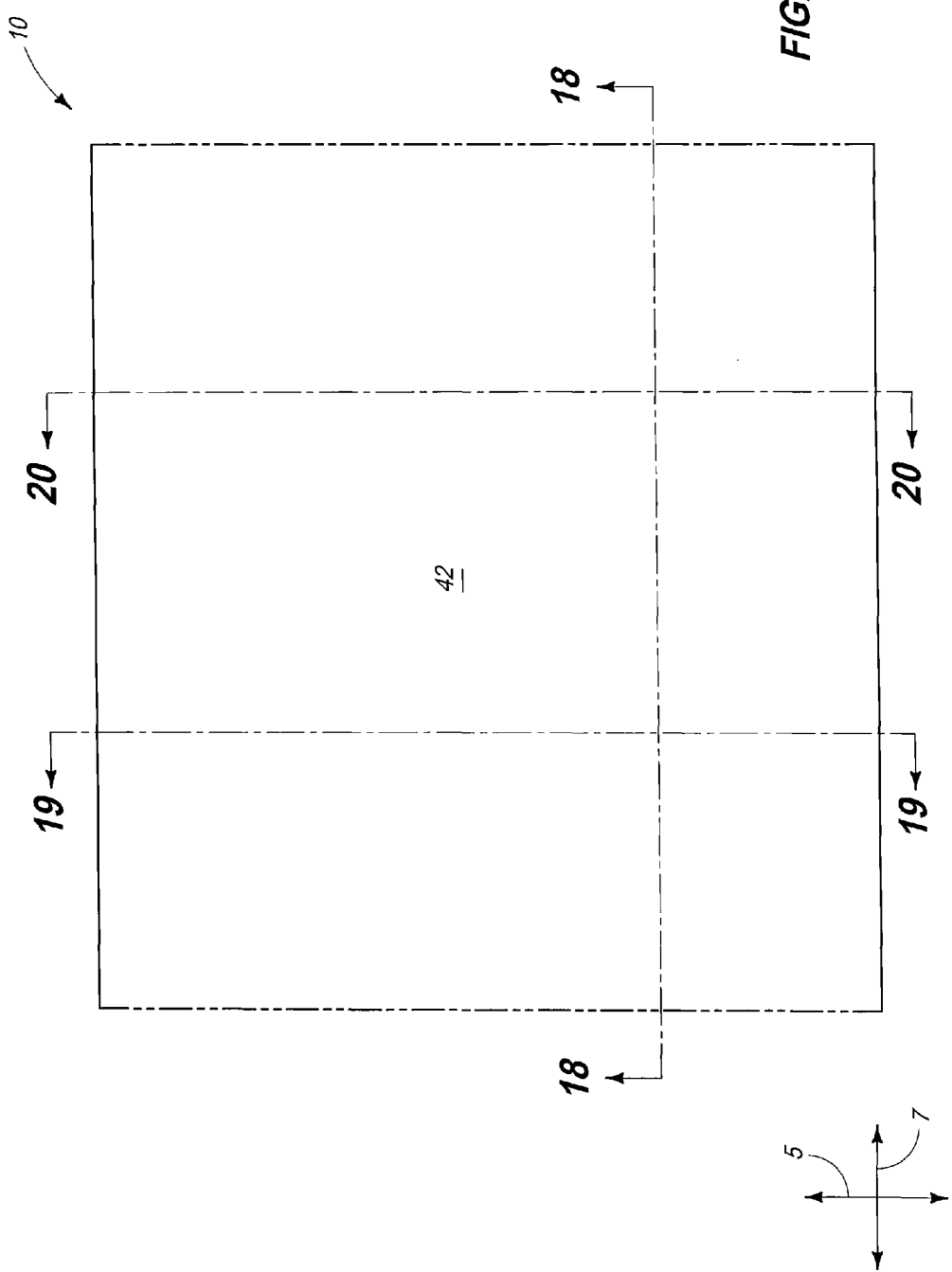
FIGS. 17-20 show the construction of FIGS. 1-4 at a processing stage subsequent to that of FIGS. 13-16.

The cross-sectional view of FIG. 2 shows that the spaces 27 and 28 between the repeating masking features (23-25) have a first width $W_1$ (shown for space 27), and that the space 29 between the terminal masking feature 26 and the penultimate masking feature 25 has a second width $W_2$ which is larger than the first width. In some embodiments, the first width $W_1$ may be within a range of from about 20 nanometers to about 200 nanometers, and the second width $W_2$ may be within a range of from about twice as large as the first width (i.e., $2W_1$) to about five-times as large as the first width (i.e., $5W_1$).

Figure 51:
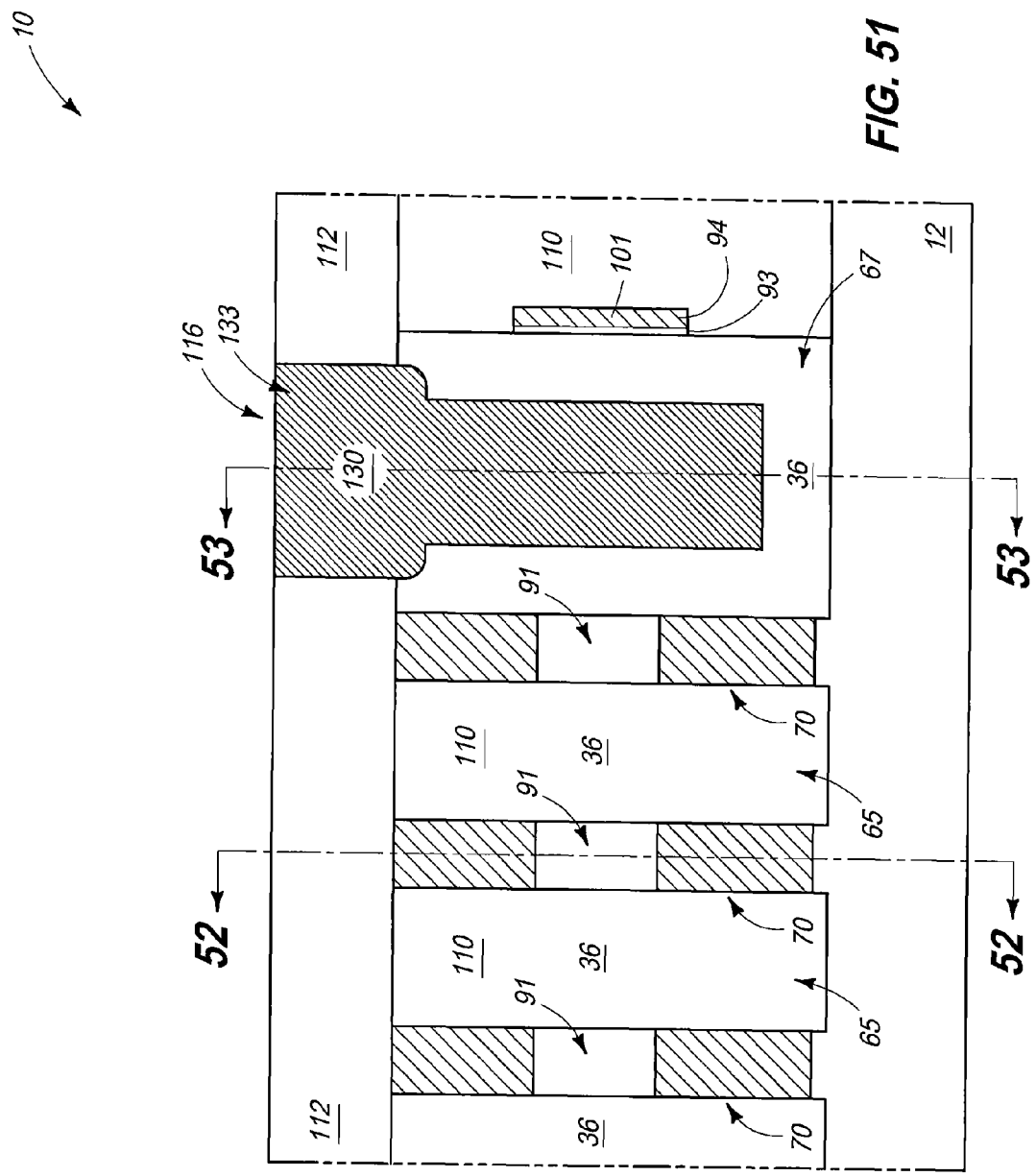
Figure 52:
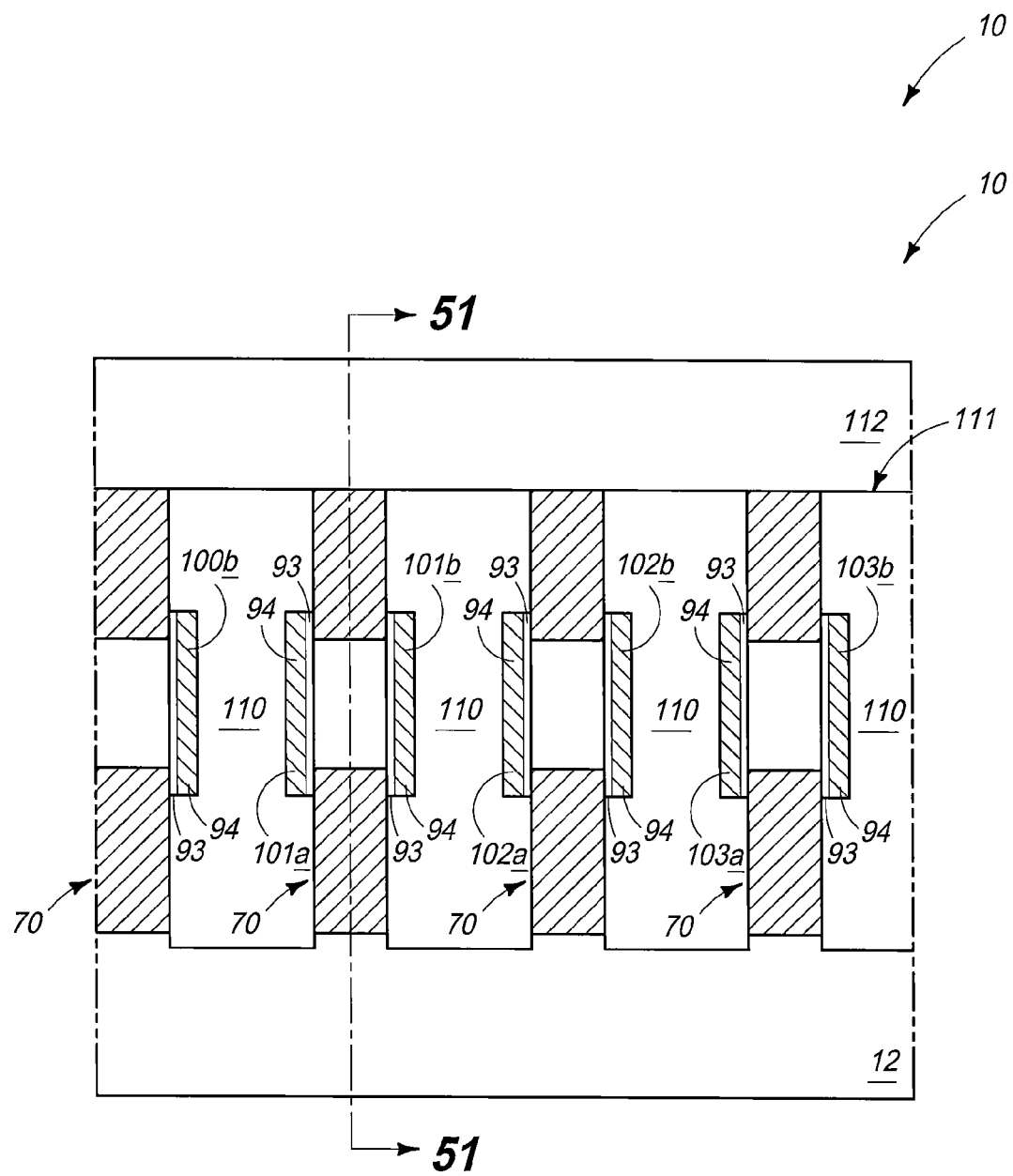

Ultimately, an electrically conductive interconnect may be formed within the wide space 29 (for instance, FIG. 51 shows an example interconnect 133 formed within a region corresponding to the space 29 of FIG. 2), and thus the wide space may be referred to as a contact location in some embodiments. Although the wide space 29 is shown proximate a terminal end of the plurality masking features 23-26, in other embodiments such space may be more centrally located within the plurality of masking features. Also, although only one wide space 29 is shown defined by the of masking features 23-26, in other embodiments there may be multiple wide spaces for ultimately providing locations for multiple conductive interconnects. For instance, a row of masking features may be considered to have a pair of opposing terminal ends, and there may be a two wide spaces; with one wide space proximate one of the terminal ends, and the other wide space proximate the other of the terminal ends.

Referring to FIGS. 5-8, a pattern is transferred from mask 20 (FIGS. 1-4) through silicon nitride 16 and pad oxide 14, and into semiconductor material 12; and subsequently mask 20 is removed. The pattern may be transferred into materials 12, 14 and 16 with any suitable etch or combination of etches. For instance, the pattern may be transferred into silicon nitride 16 with a first etch to form the silicon nitride into a patterned hard mask. Subsequently, mask 20 (FIGS. 1-4) may be removed, and then a pattern from the patterned hard mask may be transferred through pad oxide 14 and into the underlying semiconductor material 12 with any suitable etch which is selective for materials 12 and 14 relative to nitride 16. For purposes of interpreting this disclosure and the claims that follow, an etch is considered to be selective for a first material relative to a second material if the etch removes the first material at a faster rate than the second material; which includes, but is not limited to, etches which are 100 percent selective for the first material relative to the second material.

The etching into semiconductor material 12 extends the spaces 27-29 into such semiconductor material, and patterns the semiconductor material into a plurality of spaced apart fins 30-33. Each of the fins is capped by a line of silicon nitride 16 at the processing stage of FIGS. 5-8. The fins 33 and 32 may be referred to as a terminal fin and a penultimate fin, respectively. The space 29 between the terminal fin and the penultimate fin has the width $W_2$, while the widths of the other spaces 27 and 28 is $W_1$; and thus the width of the space between the terminal fin and the penultimate fin is wider than the widths of the other spaces.

The individual fins extend primarily along a first direction corresponding to axis 5. The fins are indicated to "extend primarily" along the first direction to indicate that there may be waviness or other variation along the fins; but that, regardless, the general elongated direction of the individual fins is along the axis 5.

The fins 30-33 and spaces 27-29 may be considered to be stacked along a direction 7 (shown in FIG. 5) which is substantially orthogonal to the direction 5; and to thereby define a stack 34 of alternating spaces and fins. The term "substantially orthogonal" is utilized to indicate that the direction of the stacking of the fins and spaces is orthogonal to the direction of the elongation of the fins within reasonable tolerances of design and measurement. The space 29 may be referred to as a terminal space of the stack 34, and the spaces 27 and 28 may be considered to be representative of non-terminal spaces of such stack.

Referring next to FIGS. 9-12, dielectric material 36 is formed within the spaces 27-29. The dielectric material fills the non-terminal spaces 27 and 28, and forms a liner 38 within the terminal space 29. Such liner narrows the terminal space. In some embodiments, the lined terminal space may be considered to define an upwardly-opening dielectric-lined trench 37. The liner is shown narrowing a width of space 29 by about one-half in the illustrated example embodiment of FIG. 10. In other embodiments, the relative thickness of dielectric material 36 to the width of space 29 may be different so that the width of the space is narrowed by a different amount than shown in FIG. 10.

The dielectric material 36 within the non-terminal spaces 27 and 28 may be considered to form dielectric material plates 35 (shown in FIG. 10) between the various fins 30-32.

In the shown embodiment, the dielectric material 36 overfills openings 27 and 28, and thus extends across upper surfaces of silicon nitride 16.

Dielectric material 36 may comprise any suitable composition or combination of compositions, and in some embodiments may comprise, consist essentially of, or consist of one or more of silicon dioxide, and any of various doped glasses (for instance, borophosphosilicate glass, phosphosilicate glass, fluorosilicate glass, etc.).

The dielectric material 36 may be deposited with any suitable process, including, for example, one or both of atomic layer deposition (ALD) and chemical vapor deposition (CVD); and in some embodiments may be deposited using sub-atmospheric chemical vapor deposition (SA-CVD).

Referring to FIGS. 13-16, the upwardly-opening dielectric-lined trench 37 is filled with sacrificial material 40, and subsequently construction 10 is subjected to planarization to form a planarized upper surface 41 extending across materials 36 and 40. Such planarization may be accomplished utilizing, for example, chemical-mechanical polishing (CMP).

The sacrificial material 40 may comprise any material which may be selectively removed relative to material 36 and various other materials at a subsequent processing stage discussed below with reference to FIGS. 46-49. In some embodiments, the sacrificial material may comprise, consist essentially of or consist of silicon. Such silicon may be in any suitable form; and in some embodiments may be polycrystalline and/or amorphous. The sacrificial silicon 40 may be doped in some embodiments; and may be undoped, or at least substantially undoped, in other embodiments.

Figure 18:
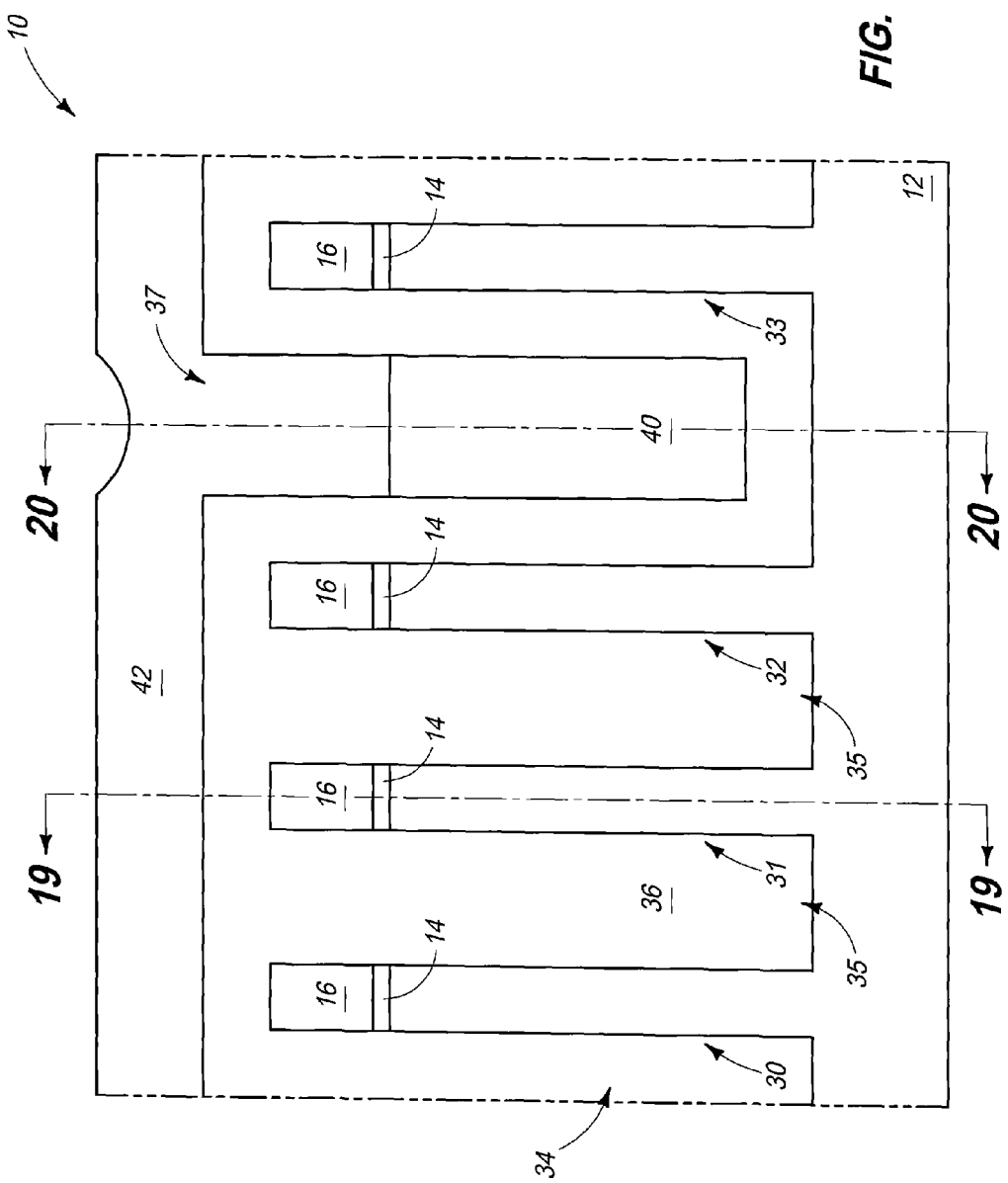
Figure 19:
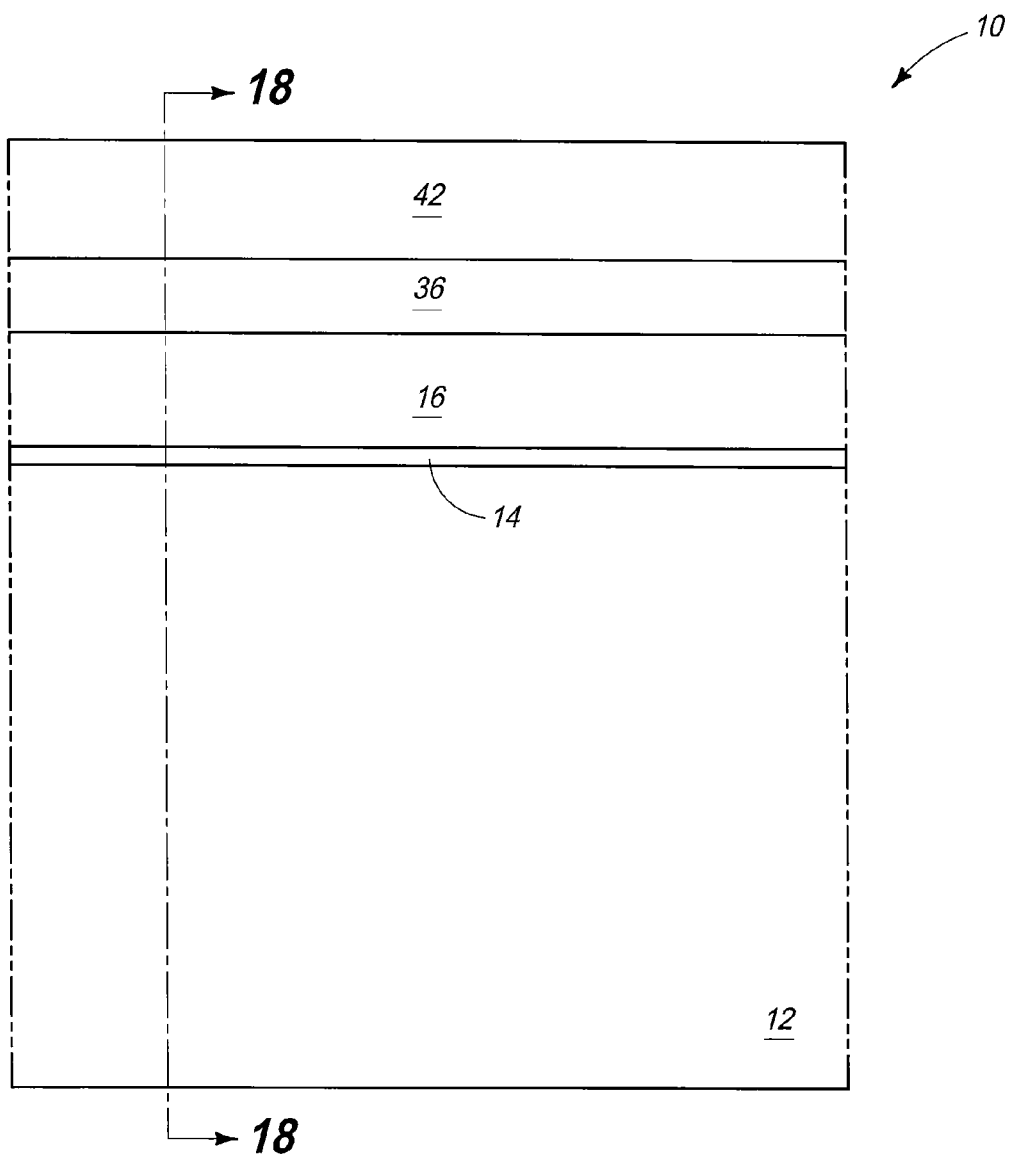
Figure 20:
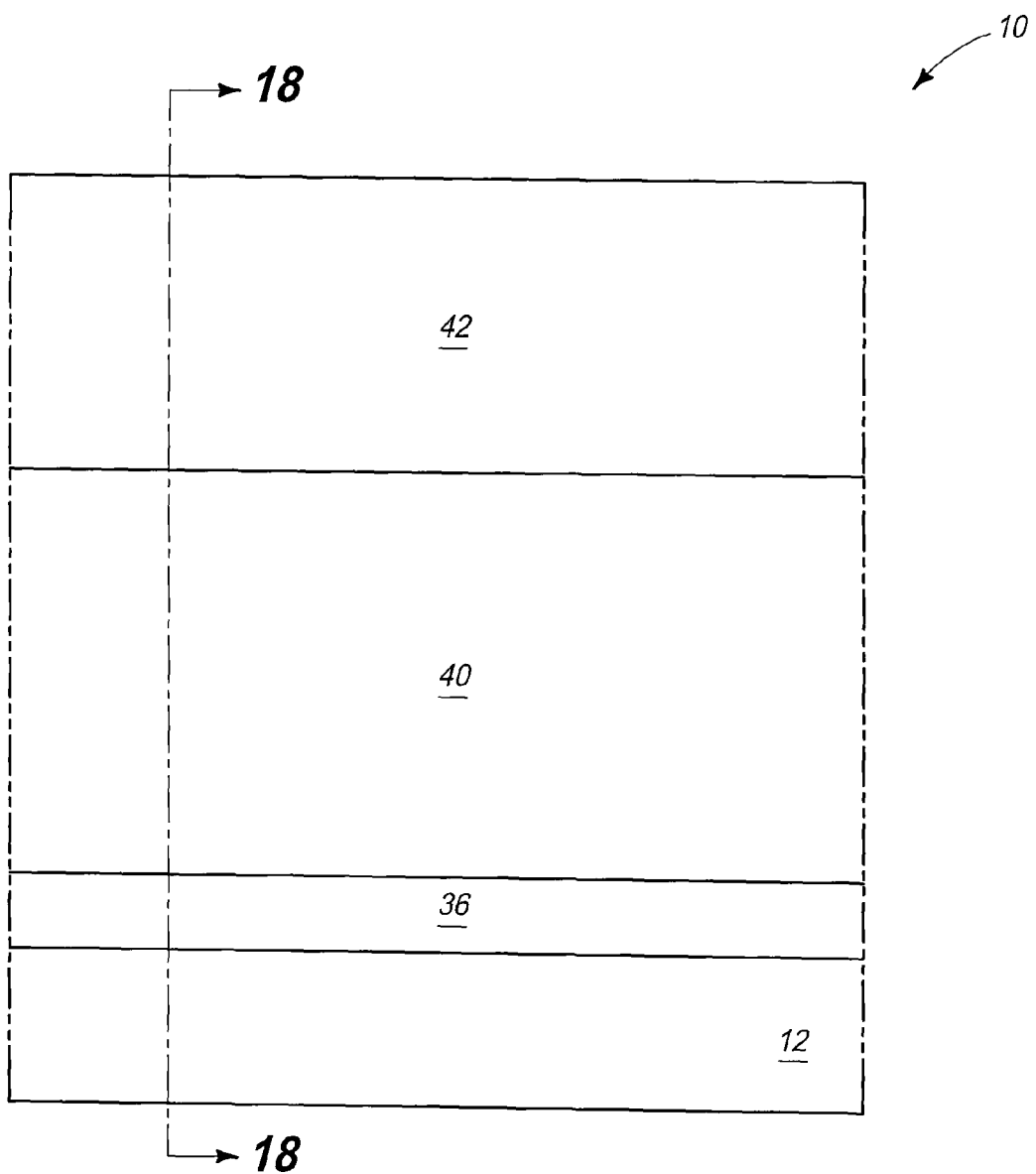
Figure 21:
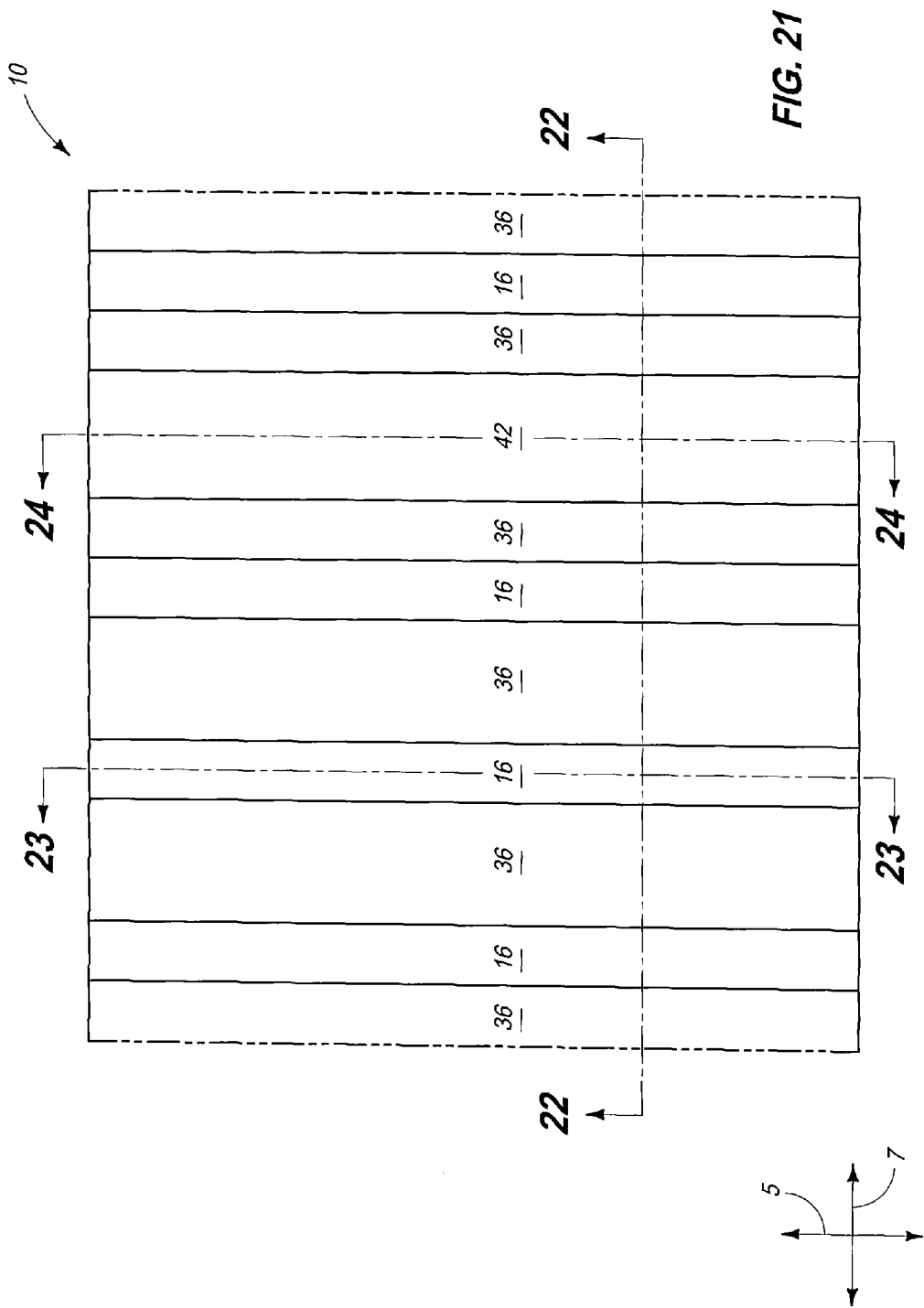
FIGS. 21-24 show the construction of FIGS. 1-4 at a processing stage subsequent to that of FIGS. 17-20.
Figure 22:
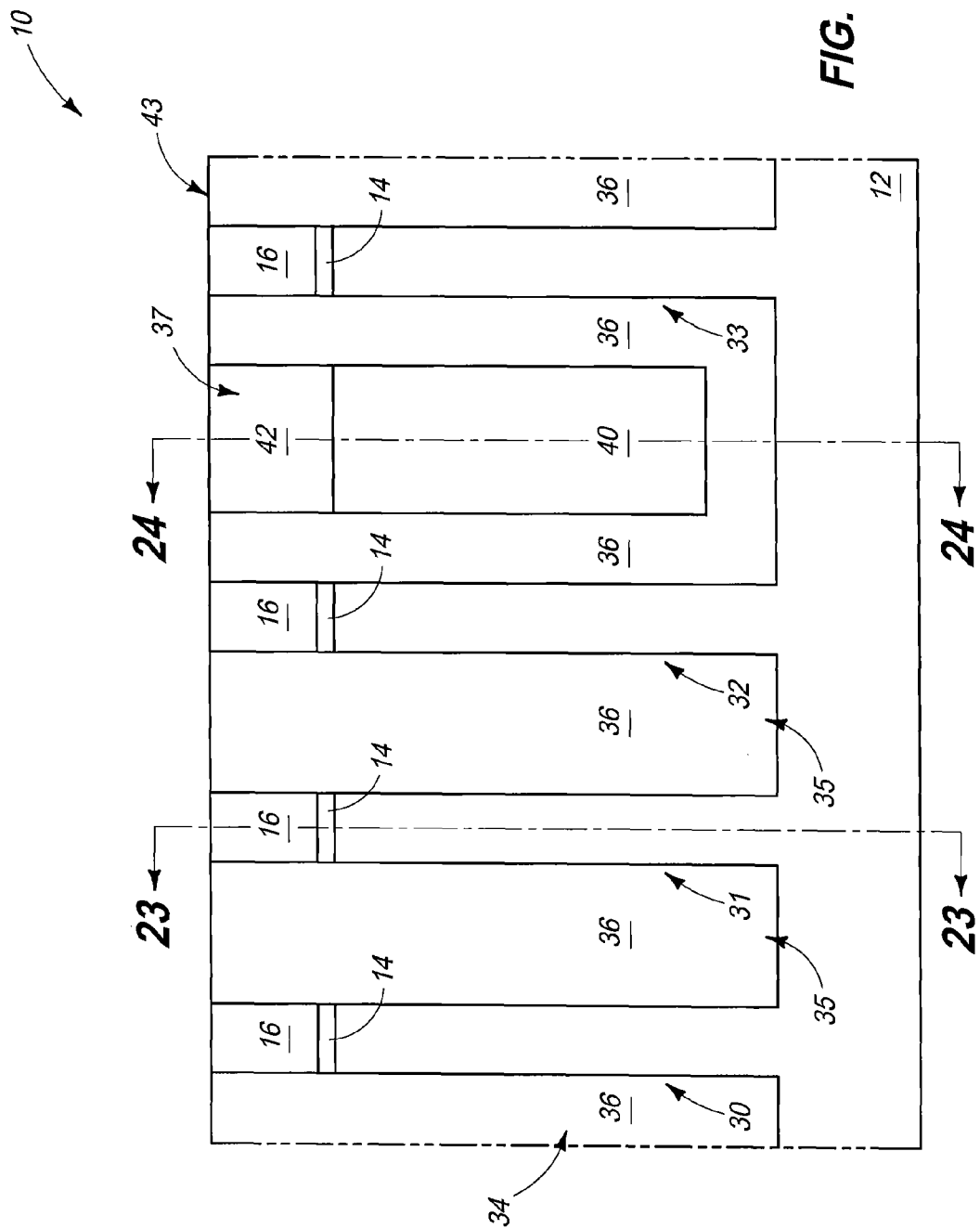
Figure 23:
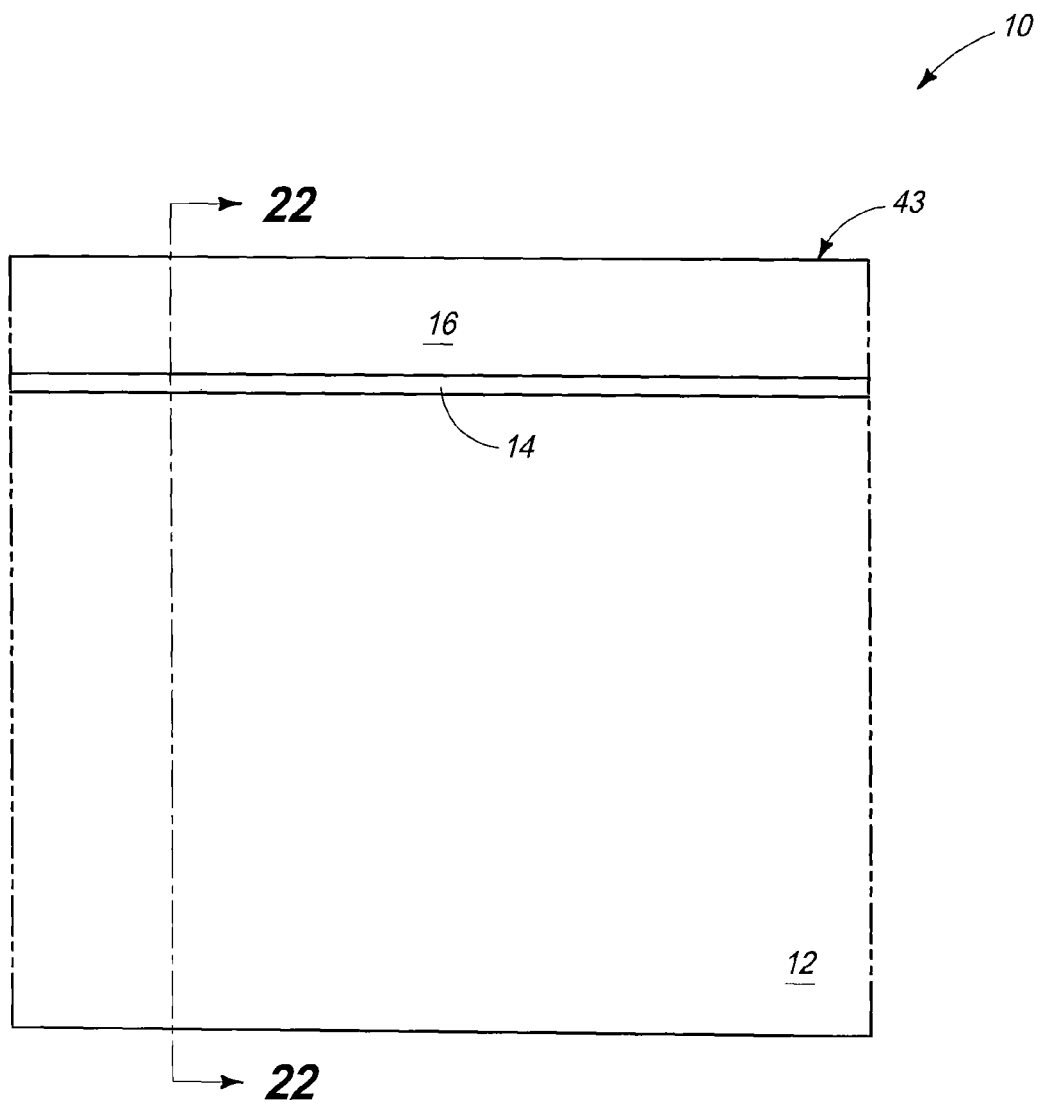
Figure 24:
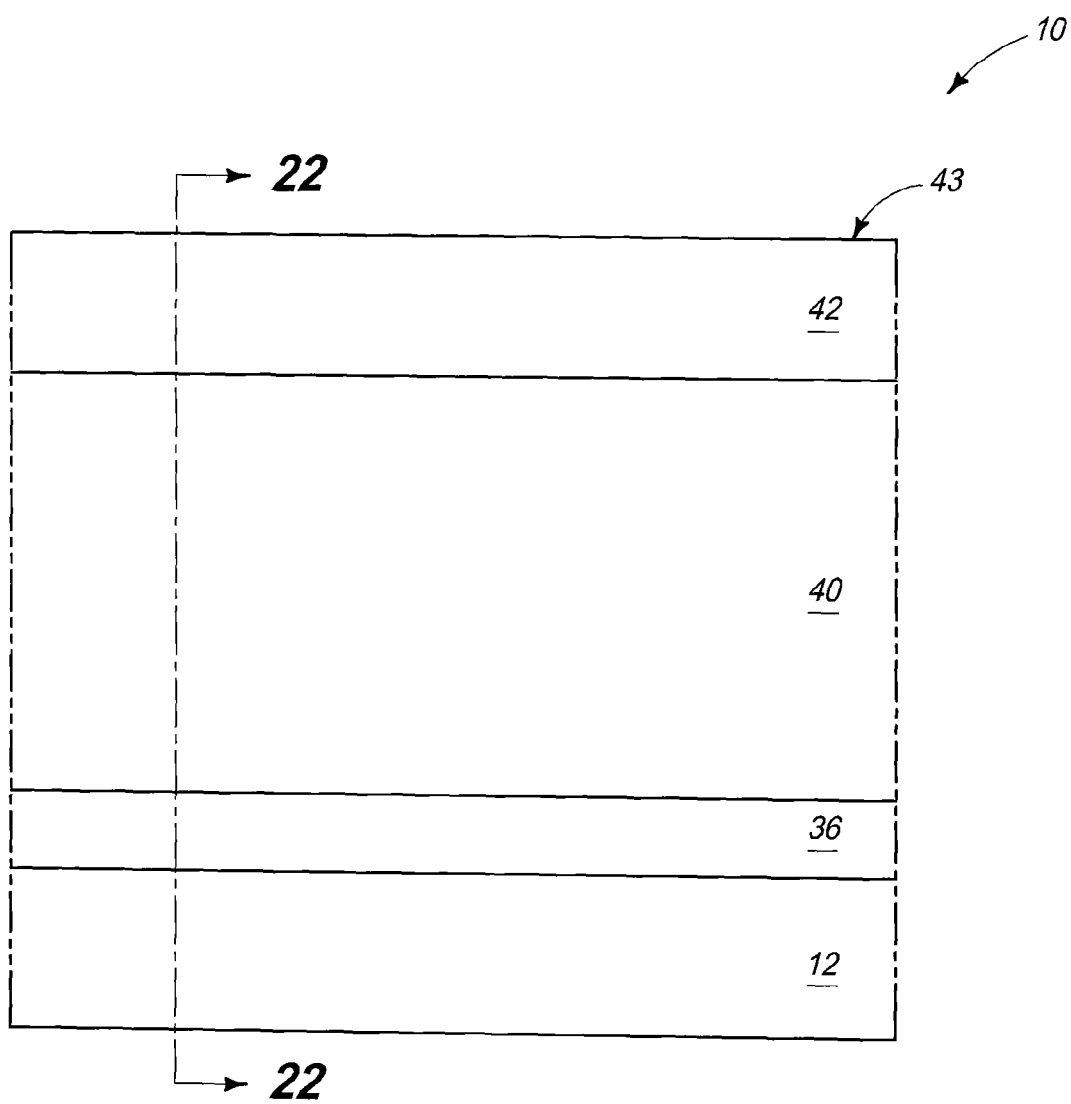

Referring to FIGS. 17-20, an upper surface of sacrificial material 40 is recessed within trench 37 to a level below the bottom of silicon nitride 16 (as shown in FIG. 18). Such recessing may be accomplished with any suitable etch selective for material 40 relative to dielectric material 36. In the shown embodiment, the upper surface of sacrificial material 40 is recessed to a level below the bottom of pad oxide 14.

A capping dielectric 42 is formed over the recessed sacrificial material 40, and across the dielectric material 36. The dielectric material 42 may comprise any suitable composition, and in some embodiments may comprise silicon dioxide and/or any of various doped oxides. In some embodiments, the capping dielectric 42 may comprise a same composition as the dielectric material 36, and in other embodiments the capping dielectric 42 may be of a different composition than the dielectric material 36.

Referring to FIGS. 21-24, construction 10 is subjected to planarization (for instance, CMP) to form a planarized upper surface 43 extending across materials 16, 36 and 42. The planarized surface 43 includes surfaces of the dielectric material plates 35, the lines of silicon nitride 16, and the capping dielectric 42.

Referring next to FIGS. 25-28, the nitride 16, pad oxide 14 and capping dielectric 42 (FIGS. 21-24) are removed, and a planarized surface 45 is formed across materials 12, 36 and 40. The planarized surface 45 extends across dielectric plates 35 and fins 30-33, and the formation of such planarized surface reduces heights of the dielectric plates and fins in the shown embodiment.

Pad oxide 44 and silicon nitride 46 are formed across planarized surface 45. In some embodiments, the silicon nitride 46 may be considered to form an expanse extending across the planarized surface 45.

Figure 25:
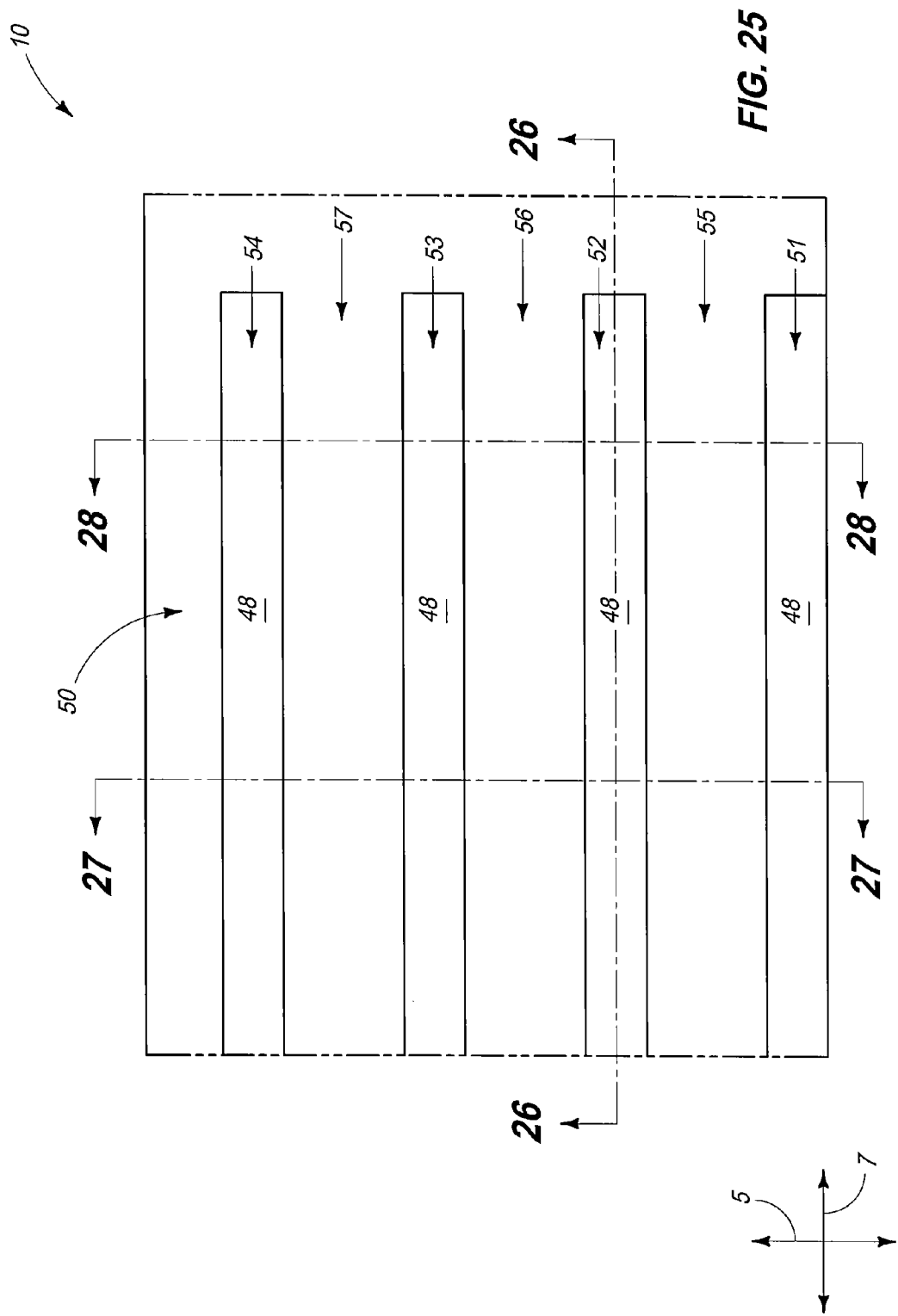
FIGS. 25-28 show the construction of FIGS. 1-4 at a processing stage subsequent to that of FIGS. 21-24.
Figure 26:
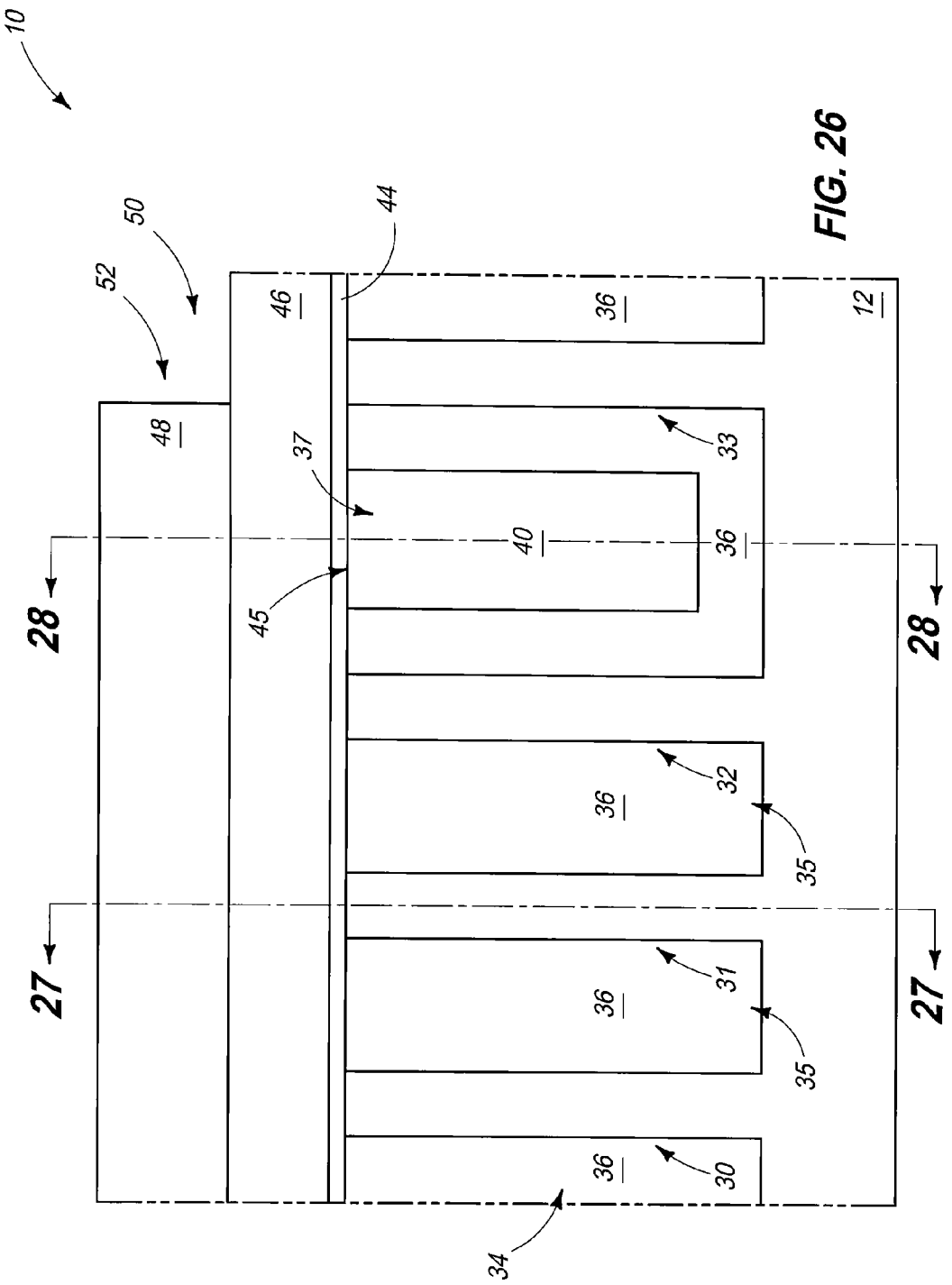
Figure 27:
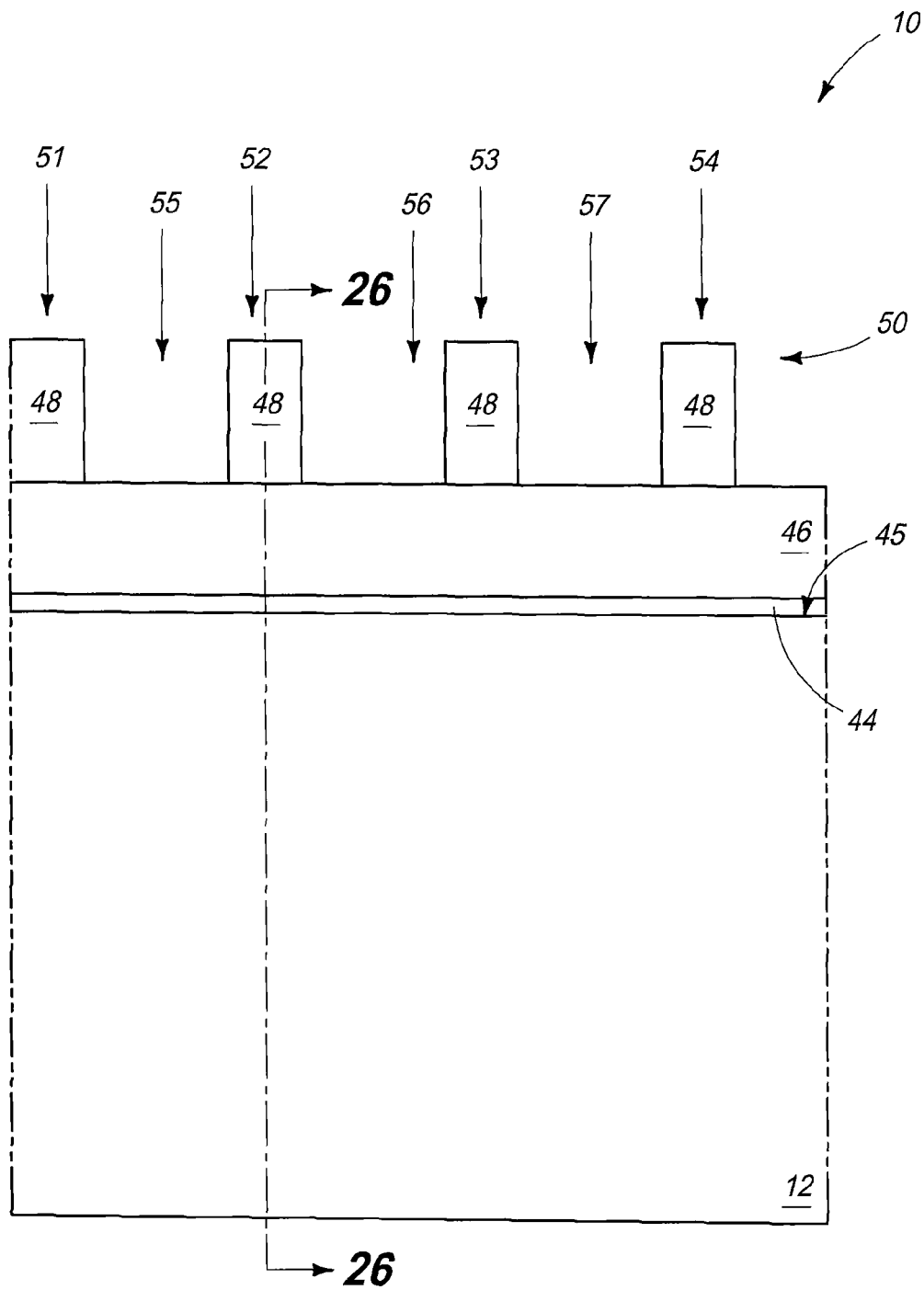
Figure 28:
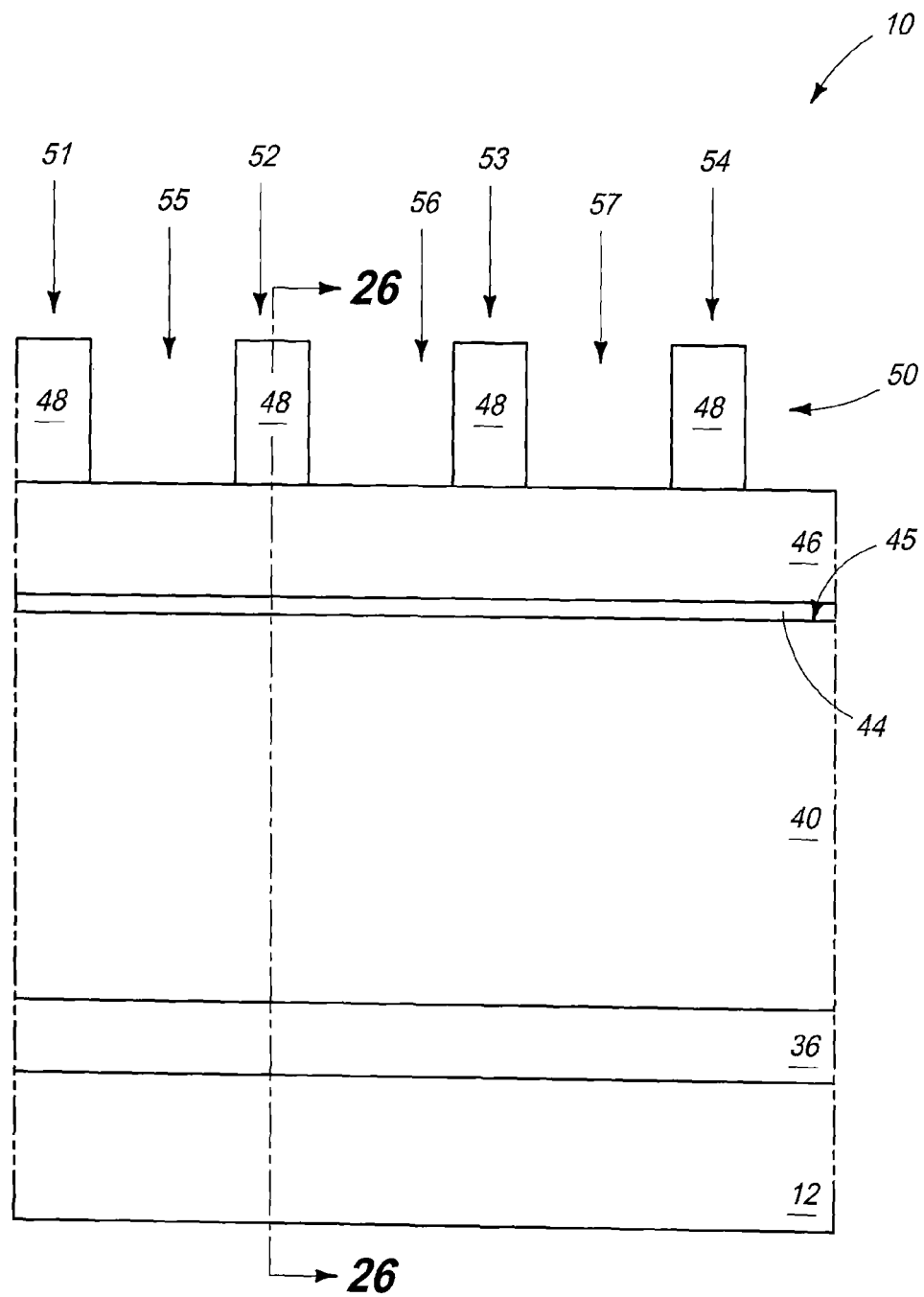
Figure 29:
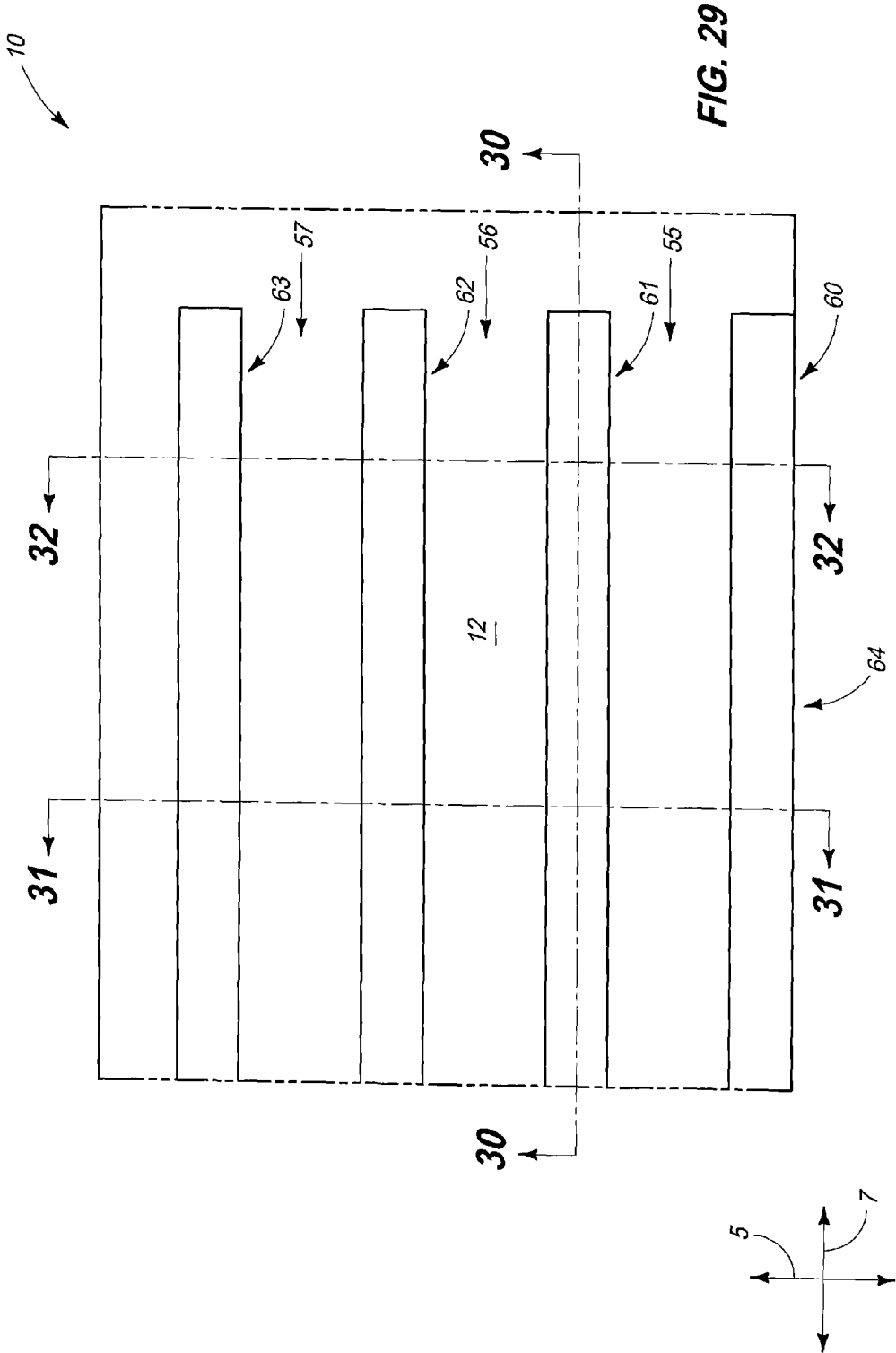
FIGS. 29-32 show the construction of FIGS. 1-4 at a processing stage subsequent to that of FIGS. 25-28.

A patterned mask 50 is provided across an upper surface of silicon nitride 46. The mask 50 comprises a masking material 48 patterned into a plurality of lines 51-54 that extend primarily along the direction of axis 7 (FIG. 25). The masking material 48 may comprise any suitable composition or combination of compositions; and may, for example, comprise one or more of the compositions discussed above regarding masking material 22 (FIGS. 1-4).

The lines 51-54 are separated from one another by spaces 55-57.

Referring to FIGS. 29-32, a pattern is transferred from mask 50 (FIGS. 25-28) through silicon nitride 46, pad oxide 44, sacrificial material 40 and dielectric material 36; and into semiconductor material 12. Subsequently, mask 50 is removed. The pattern may be transferred from mask 50 into the underlying materials with any suitable etch or combination of etches. For instance, the pattern may be transferred from mask 50 into silicon nitride 46 with a first etch to form the silicon nitride into a patterned hard mask. Subsequently, mask 50 may be removed, and then a pattern from the patterned hard mask may be transferred into the underlying semiconductor materials with any suitable etch or combination of etches.

The etching into materials 12, 36 and 40 extends the spaces 55-57 into such materials, and patterns the fins 30-33 (initially described in FIGS. 5-8, and remaining through FIGS. 25-28) into a plurality of spaced apart slices 60-63. Each of the slices is capped by a line of semiconductor material 46 at the processing stage of FIGS. 29-32. The individual slices extend primarily along the direction corresponding to axis 7 (FIG. 29), and thus extend substantially orthogonally to the direction of the fins 30-33 described above with reference to the processing stage of FIGS. 5-8.

The spaces 55-57 between the slices may be referred to as gaps. The slices 60-63 and gaps 55-57 may be considered to be stacked along the direction 5 (FIG. 29) which is substantially orthogonal to the direction 7 (FIG. 29); and to thereby define a stack 64 of alternating gaps and slices.

Figure 30:
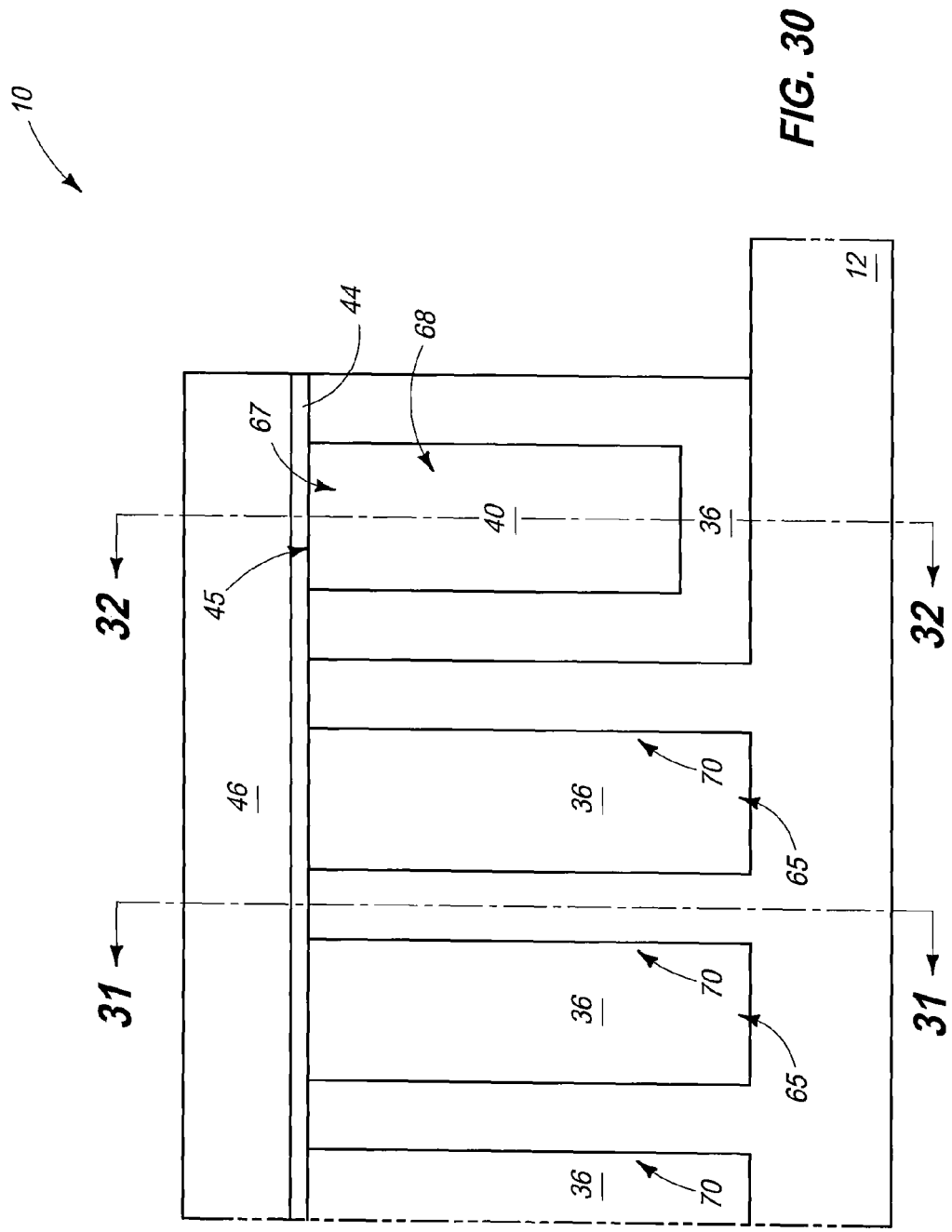
Figure 31:
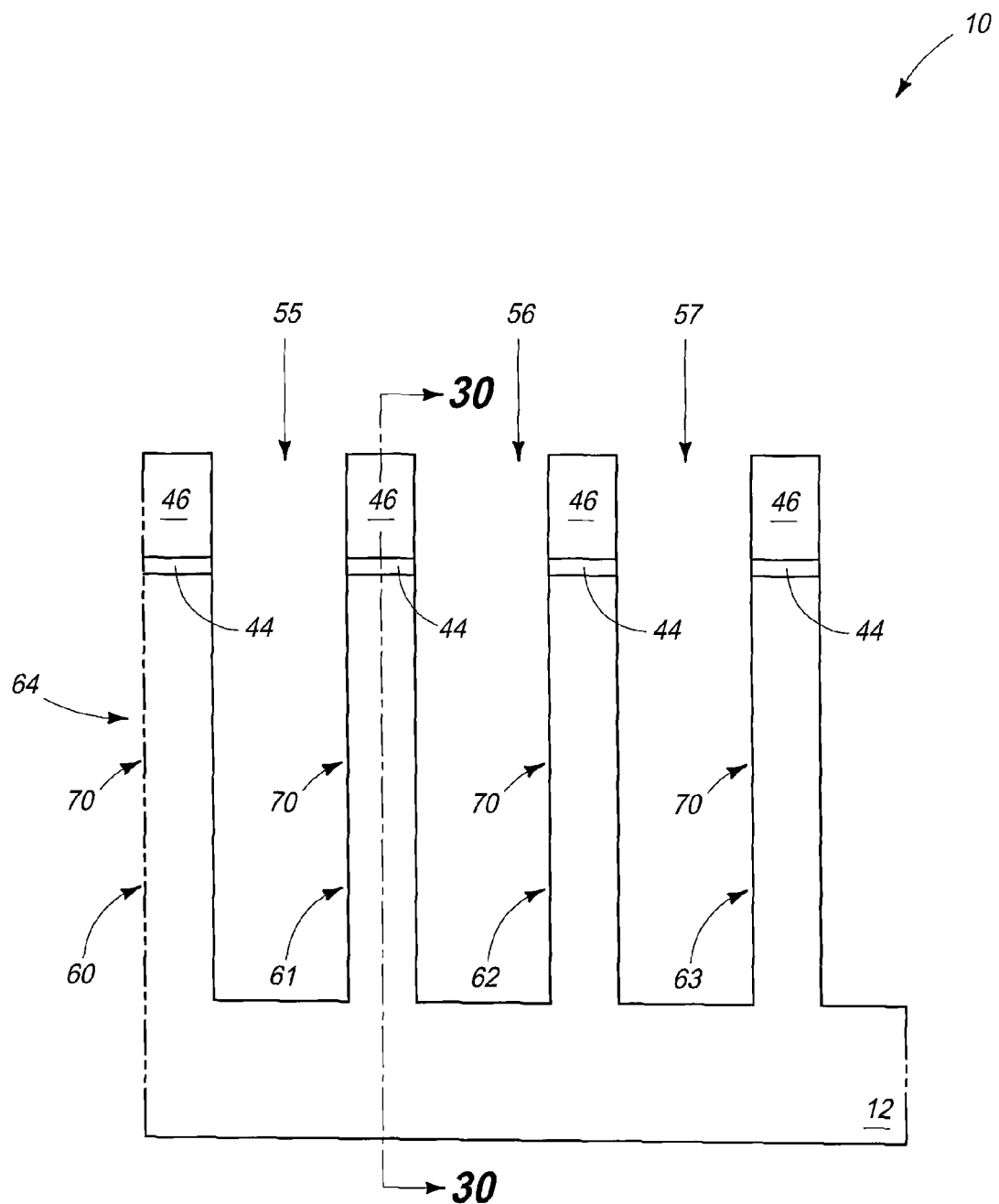
Figure 32:
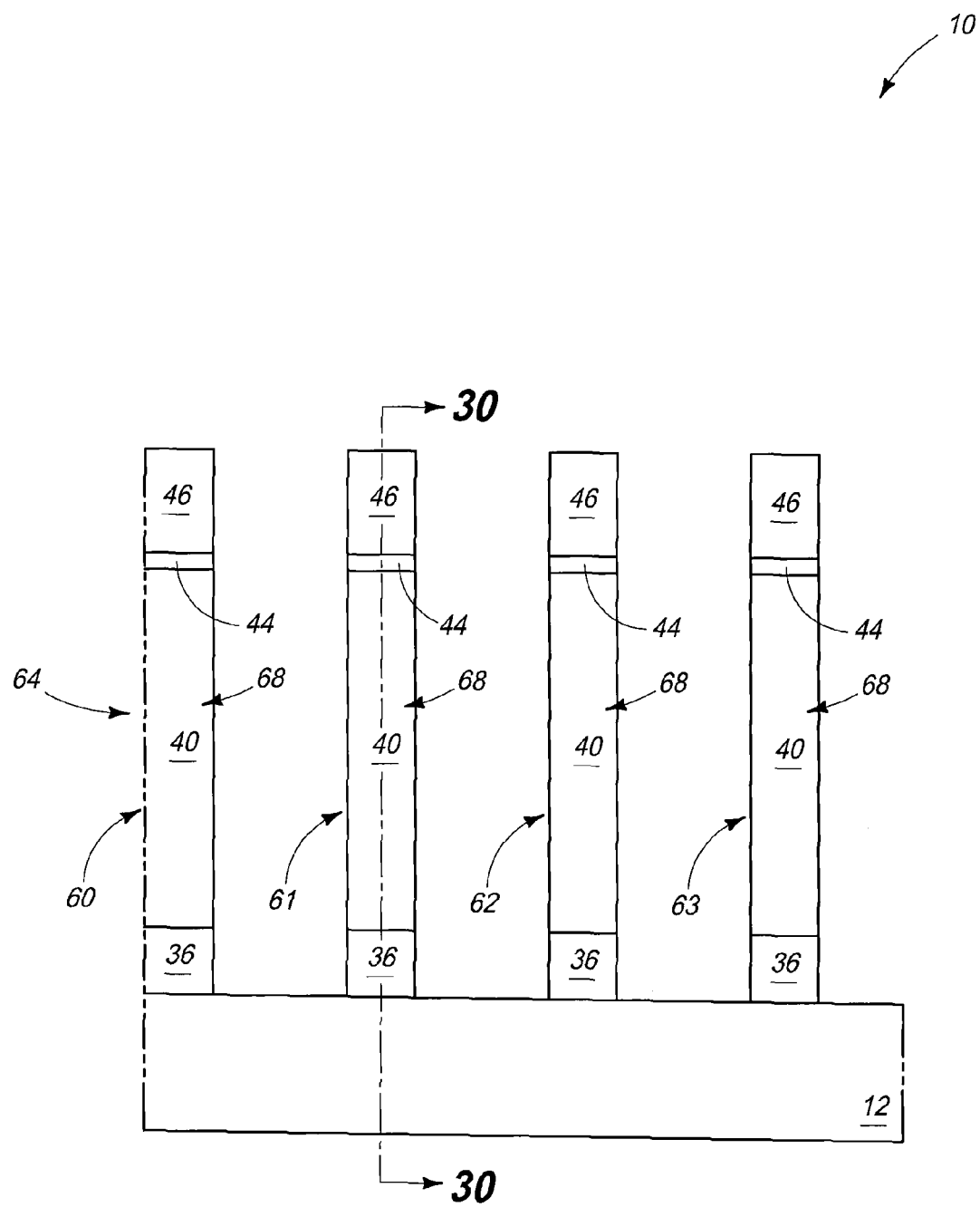

The patterning of the fins 30-33 (initially described in FIGS. 5-8, and remaining through FIGS. 25-28) into the slices 60-63 converts the dielectric plates 35 (shown, for example, in FIG. 26) into substantially vertical dielectric pillars 65 (shown in FIG. 30). The patterning of the fins into the slices also patterns the upwardly-opening dielectric-lined trench 37 (described initially with reference to FIGS. 9-12 and continuing through FIGS. 25-28) into upwardly-opening dielectric-lined containers 67 (shown in FIG. 30). Such containers are filled with plugs 68 of sacrificial material 40 at the processing stage of FIG. 30. The patterning of the fins into the slices also patterns the semiconductor material 12 of the non-terminal fins into a plurality of substantially vertical projections 70 (shown in FIGS. 30 and 31); and removes the terminal fin 33 (such terminal fin is visible, for example, at the processing stage of FIG. 26).

The pillars 65 and projections 70 are referred to as being "substantially vertical" to indicate that they extend substantially orthogonally to a primary upper surface of the substrate comprising material 12. Specifically, the term "vertical" is used herein to define a relative orientation of an element or structure with respect to a major plane or surface of a wafer or substrate. A structure may be referred to as being "substantially vertical" to indicate that the structure is vertical to within reasonable tolerances of fabrication and measurement.

Figure 33:
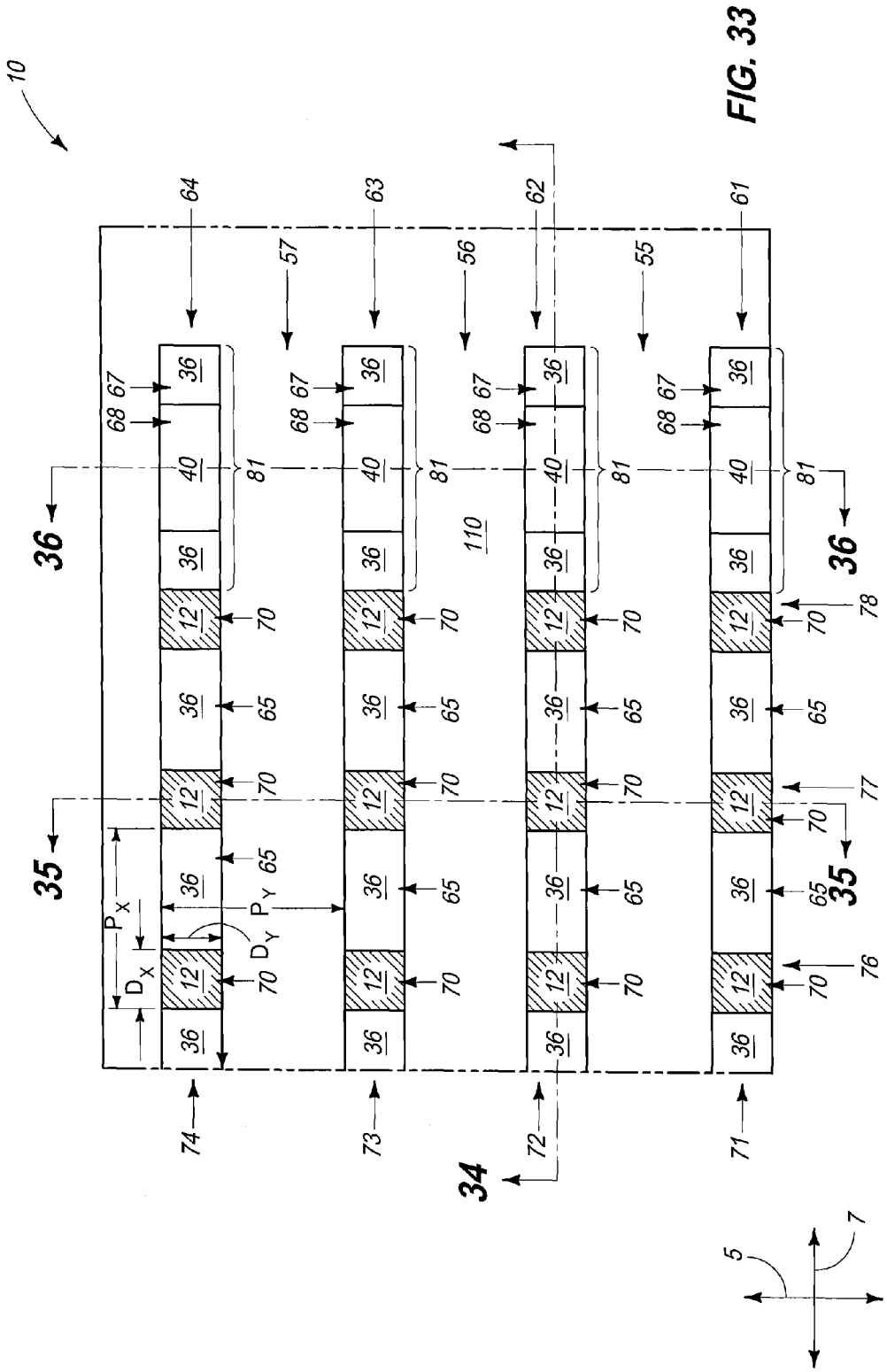
FIGS. 33-37 show the construction of FIGS. 1-4 at a processing stage subsequent to that of FIGS. 29-32.
Figure 34:
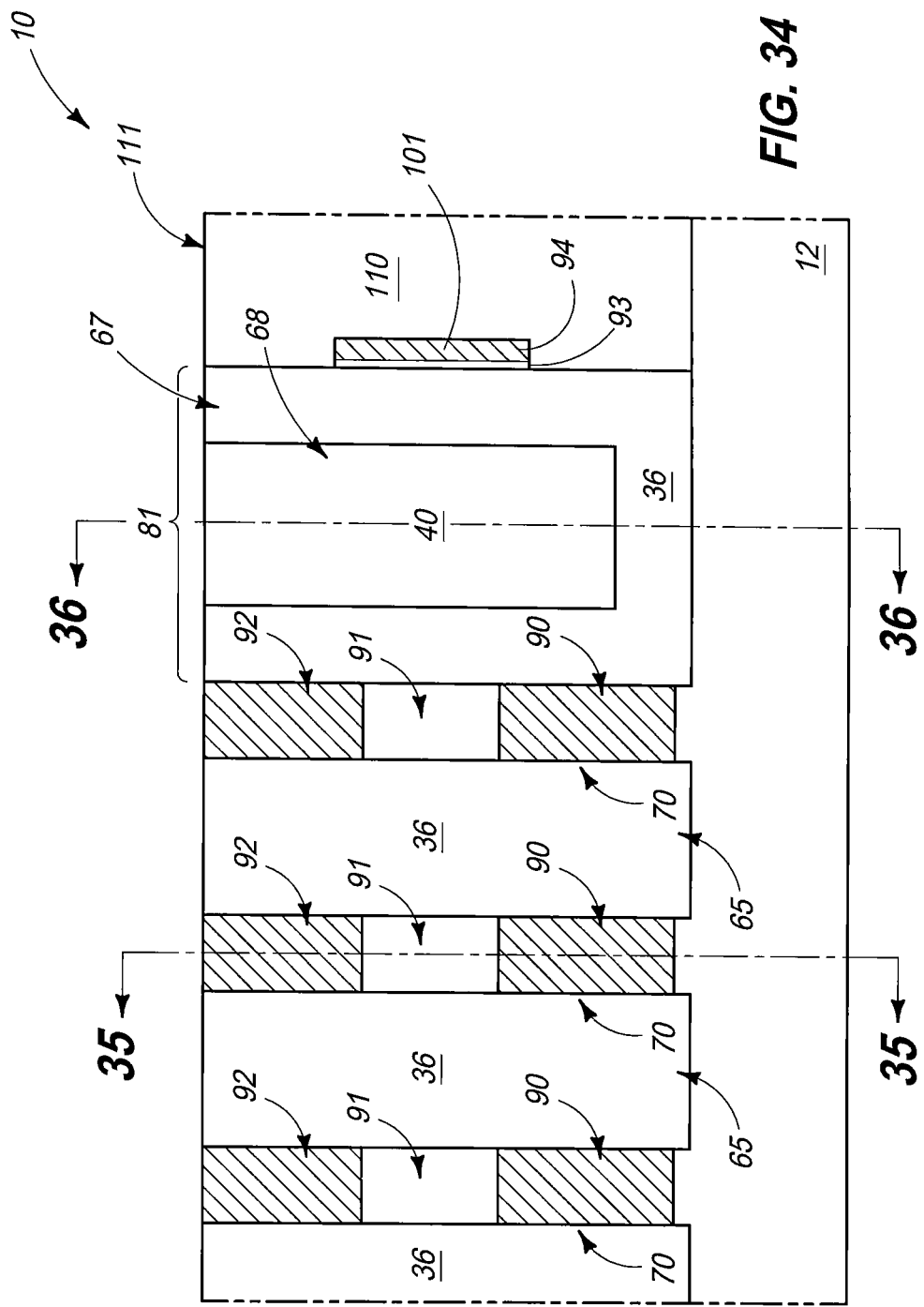
Figure 35:
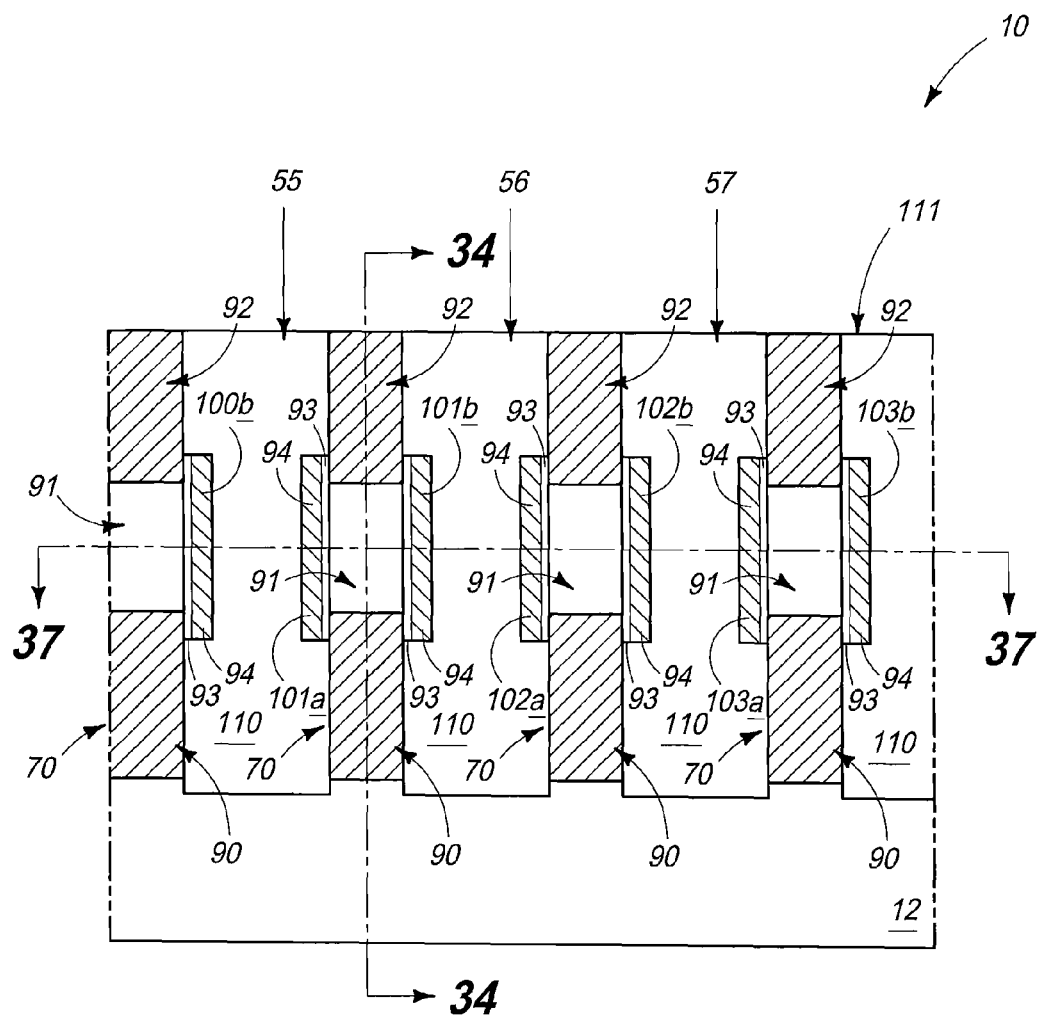

Referring to FIGS. 33-37, the projections 70 are arranged in rows 71-74 and columns 76-78 of an array 80. In the shown embodiment, the rows extend along the direction of axis 7, and the columns extend along the direction of axis 5. Each row has a terminal projection 81 at an end region of the row, with such terminal projection comprising the sacrificial material 40 within the upwardly-opening dielectric-lined container 67. The dielectric material 36 of such upwardly-opening containers spaces the sacrificial material 40 from the semiconductor material 12 of the substrate. The rows correspond to segments of the slices 61-64, as shown in FIG. 33. Ultimately, electrically conductive contacts are formed to extend in the projections 81 (for instance, FIG. 51 shows an example electrically conductive contact 133). In some embodiments, the projections 81 may be considered to be contact location projections comprising sacrificial material 40 spaced from semiconductor material of the substrate 12 by the dielectric material 36.

FIGS. 34-37 show gate dielectric 93 formed along the rows 71-74, and show electrically conductive gate material 94 formed along the gate dielectric 93. The electrically conductive gate material extends across the channel regions 91 of the illustrated transistors; and forms gates which gatedly connect the source/drain regions 90 and 92 of individual transistors to one another. In other embodiments, other electrical components may be utilized instead of the illustrated transistors. For instance, thyristors may be utilized instead of the shown transistors.

Figure 36:
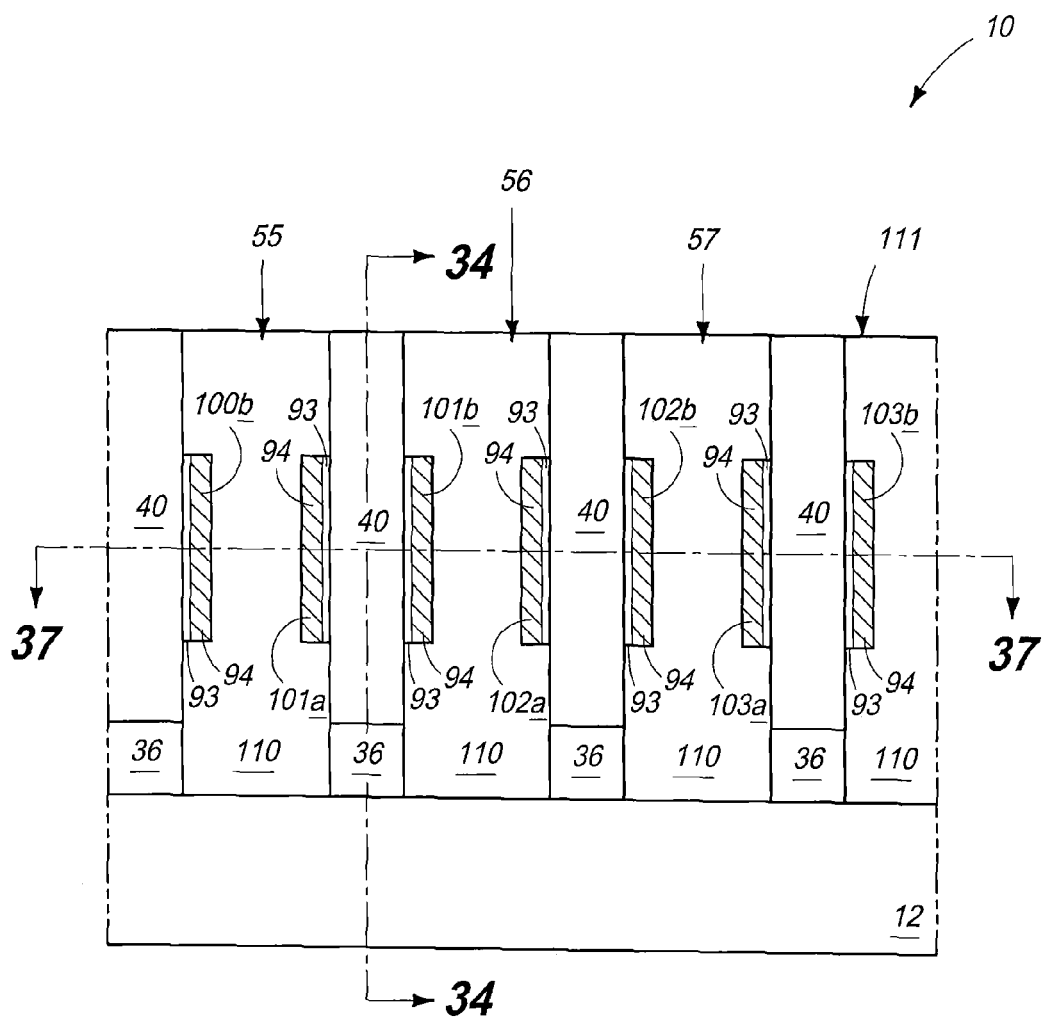
Figure 37:
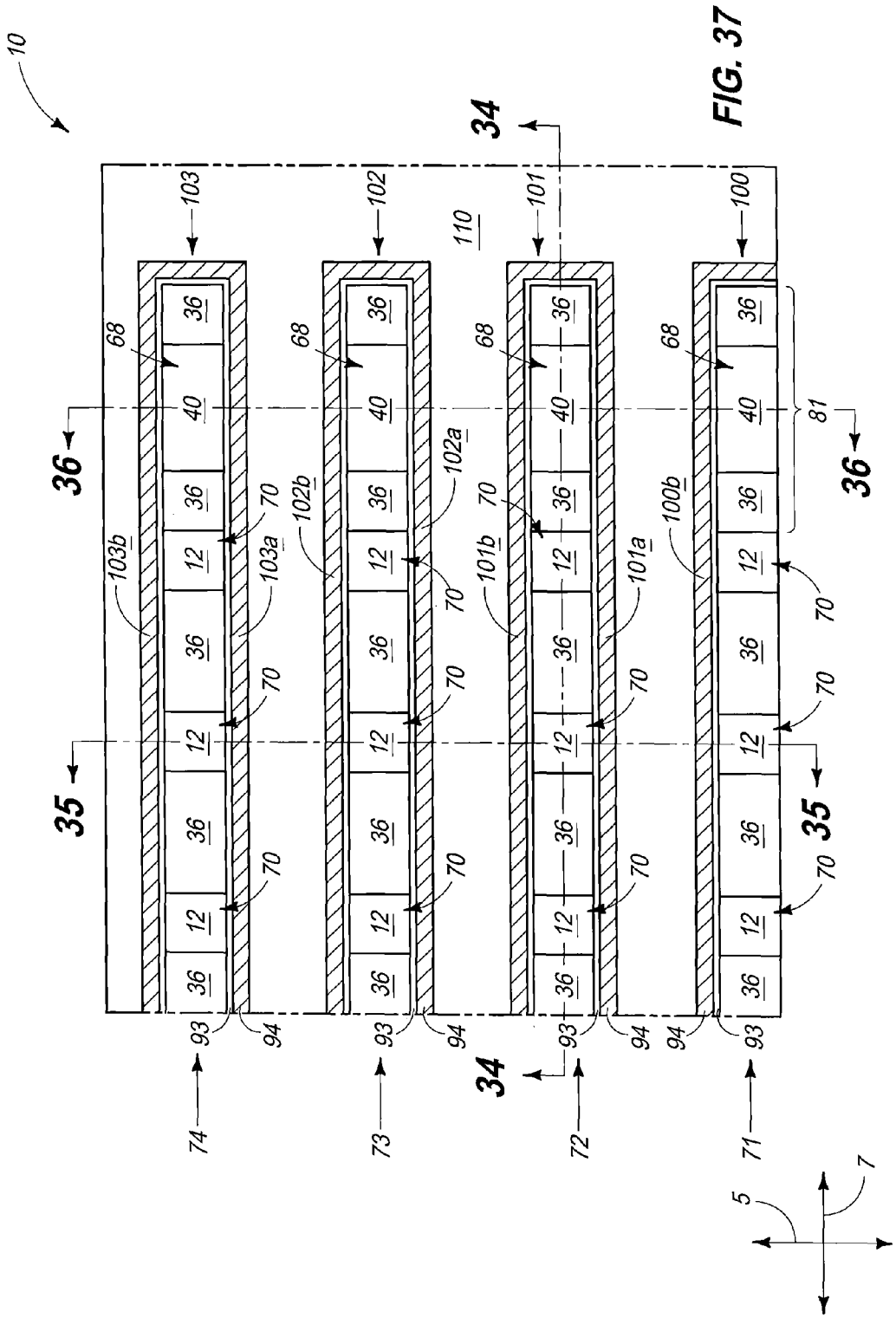

The gate material forms electrically conductive lines 100-103 along the rows 71-74, respectively, as shown in FIG. 37. Each electrically conductive line wraps around the terminal projection 81 of the row, and bifurcates into two branches on opposing sides of a row. The line 101 is shown bifurcating into branches 101a and 101b; the line 102 is shown bifurcating into branches 102a and 102b; and the line 103 is shown bifurcating into branches 103a and 103b. The line 100 also bifurcates into a pair of branches, but only the branch 100b is visible in the portion of construction 10 shown at the processing stage of FIGS. 33-37. In some embodiments, the individual lines may be only along a single side of a row, rather than bifurcating into branches that extend along both sides of the rows.

FIG. 36 shows that the gate material 94 and gate dielectric 93 extend along the sacrificial material 40, and that regions of the gate material 94 are separated from the sacrificial material only by segments of the gate dielectric that are directly between the sacrificial material 40 and the gate material 94.

FIGS. 33-37 show gap-filling dielectric 110 provided within the gaps 55-57 between the slices corresponding to rows 71-74. The gap-filling dielectric 110 may comprise any suitable composition, and in some embodiments may comprise silicon dioxide and/or any of various doped oxides. In some embodiments, the gap-filling dielectric 110 may comprise a same composition as dielectric material 36, and in other embodiments the gap-filling dielectric 110 may be of a different composition than dielectric material 36.

After deposition of the gap-filling dielectric 110, construction 10 is subjected to planarization (for instance, CMP) to form a planarized upper surface 111 extending across materials 110, 36, 40 and 12.

FIGS. 33-37 illustrate a processing stage after pad oxide 44 and nitride 46 (FIGS. 29-32) have been removed to expose upper surfaces of the pillars 65 and the projections 70.

The projections 70 may be incorporated into repeating electrical components of an array. In the shown embodiment, the semiconductor material 12 of the projections 70 is conductively-doped to form a pair of vertically-spaced source/drain regions 90 and 92 within each projection, and to form channel regions 91 between the vertically-spaced source/drain regions. Thus, the projections 70 are doped in an appropriate configuration to be incorporated into substantially vertical transistors. In other embodiments, the projections 70 may be incorporated into other electrical components. For instance, the projections may be doped to be incorporated into substantially vertical npnp or pnpn thyristors. The doping of the projections 70 may occur at any suitable processing stage or stages, and at least some of the doping may be conducted prior to the processing stage of FIGS. 33-37 in some embodiments.

FIG. 33 shows that the projections 70 are formed to a pitch ($P_x$) along the axis 7, and to a pitch ($P_y$) along the axis 5. In the shown embodiment, $P_x$ and $P_y$ are about the same as one another; but in other embodiments they may differ from one another. The projections 70 have dimensions $D_x$ along the axis 7 and $D_y$ along the axis 5. In the shown embodiment, the dimensions $D_x$ and $D_y$ are about one-third of the pitches $P_x$ and $P_y$, respectively. In other embodiments, the dimensions $D_x$ and $D_y$ may comprise other ratios of the pitches $P_x$ and $P_y$. For instance, the dimensions $D_x$ and $D_y$ may comprise about one-half of the pitches $P_x$ and $P_y$ in some embodiments. If the dimensions $D_x$ and $D_y$ are about one-half of the pitches $P_x$ and $P_y$, individual memory cells may have an area of about $4F^2$ along the view of FIG. 33; where F is a minimum features size that may be patterned with the methodologies utilized to form the construction 10 of FIGS. 33-37.

The top and bottom source/drain regions 90 and 92 of the vertical pillars may be connected to other circuitry (not shown). For instance, the top source/drain regions may be electrically connected to charge storage devices (for instance, capacitors) to incorporate the vertical pillars into dynamic random access memory (DRAM) cells. As another example, the top source/drain regions may be electrically coupled to electrodes of phase change random access memory (PCRAM) cells to incorporate the vertical pillars into select devices utilized for reducing leakage from the PCRAM cells.

As another example, the gated vertical pillars may be themselves utilized as memory cells (e.g., capacitor-less DRAM or T-RAM).

Referring to FIGS. 38-41, an expanse of dielectric material 112 is formed over the planarized surface 111. The dielectric material 112 may comprise any suitable composition or combination of compositions, and in some embodiments may comprise silicon dioxide, silicon nitride and/or any of various doped oxides.

Figure 38:
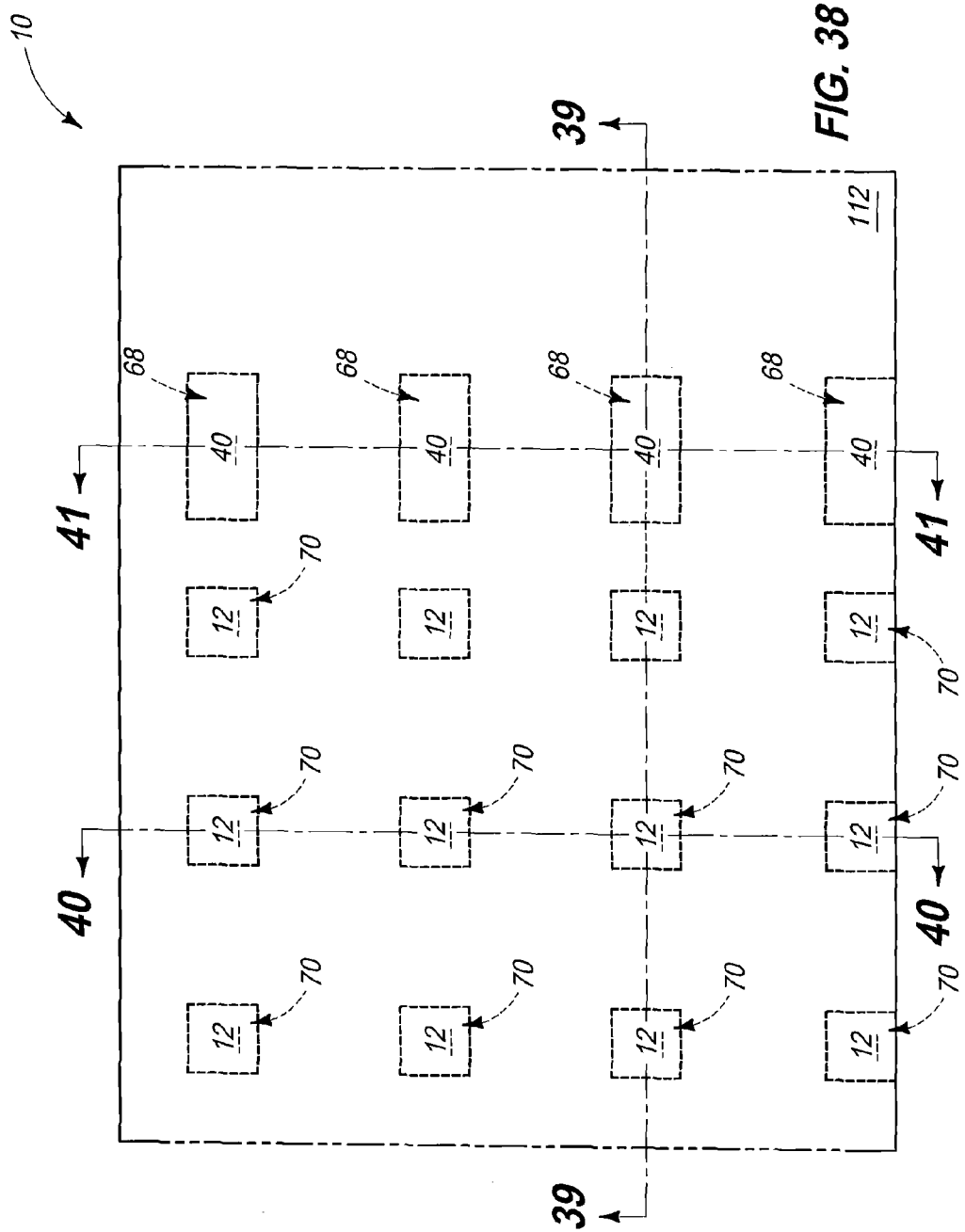
FIGS. 38-41 show the construction of FIGS. 1-4 at a processing stage subsequent to that of FIGS. 33-37.
Figure 39:
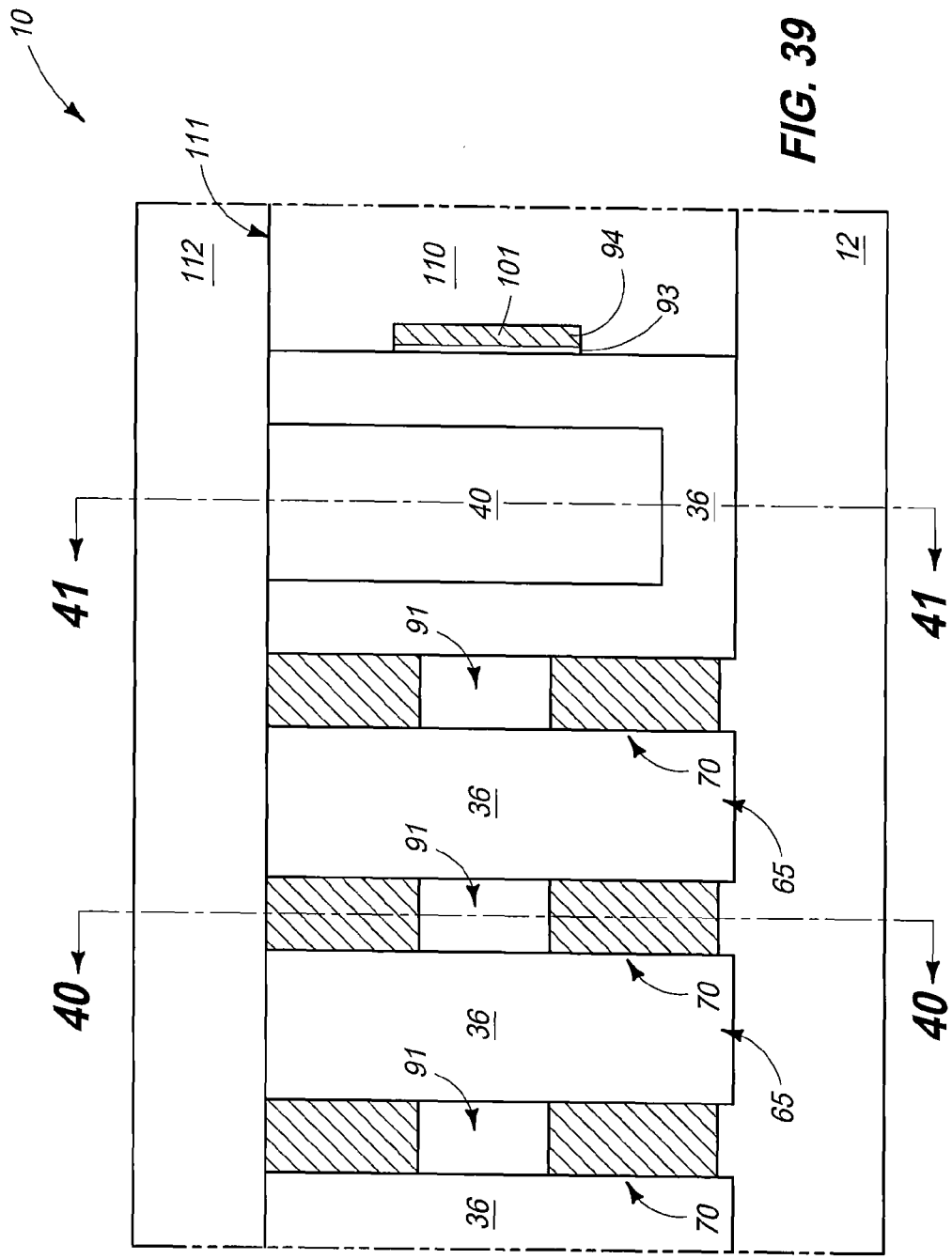
Figure 40:
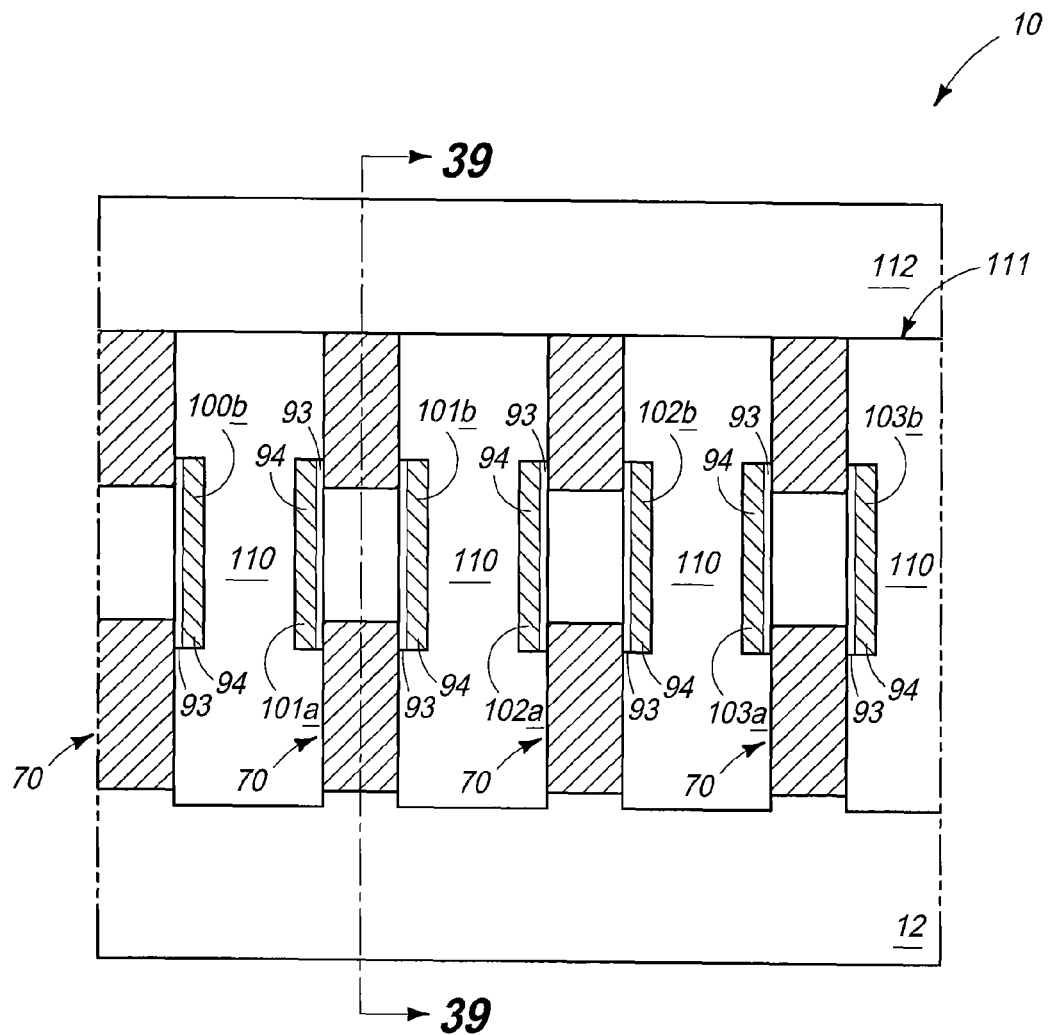
Figure 41:
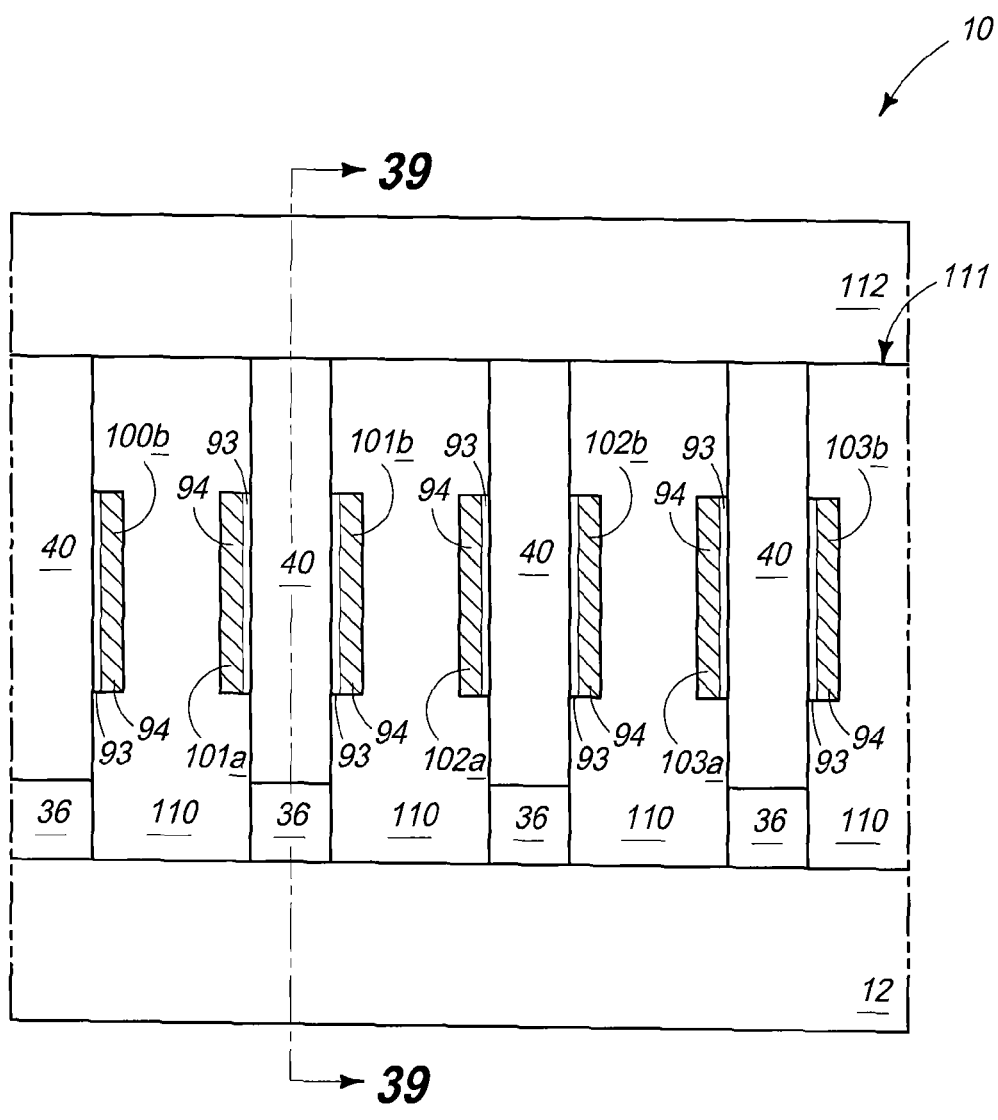
Figure 42:
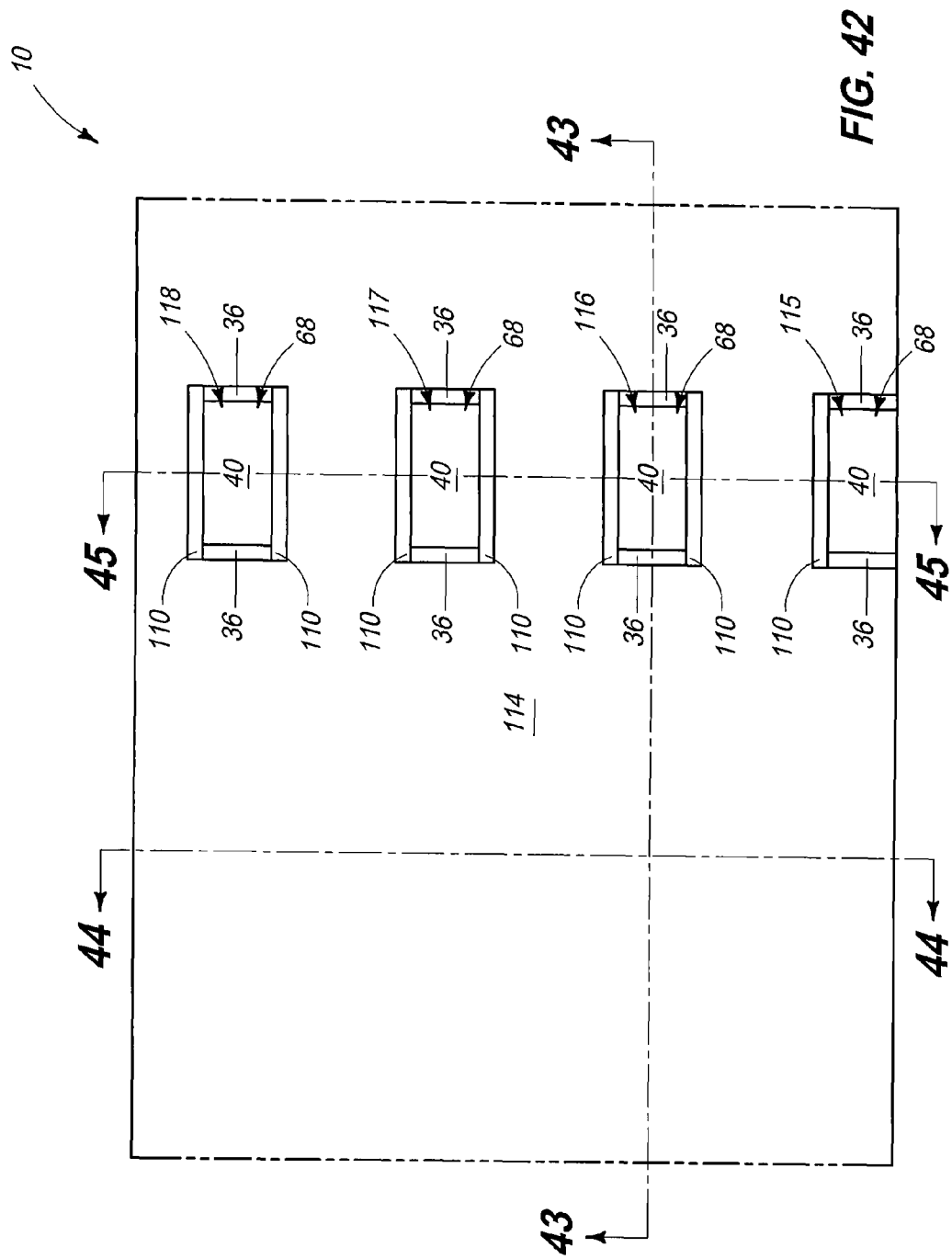
FIGS. 42-45 show the construction of FIGS. 1-4 at a processing stage subsequent to that of FIGS. 38-41.
Figure 43:
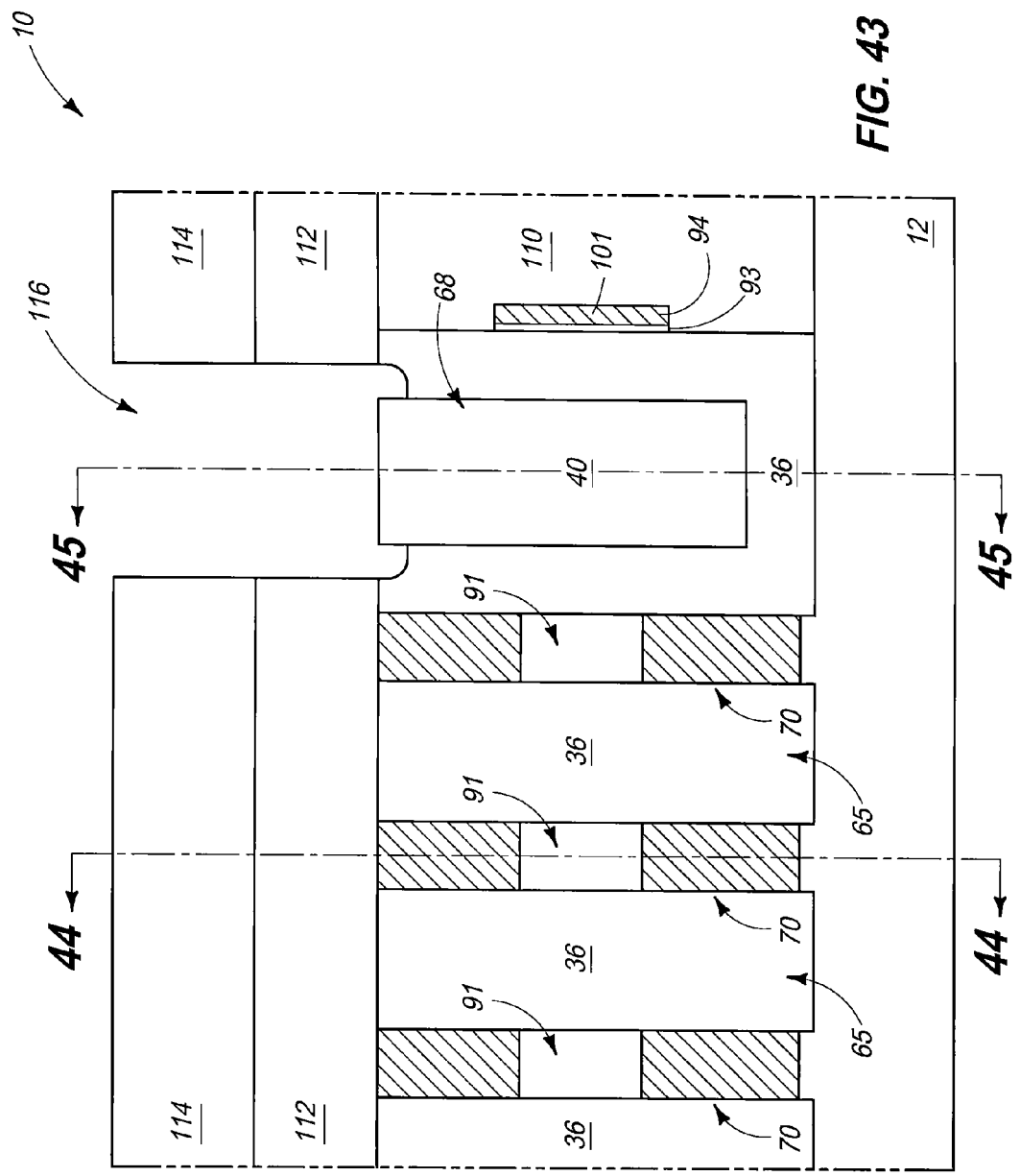
Figure 44:
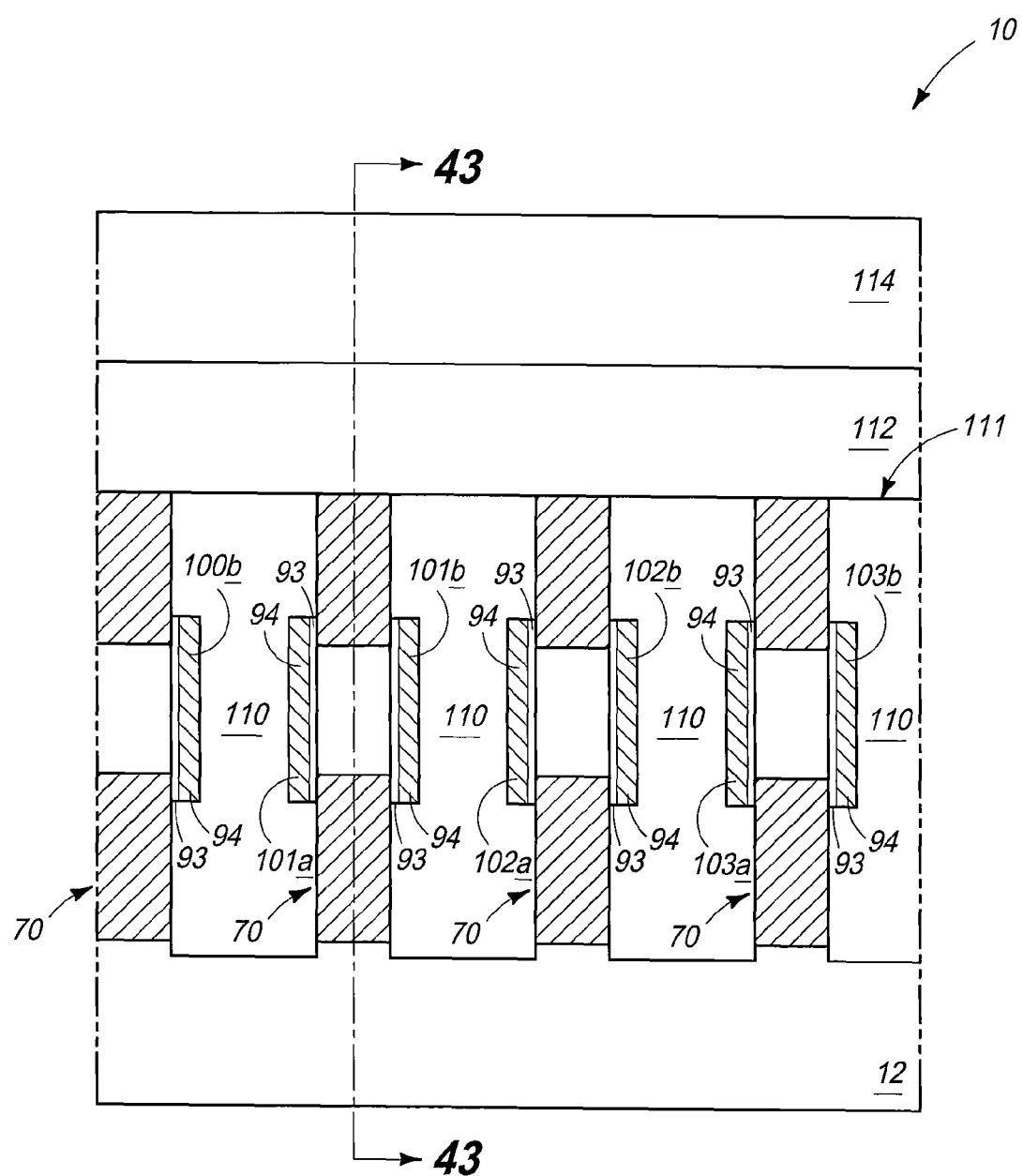

The projections 70 of semiconductor material 12, and the plugs 68 of sacrificial material 40, are shown in dashed-line in the top view of FIG. 38 to indicate that such are beneath dielectric material 112.

Referring next to FIGS. 42-45, a patterned masking material 114 is formed over the dielectric material 112. The patterned masking material may comprise any suitable composition, and in some embodiments may correspond to photolithographically-patterned photoresist.

The patterned masking material has a plurality of openings 115-118 extending therethrough, with the openings being in one-to-one correspondence with the plugs 68 of sacrificial material 40.

In the shown embodiment, the openings 115-118 have lateral peripheries which are outside the lateral peripheries of the plugs 68. Thus, the openings are wider than the plugs in the cross-sectional views of FIGS. 43 and 45.

The openings 115-118 defined by the patterned mask are transferred through material 112 with a suitable etch. In the shown embodiment, the materials 112, 110 and 36 all comprise a common material (for instance, silicon dioxide), and thus the etch also removes some of the materials 110 and 36. The etch is selective relative to sacrificial material 40, and thus recesses the materials 110 and 36 relative to sacrificial material 40. In other embodiments, the material 112 may comprise a different composition from one or both of the materials 36 and 110, and thus the etch of material 112 may be selective relative to one or both of the materials 110 and 36.

Figure 47:
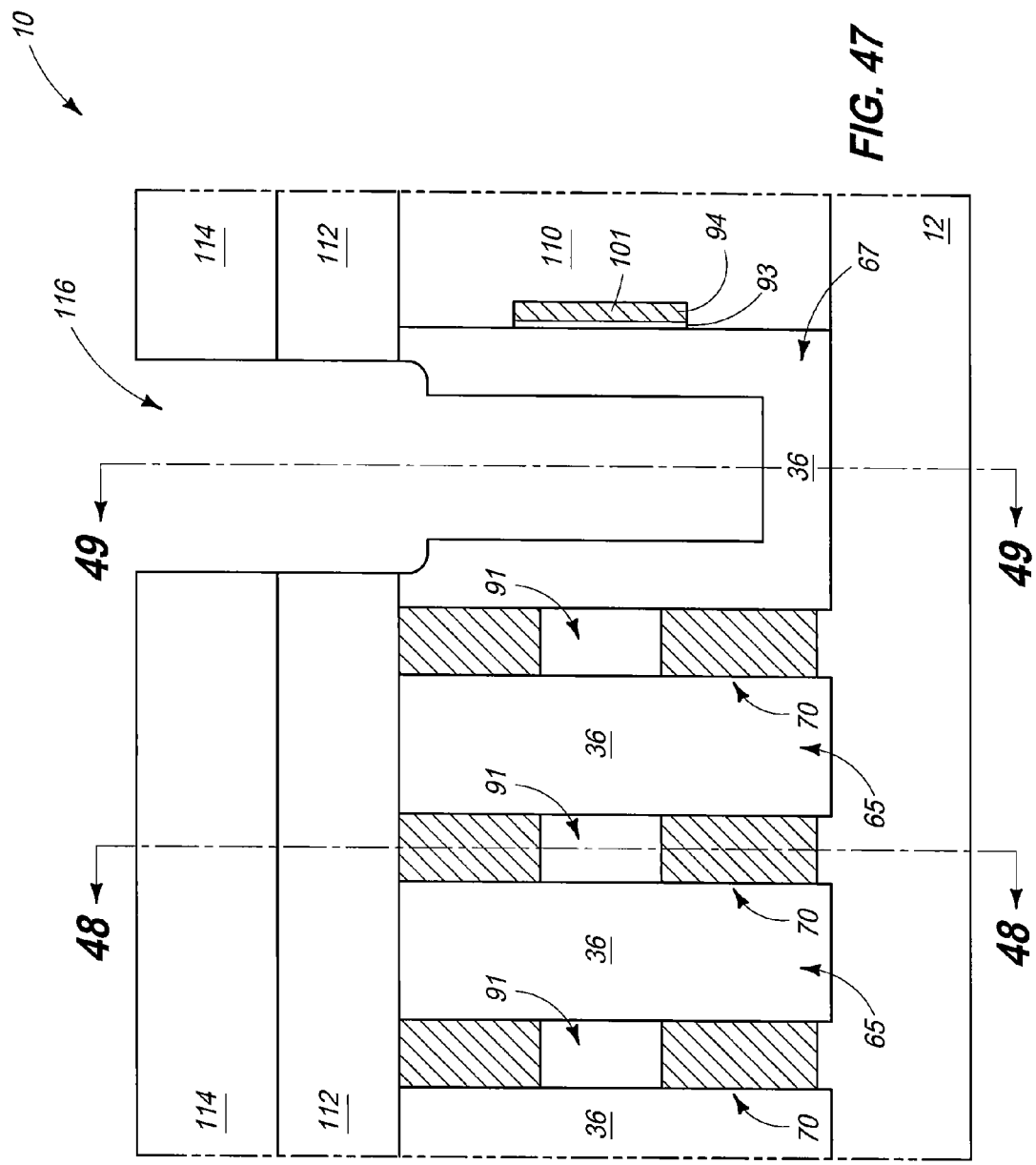
Figure 48:
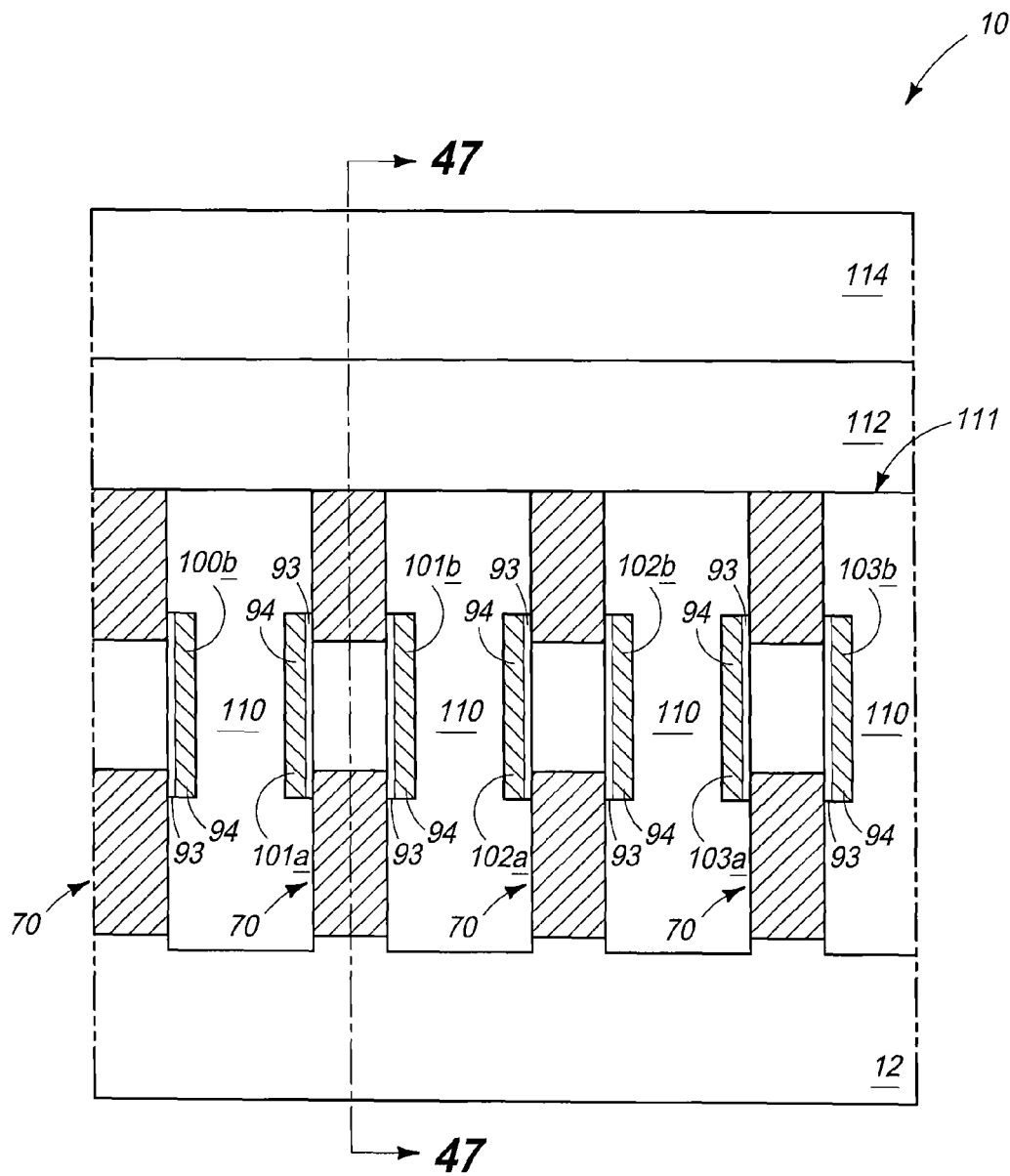

Referring next to FIGS. 46-49, etching selective for sacrificial material 40 (FIGS. 42-45) relative to materials 110, 112 and 36 is utilized to remove the plugs 68 of material 40 from within the upwardly-opening containers 67 (an example container 67 is shown in FIG. 47). In some embodiments, material 40 is removed with a wet etch of silicon.

Figure 45:
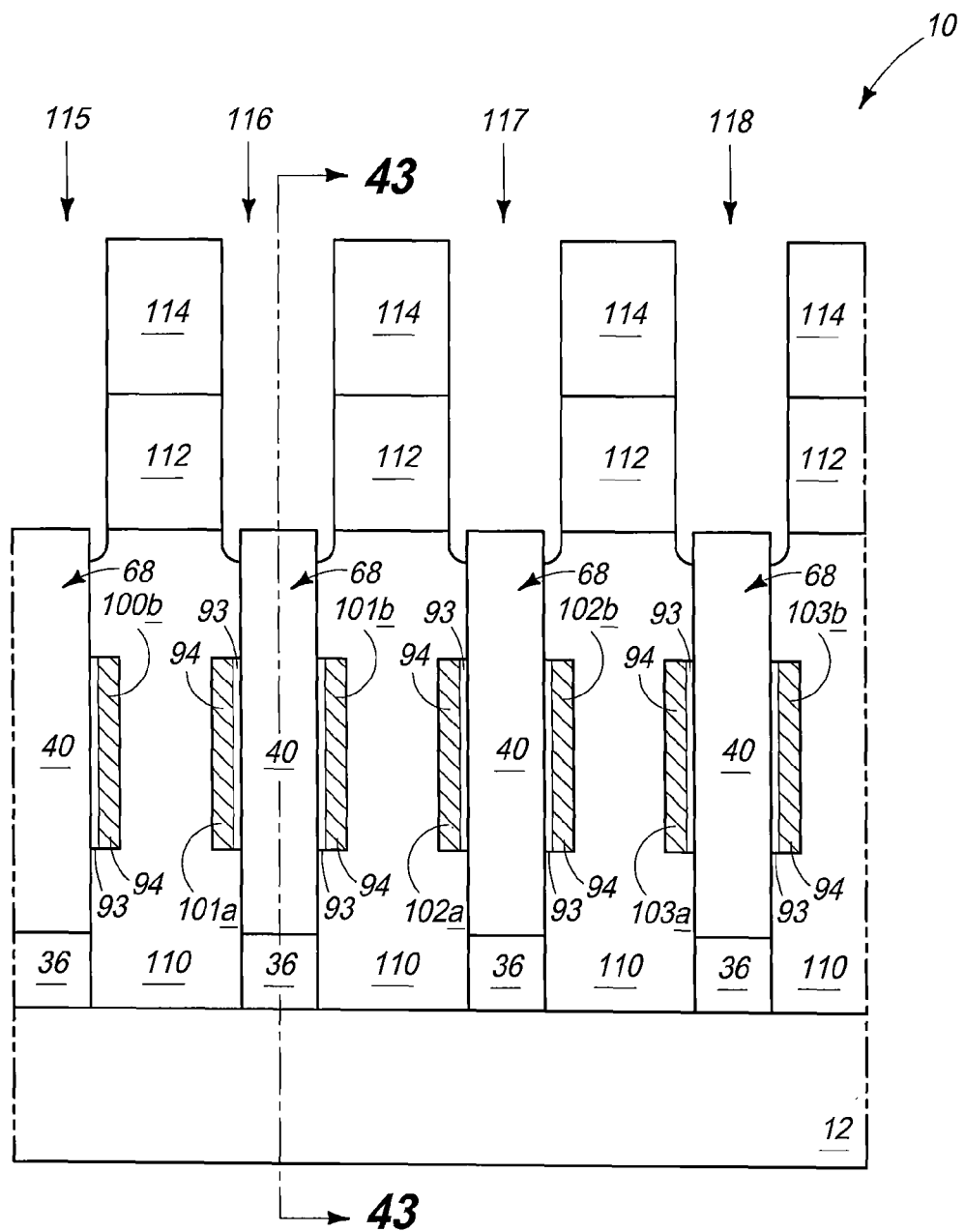
Figure 46:
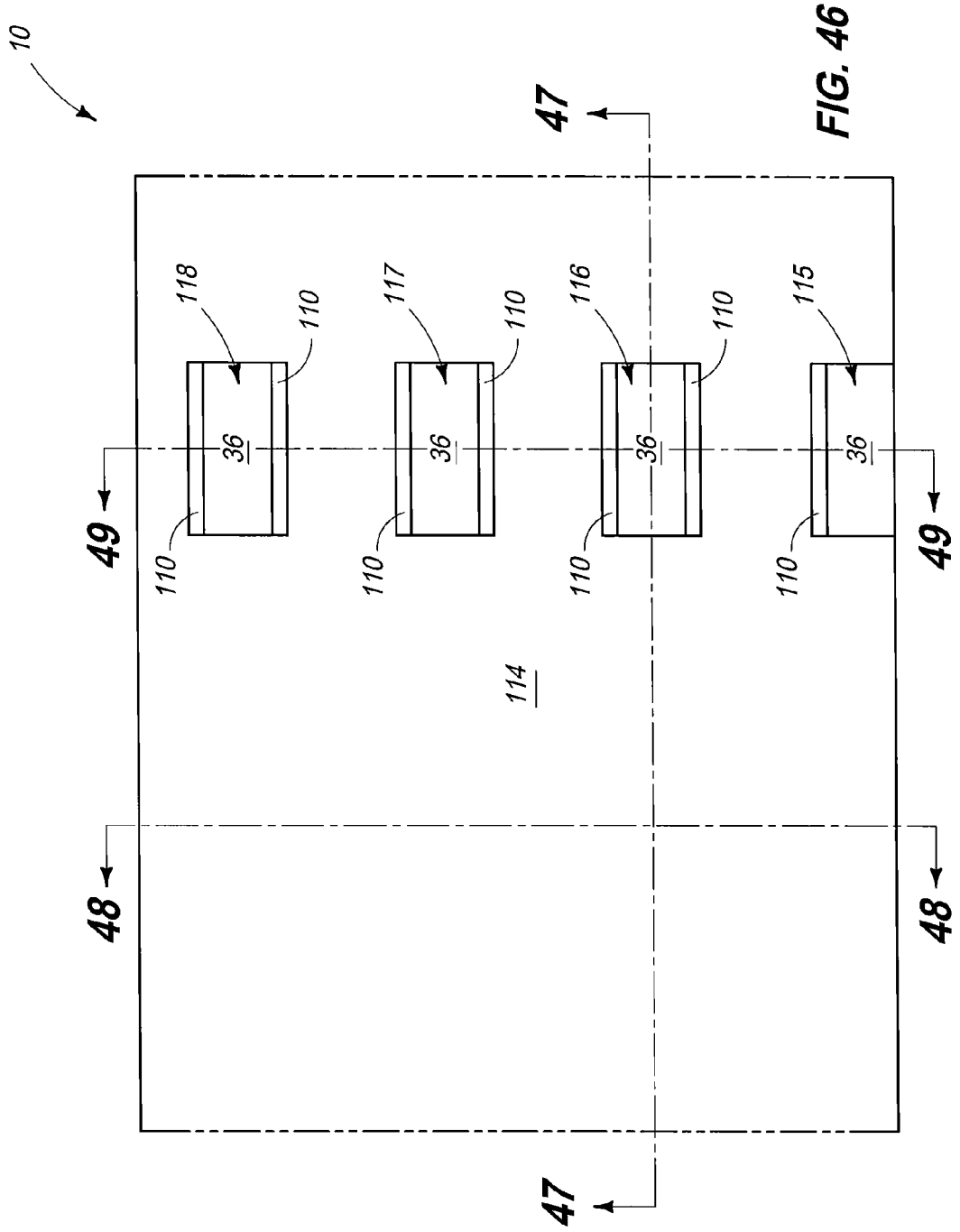
FIGS. 46-49 show the construction of FIGS. 1-4 at a processing stage subsequent to that of FIGS. 42-45.
Figure 49:
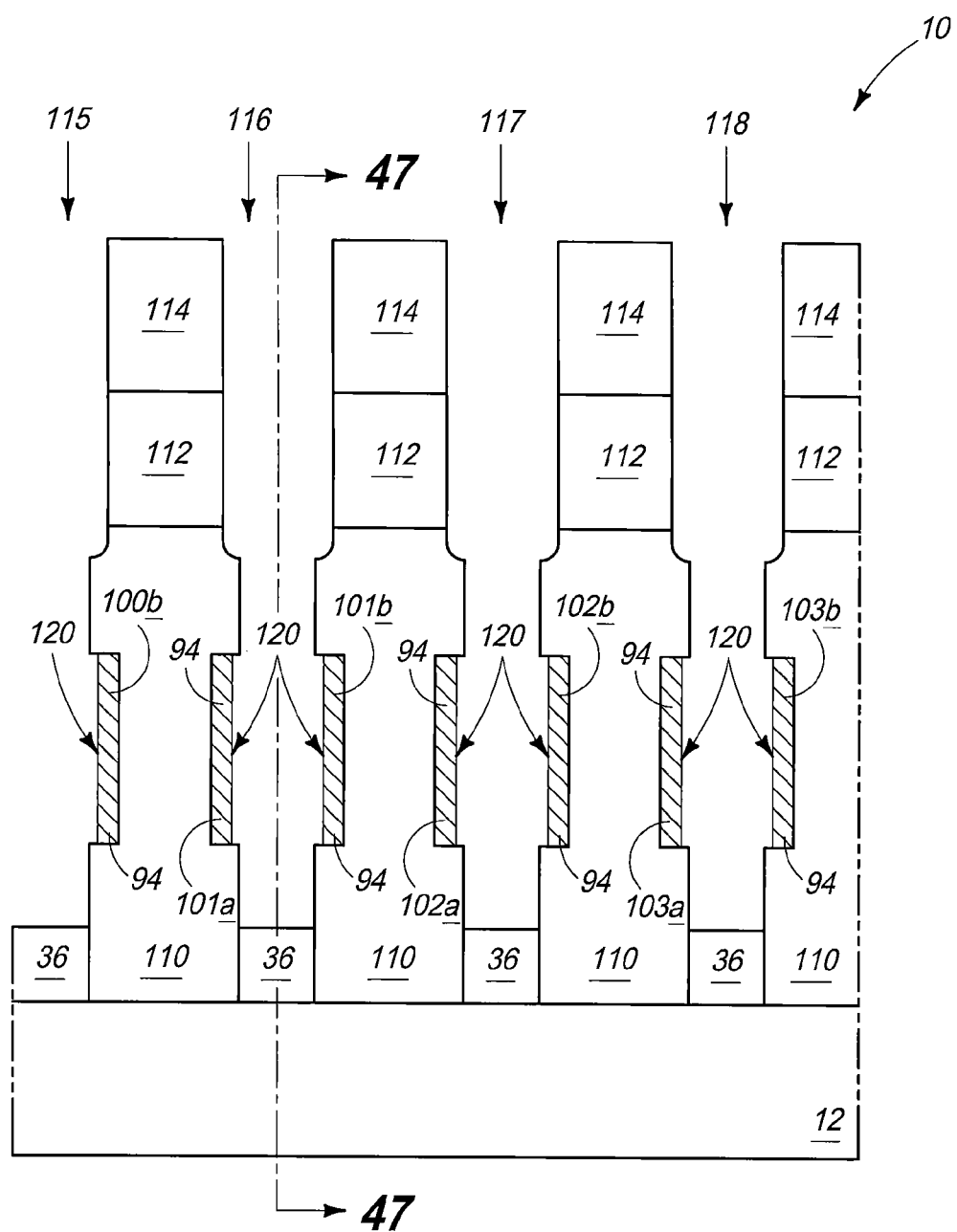
Figure 50:
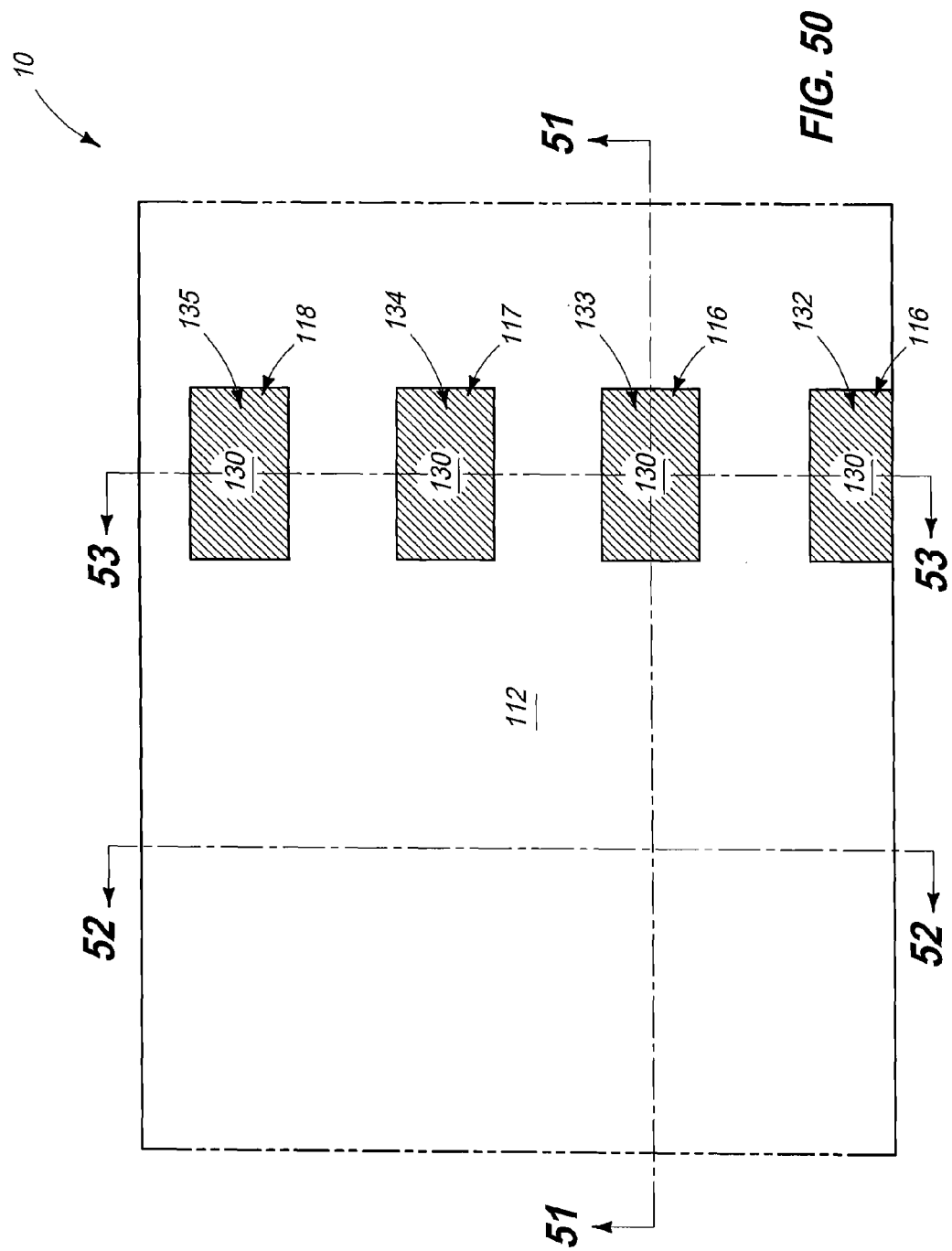
FIGS. 50-53 show the construction of FIGS. 1-4 at a processing stage subsequent to that of FIGS. 46-49.

After the material 40 is removed, further etching is conducted to remove the segments of gate dielectric 93 that had been between material 40 and electrically conductive gate material 94. FIG. 45 shows a cross-section in which the segments of gate dielectric 93 are between the electrically conductive gate material 94 and the sacrificial material 40, and FIG. 49 shows a view along the same cross-section after removal of sacrificial material 40 and the segments of the gate dielectric. Thus, regions 120 of the electrically conductive material 94 are exposed within openings 115-118 at the processing stage of FIG. 49. The regions 120 on opposing sides of the individual openings 115-118 correspond to paired branches of the conductive lines. For instance, the regions 120 on opposing sides of opening 116 along the cross-section of FIG. 49 correspond to the branches 101a and 101b of the electrically conductive line 101.

Although all of the sacrificial material 40 is removed in the shown embodiment, in other embodiments only some of the material 40 may be removed. Specifically, it may be desirable that enough of material 40 may be removed to expose dielectric 93 within openings 115-118 for further etching, which may or may not encompass removal of all of material 40.

In the shown embodiment, each of the openings 115-118 has a wide portion extending through material 112, and a narrower portion within the upwardly-opening dielectric container 67, as shown in FIG. 47 relative to the opening 116.

Referring to FIGS. 50-53, masking material 114 (FIGS. 46-49) is removed, and electrically conductive material 130 is formed within openings 115-118 to make a plurality of electrical contacts 132-135 which extend to the regions 120 (FIG. 53) of the branches of the gatelines 100-103, and thus electrically couple to such gatelines. Notably, the electrical contacts are aligned to the gatelines regardless of whether the patterned masking material 114 of FIGS. 46-49 was aligned directly over the plugs 68 of sacrificial material 40. Thus, the processing of the present invention may compensate for some misalignment of the pattern of masking material 114.

The electrically conductive material 130 may comprise any suitable composition or combination of compositions, and in some embodiments may comprise one or more of various metals (for instance, tungsten, titanium, copper, etc.), metal-containing materials (for instance, metal nitride, metal carbide, metal silicide, etc.) and conductively-doped semiconductor materials (for instance, conductively-doped silicon, conductively-doped germanium, etc.).

In some embodiments, the electrically conductive material 130 may be provided to overfill the openings and extend across an upper surface of material 112 (or even across the upper surface of the masking material 114 of FIGS. 46-49), and then planarization (for instance, CMP) may be utilized to remove excess material 130 and form the construction of FIGS. 50-53.

Although the electrically conductive interconnects 133-135 of FIGS. 50-53 are formed proximate terminal ends of the rows 71-73 (with such rows being shown, for example, in FIG. 33), in other embodiments such interconnects may be more centrally located within the rows (i.e., may be internally located within the rows as opposed to being proximate terminal ends of the rows). Also, although only one interconnect is shown within each row, in other embodiments there may be multiple interconnects per row. For instance, there may be two electrically conductive interconnects per row, with the electrically conductive interconnects being formed proximate each of the terminal ends of an individual row.

The memory arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Example embodiments may include methods of forming contacts. A row of projections may be formed over a semiconductor substrate. The projections may include a plurality of repeating components of an array, and may include a contact location projection comprising a sacrificial material spaced from semiconductor material of the substrate by a dielectric material. The dielectric material may comprise a different composition than the sacrificial material. An electrically conductive line may be formed along said row, with the line having a region spaced from the sacrificial material by a segment of gate dielectric. The sacrificial material and the segment of gate dielectric may be removed to form a contact opening. An electrically conductive contact may be formed within the contact opening and directly against the region. In some embodiments, the contact location projection may be proximate a terminal end of the row of projections. In some embodiments, the contact location projection may be internally located within the row of projections. In some embodiments, the row of projections has opposing terminal ends, the contact location projection is proximate one of the terminal ends, and another contact location projection is proximate the other of the terminal ends.

Example embodiments may include methods of forming contacts. A row of projections may be formed over a semiconductor substrate; with the projections including a plurality of repeating components of an array, and including a terminal projection at an end region of the row. The terminal projection may include a sacrificial material spaced from semiconductor material of the substrate by a dielectric structure. The dielectric structure may have a different composition than the sacrificial material. An electrically conductive line may be formed along the row, with the line wrapping around an end of the terminal projection and bifurcating into two branches that are along opposing sides of the repeating components. The branches may have regions spaced from the sacrificial material by segments of the gate dielectric. The sacrificial material and the segments of the gate dielectric may be removed to form a contact opening. An electrically conductive contact may be formed within the contact opening and directly against the regions of the branches.

Other example embodiments may include other methods of forming contacts. A row of projections is formed over a semiconductor substrate; with the projections including a plurality of repeating components of an array, and including a terminal projection at an end region of the row. The terminal projection may comprise a silicon-containing material spaced from semiconductor material of the substrate by a dielectric structure. The dielectric structure may comprise a different composition than the silicon-containing material. An electrically conductive line may be formed along the row, with the line wrapping around an end of the terminal projection and bifurcating into two branches that are along opposing sides of the repeating components. A patterned mask may be formed over the row, with the patterned mask having an opening extending therethrough to expose the silicon-containing material. At least some of the silicon-containing material may be removed to extend the opening. Electrically conductive material may be formed within the extended opening to form an electrically conductive contact that electrically couples with the electrically conductive line.

Other example embodiments may include yet other methods of forming contacts. A plurality of spaced-apart fins of semiconductor material may be formed to extending upwardly form a semiconductor substrate; with individual fins extending primarily along a first direction, and being arranged in a first stack of alternating spaces and fins. The spaces and fins of the first stack may be stacked along a second direction which is substantially orthogonal to the first direction. A terminal space between a terminal fin of the first stack and a penultimate fin of the first stack may be larger than the other spaces of the first stack. Dielectric material may be formed within the spaces, with the dielectric material filling the other spaces and forming a liner within the terminal space. The lined terminal space may define an upwardly-opening dielectric-lined trench. The upwardly-opening dielectric-lined trench may be filled with sacrificial material. The fins may be patterned into spaced-apart slices, with the slices being elongated along the second direction and being arranged in a second stack of alternating gaps and slices. The gaps and slices of the second stack may be stacked along the first direction. The individual slices may comprise repeating structures spaced from one another by substantially vertical dielectric pillars. The patterning of the fins into the slices may pattern the trench into a plurality of upwardly-opening dielectric-lined containers; with the containers being filled with sacrificial material plugs. Gate dielectric may be formed along opposing sides of the individual slices. Electrically conductive lines may be formed along the slices and spaced from the slices by the gate dielectric, with individual lines wrapping around the dielectric-lined containers and bifurcating into two branches that are along opposing sides of the individual slices. A patterned mask may be formed over the slices, with the patterned mask having openings extending therethrough to expose the sacrificial material plugs. The sacrificial material plugs may be removed, together with segments of gate dielectric exposed within the openings, to form contact openings extending to regions of the electrically conductive lines. Electrically conductive material may be formed within the contact openings and in direct contact with the regions of electrically conductive lines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a contact, comprising:
    forming a row of projections over a semiconductor substrate; the projections including a plurality of repeating components of an array, and including a contact location projection comprising a sacrificial material spaced from semiconductor material of the semiconductor substrate by a dielectric material; the dielectric material comprising a different composition than the sacrificial material;
    forming an electrically conductive line along said row, the electrically conductive line having a region spaced from the sacrificial material by a segment of gate dielectric;
    removing the sacrificial material and the segment of gate dielectric to form a contact opening; and
    forming an electrically conductive contact within the contact opening and directly against the region.

2. The method of claim 1 wherein the contact location projection is proximate a terminal end of the row of projections.

3. The method of claim 1 wherein the contact location projection is internally located within the row of projections.

4. The method of claim 1 wherein the row of projections has opposing terminal ends, and wherein the contact location projection is proximate one of the terminal ends, and wherein another contact location projection is proximate the other of the terminal ends.

5. A method of forming a contact, comprising:
   forming a row of projections over a semiconductor substrate; the projections including a plurality of repeating components of an array, and including a terminal projection at an end region of the row; the terminal projection comprising a sacrificial material spaced from semiconductor material of the semiconductor substrate by a dielectric structure; the dielectric structure comprising a different composition than the sacrificial material;
   forming an electrically conductive line along said row, the electrically conductive line wrapping around an end of the terminal projection and bifurcating into two branches that are along opposing sides of the repeating components; the branches having regions spaced from the sacrificial material by segments of gate dielectric;
   removing the sacrificial material and the segments of gate dielectric to form a contact opening; and
   forming an electrically conductive contact within the contact opening and directly against the regions of the branches.

6. The method of claim 5 wherein the dielectric structure comprises an oxide.

7. The method of claim 5 wherein the sacrificial material comprises semiconductor material.

8. The method of claim 5 wherein the sacrificial material comprises silicon.

9. The method of claim 5 wherein the sacrificial material comprises one or both of amorphous silicon and polycrystalline silicon.

10. The method of claim 5 further comprising incorporating the repeating components into substantially vertical transistors.

11. The method of claim 5 further comprising incorporating the repeating components into substantially vertical thyristors.

12. A method of forming a contact, comprising:
    forming a row of projections over a semiconductor substrate; the projections including a plurality of repeating components of an array, and including a terminal projection at an end region of the row; the terminal projection comprising a silicon-containing material spaced from semiconductor material of the semiconductor substrate by a dielectric structure; the dielectric structure comprising a different composition than the silicon-containing material;
    forming an electrically conductive line along said row, the electrically conductive line wrapping around an end of the terminal projection and bifurcating into two branches that are along opposing sides of the repeating components;
    forming a patterned mask over the row, the patterned mask having an opening extending therethrough to expose the silicon-containing material;
    removing at least some of the silicon-containing material to extend the opening; and
    forming electrically conductive material within the extended opening to form an electrically conductive contact that electrically couples with the electrically conductive line.

13. The method of claim 12 wherein the branches of the electrically conductive line are along opposing sides of the terminal projection, and are spaced from the terminal projection by gate dielectric which is directly against the silicon-containing material; and wherein the extending of the opening comprises removing at least some of the gate dielectric that had been directly against the silicon-containing material.

14. The method of claim 12 wherein the dielectric structure comprises silicon dioxide.

15. The method of claim 12 wherein all of the silicon-containing material is removed to extend said opening.

16. The method of claim 12 wherein the silicon-containing material comprises one or both of amorphous silicon and polycrystalline silicon.

17. The method of claim 12 further comprising incorporating the repeating components into substantially vertical transistors.

18. The method of claim 12 further comprising incorporating the repeating components into substantially vertical thyristors.

19. A method of forming a plurality of contacts, comprising:
    forming a plurality of spaced-apart fins of semiconductor material extending upwardly form a semiconductor substrate; individual fins extending primarily along a first direction, and being arranged in a first stack of alternating spaces and fins, the spaces and fins of the first stack being stacked along a second direction which is substantially orthogonal to the first direction; a terminal space between a terminal fin of the first stack and a penultimate fin of the first stack being larger than the other spaces of the first stack;
    forming dielectric material within the spaces, the dielectric material filling said other spaces and forming a liner within the terminal space, the lined terminal space defining an upwardly-opening dielectric-lined trench;
    filling the upwardly-opening dielectric-lined trench with sacrificial material;
    patterning the fins into spaced-apart slices, the slices being elongated along the second direction and being arranged in a second stack of alternating gaps and slices; the gaps and slices of the second stack being stacked along the first direction; the individual slices comprising repeating structures spaced from one another by substantially vertical dielectric pillars; the patterning of the fins into the slices patterning the trench into a plurality of upwardly-opening dielectric-lined containers; said containers being filled with sacrificial material plugs;
    forming gate dielectric along opposing sides of the individual slices;
    forming electrically conductive lines along the slices and spaced from the slices by the gate dielectric, individual lines wrapping around the dielectric-lined containers and bifurcating into two branches that are along opposing sides of the individual slices;
    forming a patterned mask over the slices, the patterned mask having openings extending therethrough to expose the sacrificial material plugs;
    removing the sacrificial material plugs and segments of gate dielectric exposed within the openings to form contact openings extending to regions of the electrically conductive lines; and forming electrically conductive material within the contact openings and in direct contact with the regions of electrically conductive lines.

20. The method of claim 19 wherein the sacrificial material comprises one or both of amorphous silicon and polycrystalline silicon.

21. The method of claim 19 further comprising incorporating the repeating structures into substantially vertical transistors.

22. The method of claim 19 further comprising incorporating the repeating structures into substantially vertical thyristors.

23. The method of claim 19 wherein the dielectric material within said other spaces forms dielectric plates between the fins; wherein the fins are capped with silicon nitride lines; wherein the forming of the dielectric material within the spaces also forms the dielectric material over the lines; and further comprising:
  recessing the sacrificial material within the trench to a level beneath a level of the silicon nitride lines;
  forming a capping dielectric over the recessed sacrificial material; and
  forming a planarized surface that includes surfaces of the dielectric plates, the silicon nitride lines, and the capping dielectric.

24. The method of claim 23 further comprising removing the silicon nitride lines, removing the capping dielectric, and reducing heights of the dielectric plates and the fins to form a second planarized surface that includes surfaces of the sacrificial material, dielectric plates and fins.

25. The method of claim 24 further comprising:
forming a silicon nitride expanse over the second planarized surface; and
patterning the expanse during the patterning of the fins into the slices to form the expanse into second silicon nitride lines over the slices.

26. The method of claim 25 wherein:
the gate dielectric and electrically conductive lines are formed along the opposing sides of the slices while the second silicon nitride lines are over the slices;
gap-filling dielectric is formed in the gaps between the slices;
the second silicon nitride lines are removed from over the slices; and
the patterned mask includes a patterned dielectric expanse provided over the slices and the gap-filling dielectric; individual contact openings including an upper region extending through the patterned dielectric expanse, and a lower region extending into a slice.

27. The method of claim 26 wherein the electrically conductive material overfills the contact openings, further comprising utilizing chemical-mechanical polishing to remove the electrically conductive material from over an upper surface of the patterned dielectric expanse.

28. The method of claim 26 wherein the upper regions of the contact openings are wider than the lower regions of the contact openings.

* * * * *